(12) United States Patent
Tsuchida

(10) Patent No.: US 10,630,254 B2
(45) Date of Patent: Apr. 21, 2020

(54) INFORMATION PROCESSING DEVICE AND INFORMATION PROCESSING METHOD

(71) Applicant: SONY CORPORATION, Tokyo (JP)

(72) Inventor: Yuji Tsuchida, Kanagawa (JP)

(73) Assignee: SONY CORPORATION, Tokyo (JP)

(*) Notice: Subject to any disclaimer, the term of this patent is extended or adjusted under 35 U.S.C. 154(b) by 0 days.

(21) Appl. No.: 16/328,876

(22) PCT Filed: Sep. 22, 2017

(86) PCT No.: PCT/JP2017/034239
§ 371 (c)(1),
(2) Date: Feb. 27, 2019

(87) PCT Pub. No.: WO2018/066383
PCT Pub. Date: Apr. 12, 2018

(65) Prior Publication Data
US 2019/0222188 A1    Jul. 18, 2019

(30) Foreign Application Priority Data

Oct. 7, 2016 (JP) ................................. 2016-198749

(51) Int. Cl.
*H03G 5/16* (2006.01)
*H03G 9/00* (2006.01)
(Continued)

(52) U.S. Cl.
CPC ............. *H03G 5/165* (2013.01); *G06F 16/68* (2019.01); *H03G 3/002* (2013.01); *H03G 9/005* (2013.01);
(Continued)

(58) Field of Classification Search
CPC ........ H03G 5/165; H03G 3/002; H03G 9/005; H03G 9/18; G06F 16/68; G10L 21/034; H04R 3/04
See application file for complete search history.

(56) References Cited

U.S. PATENT DOCUMENTS 8,019,094 B2 * 9/2011 Hsieh ................... H03G 3/3089
                                                              381/107
9,509,267 B2 * 11/2016 Patwardhan ............. H03G 5/16
(Continued)

FOREIGN PATENT DOCUMENTS

AR         096574 A1    1/2016
CA        2898567 A1    7/2014
(Continued)

OTHER PUBLICATIONS

International Search Report and Written Opinion of PCT Application No. PCT/JP2017/034239, dated Dec. 19, 2017, 09 pages of ISRWO.

*Primary Examiner* — Andrew L Sniezek
(74) *Attorney, Agent, or Firm* — Chip Law Group

(57) ABSTRACT

Provided are an information processing device and an information processing method which are capable of obtaining sound volume correction effects more suitable for an auditory sensation. Target data which is a statistical value of metadata of each audio signal of an audio signal group is acquired, metadata of an audio signal to be reproduced is acquired, and either or both of a correction value of a sound volume of the audio signal to be reproduced and a correction value of a sound quality of the audio signal to be reproduced is calculated using the acquired target data and the acquired metadata.

18 Claims, 42 Drawing Sheets

(51) Int. Cl.
*G06F 16/68* (2019.01)
*H03G 9/18* (2006.01)
*H03G 3/00* (2006.01)
*H04R 3/04* (2006.01)
*G10L 21/0324* (2013.01)

(52) U.S. Cl.
CPC ............... *H03G 9/18* (2013.01); *H04R 3/04* (2013.01); *G10L 21/0324* (2013.01)

(56) References Cited

U.S. PATENT DOCUMENTS

| | | | |
|---|---|---|---|
| 2006/0106472 A1 | 5/2006 | Romesburg et al. | |
| 2013/0016856 A1* | 1/2013 | Koike | G10L 21/038 381/98 |
| 2015/0332685 A1 | 11/2015 | Bleidt | |
| 2016/0049162 A1 | 2/2016 | Choi et al. | |
| 2016/0049914 A1 | 2/2016 | Choi et al. | |
| 2016/0065160 A1 | 3/2016 | Choi et al. | |
| 2016/0078879 A1 | 3/2016 | Lu et al. | |

FOREIGN PATENT DOCUMENTS

| | | |
|---|---|---|
| CN | 101099209 A | 1/2008 |
| CN | 104078050 A | 10/2014 |
| CN | 105074822 A | 11/2015 |
| CN | 105190750 A | 12/2015 |
| EP | 1815473 A1 | 8/2007 |
| EP | 2948947 A1 | 12/2015 |
| EP | 2979267 A2 | 2/2016 |
| ES | 2628153 T3 | 8/2017 |
| HK | 1212808 A1 | 6/2016 |
| JP | 2002-109824 A | 4/2002 |
| JP | 2008-521028 A | 6/2008 |
| JP | 4981123 B2 | 7/2012 |
| JP | 5101292 B2 | 12/2012 |
| JP | 2015-206928 A | 11/2015 |
| JP | 2016-509693 A | 3/2016 |
| JP | 2016-514856 A | 5/2016 |
| JP | 2016-519784 A | 7/2016 |
| JP | 2016-520854 A | 7/2016 |
| JP | 2016-522597 A | 7/2016 |
| KR | 10-2014-0119209 A | 10/2014 |
| KR | 10-2014-0120573 A | 10/2014 |
| KR | 10-2015-0109418 A | 10/2015 |
| MX | 2015009534 A | 10/2015 |
| RU | 2015136531 A | 3/2017 |
| TW | 201438003 A | 10/2014 |
| WO | 2006/055058 A1 | 5/2006 |
| WO | 2014/114781 A1 | 7/2014 |
| WO | 2014/148844 A1 | 9/2014 |
| WO | 2014/148845 A1 | 9/2014 |
| WO | 2014/148848 A2 | 9/2014 |
| WO | 2014/160678 A2 | 10/2014 |

* cited by examiner

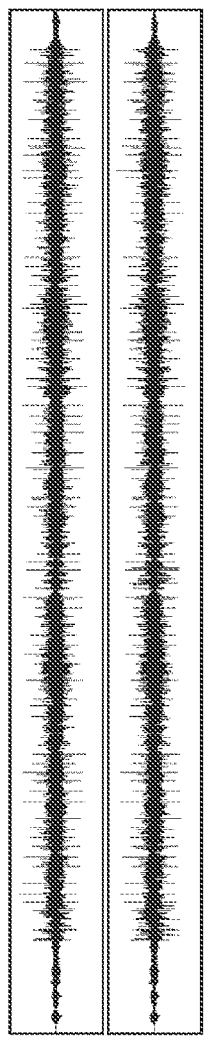
FIG. 11A
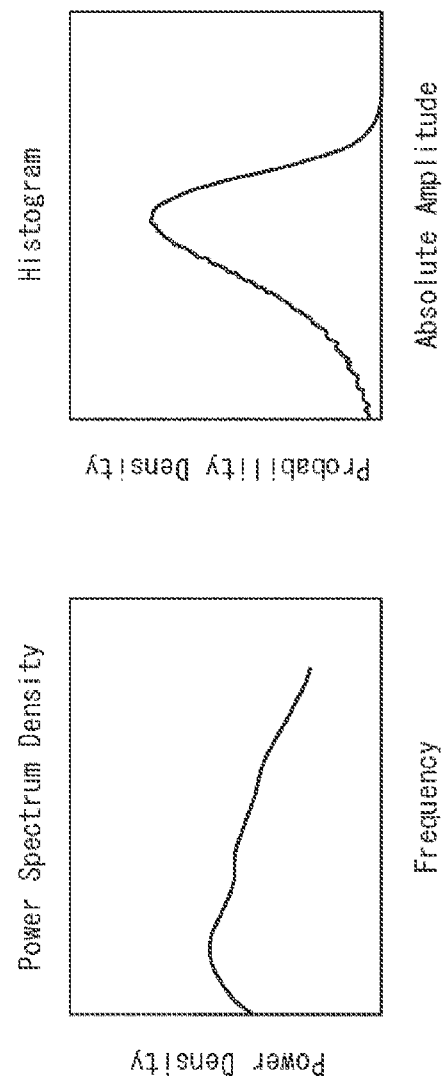
FIG. 11C
FIG. 11B

INFORMATION PROCESSING DEVICE AND INFORMATION PROCESSING METHOD

CROSS REFERENCE TO RELATED APPLICATIONS

This application is a U.S. National Phase of International Patent Application No. PCT/JP2017/034239 filed on Sep. 22, 2017, which claims priority benefit of Japanese Patent Application No. JP 2016-198749 filed in the Japan Patent Office on Oct. 7, 2016. Each of the above-referenced applications is hereby incorporated herein by reference in its entirety.

TECHNICAL FIELD

The present technology relates to an information processing device, an information processing method, and a program, and more particularly, to an information processing device, an information processing method, and a program which are capable of obtaining sound volume correction effects more suitable for an auditory sensation.

BACKGROUND ART

In the past, techniques of leveling sound volumes (loudness) between different audio sources (musical pieces in the case of music) and improving comfort and convenience of a listener (for example, eliminating the inconvenience or the like of adjusting a volume for each musical piece) have been developed and put to practical use (for example, see Patent Literatures 1 to 3).

For example, in a known related art, an effective value of an entire musical piece is used to calculate a sound volume correction value. Further, in this case, a prefilter is used to improve a correlation between an auditory sensation and an effective value. As a characteristic of the prefilter, for example, a K characteristic or the like is often used.

CITATION LIST

Patent Literature

Patent Literature 1: JP 4981123B
Patent Literature 2: JP 5101292B
Patent Literature 3: JP 2016-509693T

DISCLOSURE OF INVENTION

Technical Problem

However, in the related art, it can be difficult to cause a sound volume correction effect to match an auditory sensation of a user. For example, in a case in which the K characteristic is used as the characteristic of the prefilter, the K characteristic is realized by a cascade connection of two biquad filters in view of easy implementation of a filter, and an aural characteristic is not necessarily strictly reflected. For this reason, it can be difficult to perform sound volume correction that accurately reflects the auditory sensation of a user.

Further, even if a prefilter with an uncompromising characteristic is used to strictly reproduce the aural characteristic, in a case in which a frequency characteristic of a reproducing device is not flat, since it does not become a true effective value finally sensed by a listener in principle unless the effective value is calculated taking the characteristic into consideration, it can be difficult to obtain a sound volume correction effect matching the auditory sensation of a user.

The present technology was proposed in light of the foregoing, and it is an object of the present technology to obtain a sound volume correction effect more suitable for an auditory sensation.

Solution to Problem

An information processing device of an aspect of the present technology is an information processing device, including: a target data acquiring unit configured to acquire target data which is a statistical value of metadata of each audio signal of an audio signal group; a metadata acquiring unit configured to acquire metadata of an audio signal to be reproduced; and a correction value calculating unit configured to calculate either or both of a correction value of a sound volume of the audio signal to be reproduced and a correction value of a sound quality of the audio signal to be reproduced using the target data acquired by the target data acquiring unit and the metadata acquired by the metadata acquiring unit.

The metadata can include a power spectrum density of the audio signal and an absolute value histogram of a sample value of the audio signal.

The target data can include an average value and a standard deviation value of the power spectrum density and an average value and a standard deviation value of the absolute value histogram.

The correction value calculating unit can calculate the correction value of the sound volume using the absolute value histogram of the sample value of the audio signal to be reproduced and an average value of the absolute value histograms of the sample values of the audio signal group.

The correction value calculating unit can calculate the correction value of the sound volume using a reference peak level and a mode value of the absolute value histogram of the sample value of the audio signal to be reproduced and a reference peak level and a mode value of the average value of the absolute value histograms of the sample values of the audio signal group.

The correction value calculating unit can normalize the power spectrum density of the audio signal to be reproduced using the absolute value histogram of the sample value of the audio signal to be reproduced, and calculate the correction value of the sound quality using the normalized power spectrum density.

The correction value calculating unit can normalize the power spectrum density of the audio signal to be reproduced with a value having a predetermined probability density of the absolute value histogram of the sample value of the audio signal to be reproduced.

The correction value calculating unit can normalize the power spectrum density of the audio signal to be reproduced using a reference peak level of the absolute value histogram of the sample value of the audio signal to be reproduced.

The correction value calculating unit can obtain a difference between the normalized power spectrum density of the audio signal to be reproduced and an average value of the power spectrum densities of the audio signal group, and calculate the correction value of the sound quality using the difference.

The correction value calculating unit can calculate a correction value of the power spectrum density of the audio signal to be reproduced using the difference and a standard deviation value of the power spectrum densities of the audio signal group, and calculate the correction value of the sound quality using the correction value of the power spectrum density of the audio signal to be reproduced.

A correcting unit configured to correct either or both of the sound volume and the sound quality of the audio signal to be reproduced using the correction value calculated by the correction value calculating unit can be further included.

A processing section configured to process the sound quality of the audio signal to be reproduced without using the correction value calculated by the correction value calculating unit can be further included.

An output unit configured to reproduce and output the audio signal to be reproduced can be further included.

A metadata generating unit configured to generate metadata of an audio signal can be further included.

The metadata generating unit can generate the metadata by decimation in frequency.

The metadata generating unit can generate the metadata of the audio signal to be reproduced, and the correction value calculating unit can be configured to calculate either or both of the correction value of the sound volume of the audio signal to be reproduced and the correction value of the sound quality of the audio signal to be reproduced using the metadata generated by the metadata generating unit.

The metadata generating unit can be configured to generate the metadata of each audio signal of the audio signal group, and a target data generating unit configured to generate target data of the audio signal group using the metadata of each audio signal of the audio signal group generated by the metadata generating unit can be further included.

A database configured to manage the target data generated by the target data generating unit can be further included.

An information processing method of an aspect of the present technology is an information processing method, including: acquiring target data which is a statistical value of metadata of each audio signal of an audio signal group; acquiring metadata of an audio signal to be reproduced; and calculating either or both of a correction value of a sound volume of the audio signal to be reproduced and a correction value of a sound quality of the audio signal to be reproduced using the acquired target data and the acquired metadata.

A program of an aspect of the present technology is a program causing a computer to function as: a target data acquiring unit configured to acquire target data which is a statistical value of metadata of each audio signal of an audio signal group; a metadata acquiring unit configured to acquire metadata of an audio signal to be reproduced; and a correction value calculating unit configured to calculate either or both of a correction value of a sound volume of the audio signal to be reproduced and a correction value of a sound quality of the audio signal to be reproduced using the target data acquired by the target data acquiring unit and the metadata acquired by the metadata acquiring unit.

In an aspect of the present technology, target data which is a statistical value of metadata of each audio signal of an audio signal group is acquired, metadata of an audio signal to be reproduced is acquired, and either or both of a correction value of a sound volume of the audio signal to be reproduced and a correction value of a sound quality of the audio signal to be reproduced are calculated using the acquired target data and the acquired metadata.

Advantageous Effects of Invention

According to the present technology, information can be processed. Further, according to the present technology, it is possible to obtain a sound volume correction effect more suitable for an auditory sensation.

BRIEF DESCRIPTION OF DRAWINGS

FIGS. 11A, 11B, and 11C is a are diagrams illustrating an example of an audio signal waveform, a PSD, and an HIST of a musical piece produced in 1990.

MODE(S) FOR CARRYING OUT THE INVENTION

Figure 1:
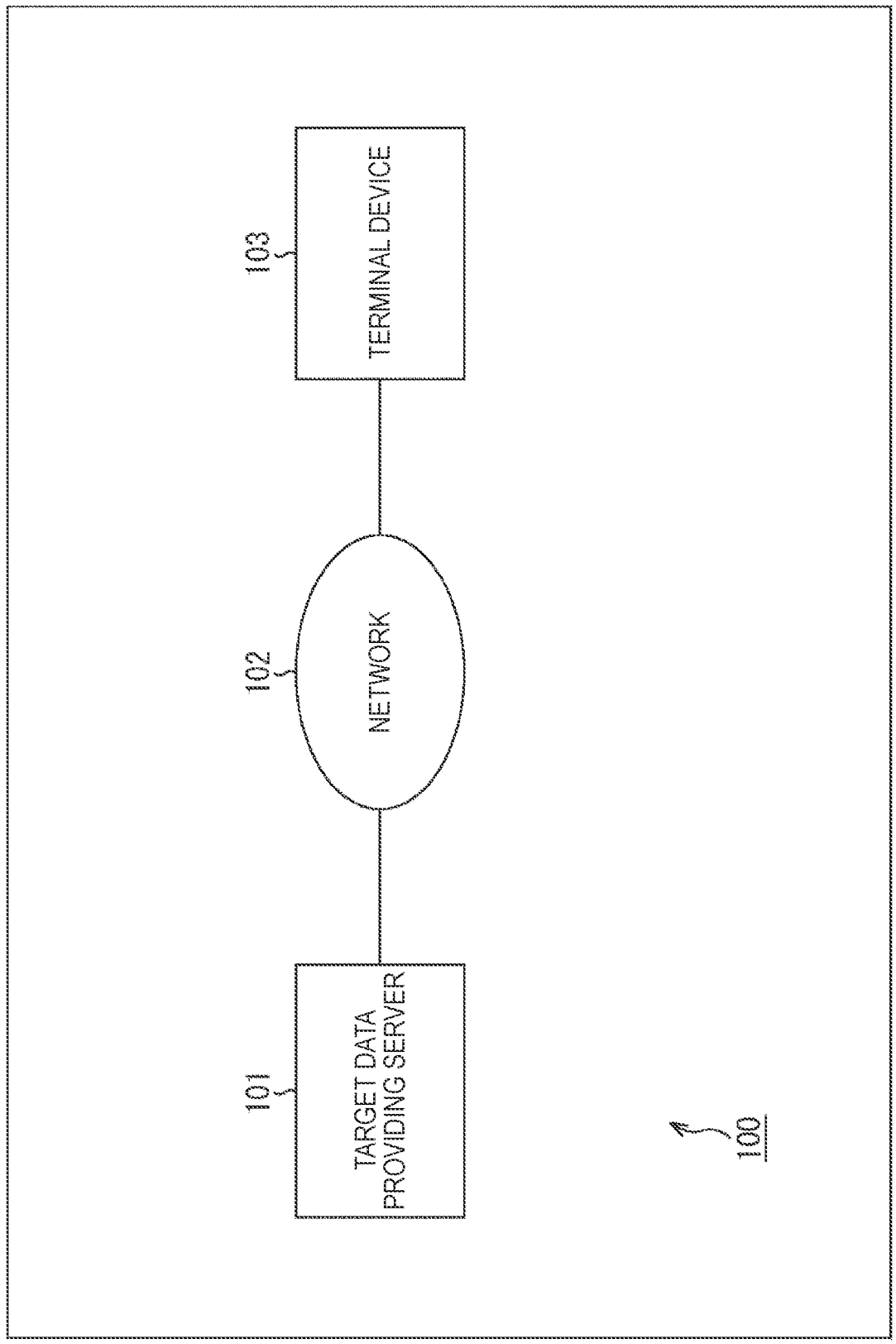
FIG. 1 is a block diagram illustrating a main configuration example of an audio signal reproduction system.

Hereinafter, a mode (hereinafter referred to as an "embodiment") for carrying out the present disclosure will be described. Further, the description will proceed in the following order.
1. First embodiment (audio signal reproduction system)
2. Second embodiment (Others)

1. First Embodiment

<Sound Volume Adjustment of Audio Signal>

In the past, techniques of leveling sound volumes (loudness) between different audio sources (musical pieces in the case of music) and improving comfort and convenience of a listener (for example, eliminating the inconvenience or the like of adjusting a volume for each musical piece) have been developed and put to practical use. A sound volume or a sound quality of an audio source (musical piece) is not necessarily uniform and often varies depending on a production situation thereof (for example, a producer, a production year, recording equipment, or the like). In other words, for example, in a case in which a plurality of musical pieces with, for example, different producers, singers (performers), production years, singles or albums storing an audio source, or the like are played on shuffle, the sound volume or the sound quality is likely to vary, causing the listener to feel uncomfortable. In this regard, a method of leveling a sound volume by a reproducing device as described above is considered.

As the leveling technique, there are a technique in which preliminary analysis for a musical piece is not performed and a technique in which preliminary analysis for a musical piece is performed. In the former technique, sound volume correction parameters are decided in parallel with a reproduction process of an audio source, a sound volume is controlled, and the parameters of the correction processing are sequentially updated with a change in reproduction content of the audio source. In the latter technique, the entire audio source (the entire musical piece in the case of music) is analyzed in advance, an audio source feature quantity (meta information) is acquired, and the sound volume is controlled with the constant sound volume correction parameters over the entire audio source on the basis of the information at the time of reproduction. For example, in a broader sense, loudness regulation of television sounds as defined in Association of Radio Industries and Businesses (ARIB) TR-B32 and the like are also included.

In the case of the former technique, since the sound volume correction parameters vary in the audio source, in a case in which the audio source is music, the original cadence (dynamics) of a musical piece is likely to be impaired, but since preliminary analysis is unnecessary, it is easy to implement it even in an embedded acoustic instrument or the like. Further, there is an advantage in that it is also applicable to consecutive content (a broadcast or a disc jockey (DJ) mix) or the like.

In the case of the latter technique, the original dynamics of music are unlikely to be impaired as in the case of the former technique, but in order to realize it, preliminary analysis is necessary, so there is restriction on a configuration of a processing system. Further, as another problem, there are cases in which a correction result of the sound volume does not coincide with a result which is felt as desirable in terms of the auditory sensation. In the known related art, the effective value of the entire musical piece is used to calculate the sound volume correction value. In this case, the prefilter is used to improve the correlation between the auditory sensation and the effective value. As the characteristic of the prefilter, for example, the K characteristic is used (in the case of ARIB TR-B 32), but the K characteristic is realized by a cascade connection of two biquad filters in view of easy implementation of a filter, and it does not necessarily cause an aural characteristic to be strictly reflected. Further, even if a prefilter with an uncompromising characteristic is used to strictly reproduce the aural characteristic, in a case in which a frequency characteristic of a reproducing device is not flat, since it does not become a true effective value finally sensed by a listener in principle unless the effective value is calculated taking the characteristic into consideration, it is difficult to obtain such an effective value for each individual reproducing device since the frequency characteristic of the reproducing device can exist indefinitely.

Further, in compact discs (CDs) from the first half of the 1990's, due to a mastering process (a sound quality adjustment process) for improving a marketing effect called so-called sound pressure competition and increasing an effective value by an effect of a limiter or a compressor, a crest factor (a ratio of a maximum value to an effective value) of a music signal tends to differ greatly, and it is difficult to accurately evaluate a loudness relation of musical pieces in a case in which such musical pieces or albums (CD albums) are mixed with one value such as an effective value.

Further, the sound quality is unable to be corrected by the method of the related art. The sound pressure competition mentioned above is not limited to the change in the sound volume but also associated with the change in the sound quality. Further, even though the sound pressure competition is not the main cause, each musical piece may have a tendency of a different sound quality depending on an intention, a preference, or the like of a music producer. In this case, even if a sound volume feeling is well aligned among these musical pieces, a difference in tendency of the sound quality remains. For this reason, particularly in a case in which a listener reproduces these musical pieces continuously, even in a case in which numerical sound volumes are aligned, a feeling of discomfort (discontinuity or inconsistency) caused by irregularity of the sound quality may be given.

Further, depending on a reproducing device, the listener may be able to correct to a desired sound quality using an equalizer or the like embedded in the reproducing device. However, in a case in which there is a difference in sound quality between musical pieces as described above, the listener has to manipulate settings of the equalizer for each musical piece so that each musical piece can be reproduced with a sound quality appropriate for the listener. For this reason, the listener is unable to use the equalizer comfortably and practically due to its complexity.

<Sound Volume/Sound Quality Correction Using Target Data and Metadata>

In this regard, either or both of a correction value of a sound volume of an audio signal to be reproduced or a correction value of a sound quality of the audio signal to be reproduced is calculated using target data which is a statistical value of metadata of each audio signal of an audio signal group and metadata of the audio signal to be reproduced. The audio signal group is a set of arbitrary audio signals. For example, the audio signal group may be specimens selected from a population under a relatively loose constraint condition (that is, a set under the assumption that there is a variation according to a normal distribution). In the following description, it is assumed that the audio signal group is an audio signal group (specimens) extracted from a population in accordance with a certain criterion. Further, this criterion is arbitrary.

Accordingly, it is possible to obtain a sound volume correction effect more suitable for the auditory sensation. In other words, it is possible to effectively correct the variation in the sound volume and the sound quality of a musical piece, and even in a case in which the listener consecutively listens to different musical pieces in order, the listener can listen to the musical pieces comfortably without any discomfort. Further, in a case in which the listener corrects the sound quality by using the sound quality correction function such as the equalizer installed in the reproducing device, it is possible to suppress a difference in equalizer settings that the listener feels are optimum for each musical piece and improve the convenience of quality adjustment by the listener.

<Audio Signal Reproduction System>

FIG. 1 is a diagram illustrating a main configuration example of an audio signal reproduction system which is an embodiment of an information processing system to which the present technology is applied. An audio signal reproduction system 100 illustrated in FIG. 1 is a system for correcting a sound volume or a sound quality of an audio signal when a terminal device 103 reproduces an audio signal such as music.

The terminal device 103 corrects the sound volume or the sound quality of the audio signal to be reproduced using metadata added to the audio signal to be reproduced and target data provided by a target data providing server 101 which is communicably connected to the terminal device 103 via a network 102.

The metadata added to the audio signal includes information related to the sound volume or the sound quality of the audio signal or a correction value thereof, or the like. Further, the target data is a statistical value (statistical information) of the metadata of each audio signal for a plurality of audio signals (an audio signal group) extracted from a population in accordance with a certain criterion.

As described above, by performing the sound volume correction using not only the metadata of the audio signal to be reproduced but also the target data of the audio signal group extracted from the population in accordance with a certain criterion, the terminal device 103 can effectively correct the variation in the sound volume of the musical piece and obtain the sound volume correction effect more suitable for the auditory sensation.

<Sound Source Analysis and Statistical Analysis>
<Physical Configuration of Target Data Providing Server>

Figure 2:
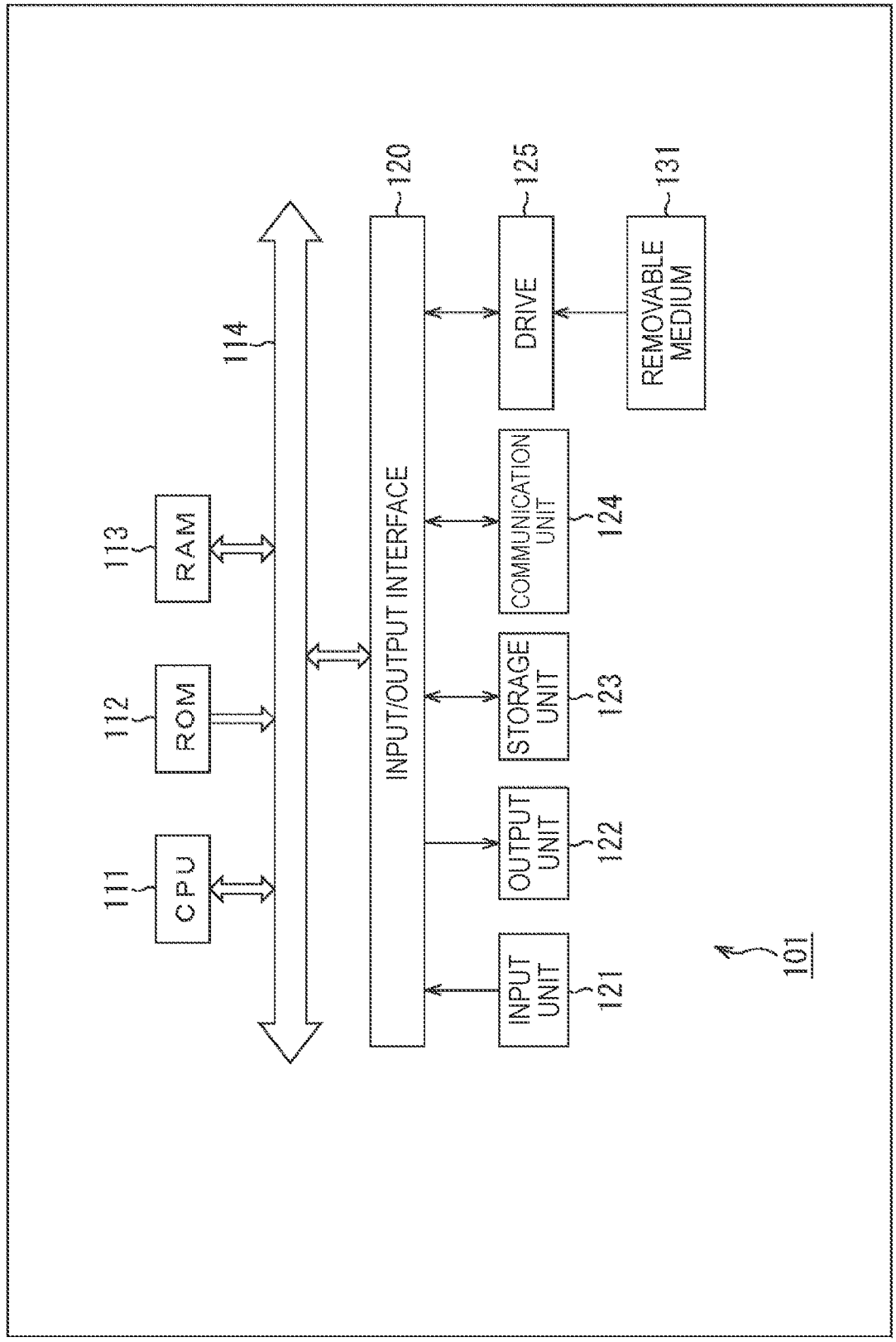
FIG. 2 is a block diagram illustrating a main configuration example of a target data providing server.

FIG. 2 is a block diagram illustrating a main configuration example of the target data providing server 101. As illustrated in 2, the target data providing server 101 includes a central processing unit (CPU) 111, a read only memory (ROM) 112, and a random access memory (RAM) 113.

An input/output interface 120 is also connected to a bus 114. An input unit 121, an output unit 122, a storage unit 123, a communication unit 124, and a drive 125 are connected to the input/output interface 120.

The input unit 121 includes an arbitrary input device such as, for example, a keyboard, a mouse, a touch panel, an image sensor, a microphone, a switch, an input terminal, or the like. Further, the input unit 121 includes an arbitrary sensor such as, for example, an acceleration sensor. The output unit 122 includes an arbitrary output device such as, for example, a display, a speaker, or an output terminal. The storage unit 123 includes an arbitrary storage medium such as, for example, a non-volatile memory such as a hard disk, a RAM disk, a solid state drive (SSD), or a Universal Serial Bus (USB) memory. The communication unit 124 includes a wired and/or wireless communication interface of an arbitrary communication standard such as, for example, Ethernet (registered trademark), Bluetooth (registered trademark), USB, High-Definition Multimedia Interface (HDMI) (registered trademark), or Infrared Data Association (IrDA). The drive 125 drives a removable medium 131 having an arbitrary storage medium such as a magnetic disk, an optical disc, a magneto-optical disc, or a semiconductor memory which is loaded onto the drive 125.

In the target data providing server 101 configured as described above, for example, functions to be described later are realized by loading a program stored in the storage unit 123 onto the RAM 113 via the input/output interface 120 and the bus 114 and executing the program by the CPU 111. Further, data or the like necessary for the CPU 111 to execute various types of processes is stored in the RAM 113 as appropriate.

The program executed by the CPU 111 can be recorded in the removable medium 131 serving as, for example, a package media or the like and applied. In this case, the removable medium 131 is loaded onto the drive 125, and then the program can be installed in the storage unit 123 via the input/output interface 120. Further, the program can also be provided via a wired or wireless transmission medium such as a local area network, the Internet, or digital satellite broadcasting. In this case, the program can be received by the communication unit 124 and installed in the storage unit 123. In addition, this program can be installed in the ROM 112 or the storage unit 123 in advance.

<Functional Configuration of Target Data Providing Server>

Figure 3:
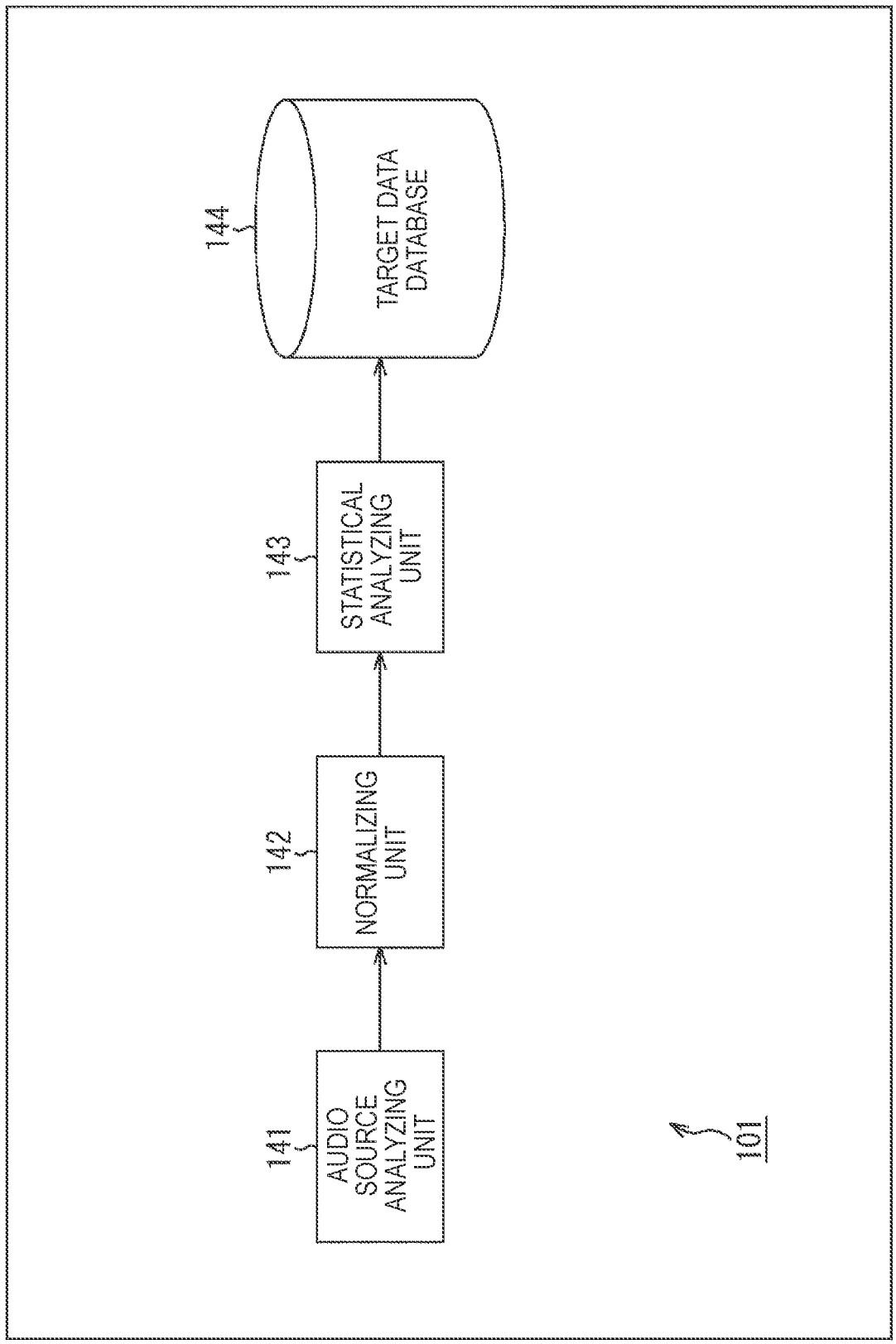
FIG. 3 is a functional block diagram illustrating a main function example of a target data providing server.

FIG. 3 is a functional block diagram illustrating an example of main functions realized by the target data providing server 101. As illustrated in FIG. 3, the target data providing server 101 includes an audio source analyzing unit 141, a normalizing unit 142, a statistical analyzing unit 143, and a target data database 144 as functional blocks.

The audio source analyzing unit 141 is an embodiment of a metadata generating unit to which the present technology is applied, and performs analysis related to the sound volume or the sound quality on an audio source file (audio signal) of a processing target, and generates metadata including information related to an analysis result (that is, information related to the sound volume or the sound quality of the audio signal or a correction value thereof). The audio source analyzing unit 141 associates the generated metadata with the audio source file of the processing target. The audio source analyzing unit 141 supplies the audio source file and the metadata to the normalizing unit 142.

Further, for example, the term "associate" means that other data can be used (linked) when one piece of data is processed, and a physical configuration of data is arbitrary. In other words, for example, the metadata may be embedded in the audio source file (that is, the audio source file and the metadata may be combined as one piece of data) as tag information or the like, or they may be individual data having information linking each other. In other words, the audio source file and the metadata may be transmitted or recorded together or may be individually transmitted or recorded (for example, may be transmitted via different transmission paths or may be recorded in different storage areas or recording media).

Further, in this specification, the terms "embed," "add," "synthesize," "multiplex," "integrate," "include," "store," "put into," "attach," "insert," "link," "associate," or the like refer to one method of "associating" described above. In other words, in this specification, the term "associate" includes all of the meanings of these terms and other terms having similar meanings to these terms.

The normalizing unit 142 performs a process related to normalization for the metadata supplied from the audio source analyzing unit 141. The normalizing unit 142 supplies the audio source file, the normalized metadata, and the like to the statistical analyzing unit 143. The statistical analyzing unit 143 is an embodiment of a target data generating unit to which the present technology is applied, and performs a process related to calculation of a statistical value of metadata for an audio source file group (an audio signal group) (also referred to as a cluster) extracted from a population in accordance with a certain criterion using the audio source file or the metadata supplied from the normalizing unit 142. The statistical value is also referred to as target data. The statistical analyzing unit 143 registers the obtained target data in the target data database 144 together with the audio source file, the metadata, or the like (in association with the audio source file, the metadata, or the like).

These functions (the functions of the audio source analyzing unit 141, the normalizing unit 142, and the statistical analyzing unit 143) are realized, for example, by the CPU 111 executing a program, data, and the like loaded onto the RAM 113.

The target data database 144 is an embodiment of a database to which the present technology is applied, and performs a process related to management of the audio source file, the metadata, statistical information of metadata, or the like supplied from the statistical analyzing unit 143. For example, the target data database 144 stores and manages the audio source file, the metadata, or the statistical information in the storage unit 123, and reads and provides the information if necessary. The function of the target data database 144 is realized, for example, by the CPU 111 executing a program, data, and the like loaded onto the RAM 113 and using the storage unit 123.

<Sound Source Analyzing Unit>

Figure 4:
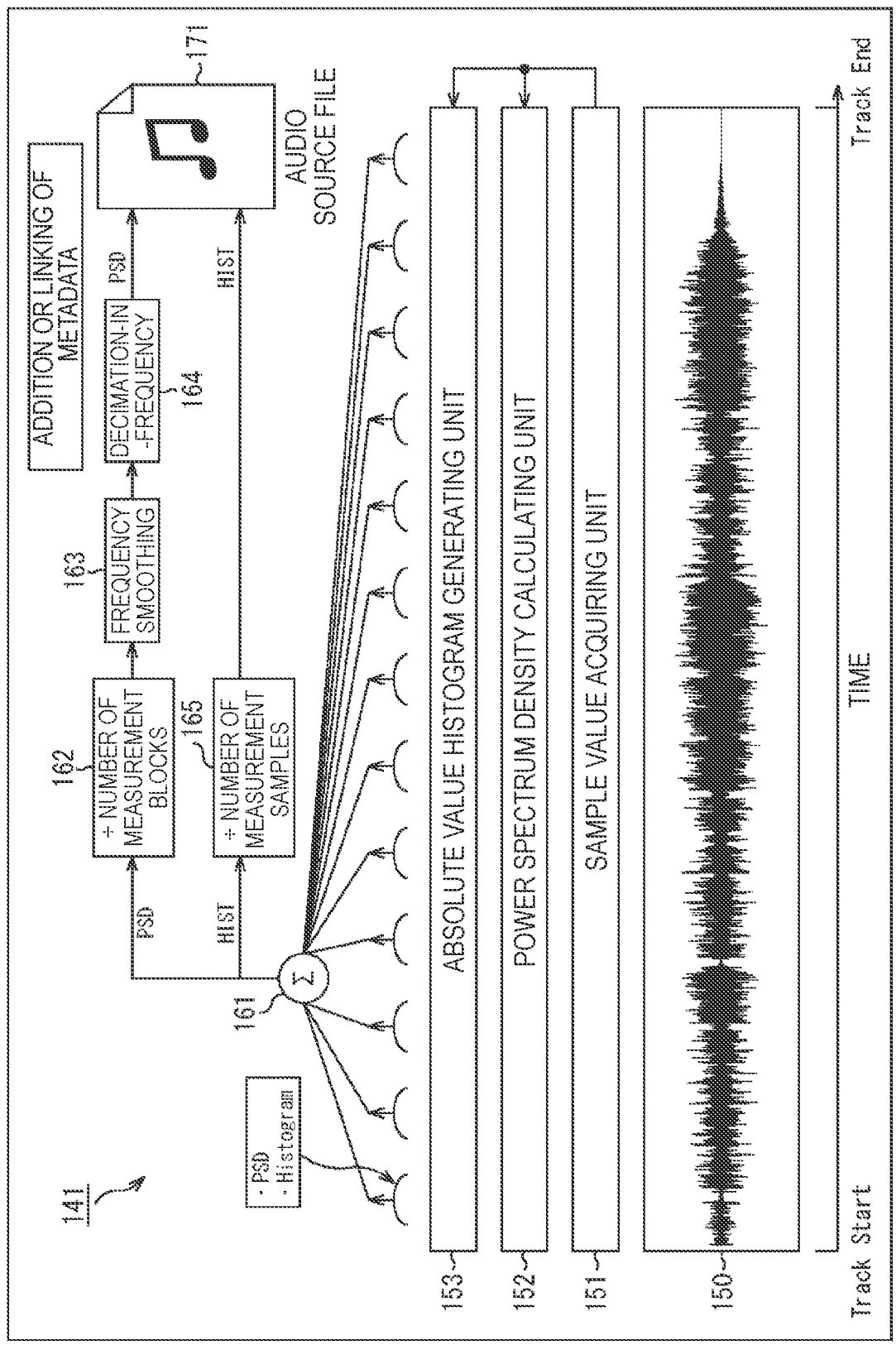
FIG. 4 is a functional block diagram illustrating a main configuration example of an audio source analyzing unit.

Next, the functions of the audio source analyzing unit 141 will be described. FIG. 4 is a functional block diagram illustrating an example of main functions of the audio source analyzing unit 141. As illustrated in FIG. 4, the audio source analyzing unit 141 includes a sample value acquiring unit 151, a power spectrum density calculating unit 152, an absolute value histogram generating unit 153, an adding unit 161, a dividing unit 162, a frequency smoothing unit 163, a decimation-in-frequency processing unit 164, and a dividing unit 165 as functional blocks.

The audio source analyzing unit 141 analyzes an audio signal 150 of an audio source file 171 of the processing target and obtains a power spectrum density (PSD) and a histogram of an absolute value of a sample value. The audio source analysis is performed in units of one audio source (for example, in units of one track in the case of a CD. One track=one movement in many cases in the case of classical musical piece). Of course, a processing unit of the audio source analysis is arbitrary, and, for example, a plurality of audio sources may be analyzed together. Further, hereinafter, audio source analysis is assumed to be performed in units of one musical piece (=one audio source=one track or the like). An average (an average power spectrum density) of the power spectrum densities of one entire musical piece is also referred to as I_PSD(i). Further, the histogram of the absolute value of the sample of one entire musical piece is also referred to as I_HIST(m). Further, "i" indicates an index of a frequency, and "m" indicates an index of a sample absolute value bin.

The sample value acquiring unit 151 performs a process related to sampling of the audio signal. For example, the sample value acquiring unit 151 samples the audio signal 150 of the audio source file 171 of the processing target at a predetermined sampling frequency and acquires the sample value. The sample value acquiring unit 151 supplies the obtained sample value to the power spectrum density calculating unit 152 and the absolute value histogram generating unit 153.

<Power Spectrum Density>

The power spectrum density calculating unit 152 performs a process related to the calculation of the power spectrum density using the sample value obtained by the sample value acquiring unit 151. For example, the power spectrum density calculating unit 152 calculates the power spectrum density for each predetermined data unit (measurement block).

For the analysis of the PSD, for example, a Barlett technique (equivalent to a Welch technique with overlap=0 [sample]) employing a Hanning window as a window function is used. The number of points (fft_size) of fast Fourier transform (FFT) is set to, for example, fft_size=16384 in order to obtain a sufficient frequency resolution near an audible frequency lower limit. In this case, a frequency resolution of an audio source with a sampling frequency fs=44.1 kHz is 2.7 Hz (=44.1 kHz±16384). An average power spectrum density of both L and R channels of a stereo audio source (PSD(w)) in the following Formula since it is a function of frequency) is obtained by the following Formulas (1) and (2) if i-th sample values of an n-th measurement block among m measurement blocks for an L channel and an R channel are L(i,n) and R(i,n). Further, an amplitude value is assumed to be normalized with a full scale of ±1.0.

[Math. 1]

$$PSD_S(\omega, n) = \frac{K_{PSD} * K_{PCF}}{2.0 * \text{fft\_size}} * \left\{ \left( \sum_{i=1}^{\text{fft\_size}} \left\{ W[i] * L(i, n) * e^{-j\omega \frac{i}{\text{fft\_size}}} \right\} \right)^2 + \left( \sum_{i=1}^{\text{fft\_size}} \left\{ w[i] * R(i, n) * e^{-j\omega \frac{i}{\text{fft\_size}}} \right\} \right)^2 \right\} \quad (1)$$

[Math. 2]

$$PSD(\omega) = 10 * \log_{10}\left[ TMA\left\{ \frac{1}{m}\sum_{n=1}^{m} PSD_S(\omega, n), \frac{\omega}{2*\pi} \right\} \right] \quad (2)$$

Here, j is an imaginary unit, ω is an angular frequency, and W(i) is a Hanning window function and is defined as in the following Formula (3).

[Math. 3]

$$W(i) = 0.5 - 0.5 * \cos\left( 2*\pi* \frac{1}{\text{fft\_size}} \right) \quad (3)$$

In Formula (1), $K_{PCF}$ is a correction value of an energy reduction rate by the window function and is referred to as a power correction factor (PCF). With correction by $K_{PCF}$, it is possible to perform a relative comparison between power spectrum densities analyzed using different window functions. PCF($K_{PCF}$) is obtained by the following Formula (4).

[Math. 4]

$$K_{PCF} = \frac{1}{\text{fft\_size}} \sum_{i=1}^{\text{fft\_size}} W(i)^2 \quad (4)$$

Further, in Formula (1), $K_{PSD}$ is a coefficient for converting a discrete FFT result (power spectrum) into a continuous power spectrum density (power per bandwidth 1 Hz) and is defined as in the following Formula (5) using the sampling frequency fs.

[Math. 5]

$$K_{PSD} = \frac{1}{fs} \quad (5)$$

Further, in the Formula (2), a triangular moving average (TMA) indicates a triangular moving average, a first argument indicates a target data sequence, and a second argument indicates a moving average width. A triangular moving average process of one octave width is performed to enhance a correlation between an analysis result and a sound quality-like feature of a musical piece which human feels since a critical bandwidth of a sense of hearing is roughly 100 Hz at 500 Hz or less and a ⅓ to ¼ octave width at 500 Hz or more.

Returning to FIG. 4, the adding unit 161 calculates a sum of the power spectrum densities for the measurement blocks generated by the power spectrum density calculating unit 152 as described above. The dividing unit 162 divides the sum of the power spectrum densities calculated by the adding unit 161 by the number of measurement blocks. In other words, the adding unit 161 and the dividing unit 162 calculate the average (I_PSD(i)) of the power spectrum densities of one entire musical piece. The frequency smoothing unit 163 smooths the average (I_PSD(i)) of the calculated power spectrum densities of one entire musical piece in the frequency direction. The decimation-in-frequency processing unit 164 performs a decimation-in-frequency process on the average (I_PSD(i)) of the power spectrum densities of one entire musical piece obtained as described above if necessary. In other words, the decimation-in-frequency processing unit 164 omits the power spectrum densities for some frequencies. In other words, the decimation-in-frequency processing unit 164 extracts the power spectrum densities for some frequencies. Accordingly, it is possible to reduce a data amount of the metadata. The unit of the PSD is W/Hz in which V is a unit of an amplitude, but in an embodiment, it is 1/Hz because the amplitude is non-dimensional. Further, dB conversion is performed, and it is dB/Hz for a subsequent process.

The decimation-in-frequency processing unit 164 associates information related to the power spectrum density (PSD) generated as described above (that is, the average (I_PSD(i)) of the power spectrum densities of one entire musical piece) with the audio source file 171 as the metadata. In other words, for example, the decimation-in-frequency processing unit 164 adds the metadata to the audio source file 171. Alternatively, for example, the decimation-in-frequency processing unit 164 associates the metadata with the audio source file 171.

<Absolute Value Histogram>

The absolute value histogram generating unit 153 performs a process related to generation of an absolute value histogram of the sample value obtained by the sample value acquiring unit 151. For example, the absolute value histogram generating unit 153 generates an absolute value histogram (HIST) for each measurement block.

For the analysis of the absolute value histogram (HIST) of the sample value, for example, data acquired at intervals of 16384 points and overlap=0 [sample] which are identical to those of the PSD (that is, all non-overlapping samples of both left and right channels in one track) is used. After the absolute value is obtained, the sample value is converted to a dB value (a maximum value is assumed to be 0 dBFS) in order to secure a dynamic range of an analysis result and is counted every bin of 0.5 dB step in a range of −60 dBFS to 0 dBFS.

The adding unit 161 combines the absolute value histograms (HIST) of the respective measurement blocks generated as described above by the absolute value histogram generating unit 153 and generates an absolute value histogram corresponding to one track. If counting of all the samples of one track is completed as described above, the dividing unit 165 divides a count number of each bin by the numbers of all samples (the number of measurement samples) for the absolute value histogram (HIST) corresponding to one track generated by the adding unit 161, and converts it into a probability of occurrence density function (a histogram (I_HIST(m)) of the absolute value of the sample of one entire musical piece). A unit is a probability of occurrence (=1/0.5 dB) per 0.5 dB width, but for normalization of the value, the unit is converted into the probability of occurrence (=1/dB) per 1 dB width by dividing by two.

The dividing unit 165 associates information related to the probability of occurrence density function generated as described above (the histogram (I_HIST(m)) of the absolute value of the sample of one entire musical piece) with the audio source file 171 as the metadata. In other words, for example, the dividing unit 165 adds the metadata to the audio source file 171. Alternatively, for example, the dividing unit 165 links the metadata with the audio source file 171.

<Others>

The audio source analyzing unit 141 supplies the audio source file 171 associated with I_PSD(i) or I_HIST(m) as the metadata to the normalizing unit 142.

Further, in the above example, the interval of 0 [sample] is used for the calculation of the PSD or the HIST, but a value different from 0 [sample] may be used in accordance with a capability of an audio source analysis processing system. For example, it may be a constant value, may be a random number, or may take a negative value causing the measurement samples to overlap. In a case in which the interval is increased, it is necessary to consider reduction in accuracy of the analyzed result, but since the accuracy decrease amount is statistically predictable, it is allowable within a practical range.

Further, since a silence interval of about 1 second to 2 seconds is added before and after a musical piece in many cases, particularly, in a case in which the interval is long, and the number of measurement samples is small, the accuracy can be improved by excluding the silent intervals before and after the musical piece are excluded from the analysis target. Further, a prelude or an outro of a musical piece may be excluded from the analysis target. For example, a prelude or an outro of a musical piece may have a sound volume or a sound quality different from that of a main part, for example, may have a musical instrument configuration different from the main part. Further, there are also cases in which effects which are not included in the main part such as so-called fade-in or fade-out are used. The accuracy can be improved by excluding such a special section from the analysis target. Of course, a middle part of a musical piece may be excluded from the analysis targets. For example, a bridge or the like may have a sound volume or a sound quality different from that of a main part as well. The accuracy can be improved by excluding such a special section from the analysis target. In other words, the PSD or the HIST may be obtained from some arbitrary samples of the audio signal (corresponding to one track).

Further, the window function used for the calculation of the PSD is not limited to the Hanning window. Further, a step of bin of the HIST is not limited to 0.5 dB. The PSD and the HIST are density functions normalized by the number of measurement blocks and the number of measurement samples, and it is sufficient to design a calculation method capable of comparing results which differ in the number of points of FFT, the window function, or the intervals except for a difference in accuracy caused by a difference in an interval setting.

<Normalizing Unit>

Figure 5:
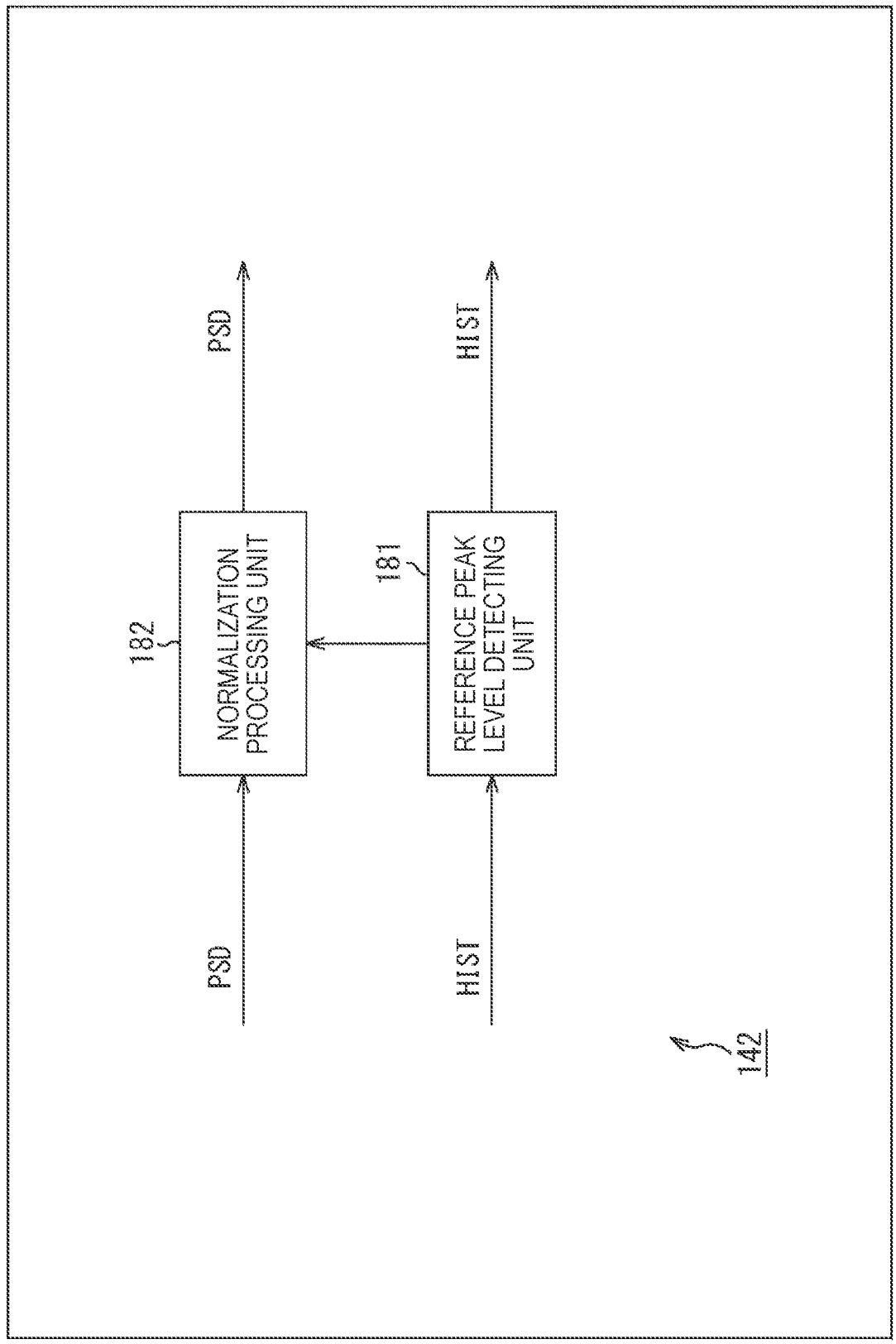
FIG. 5 is a functional block diagram illustrating a main configuration example of a normalizing unit.

Next, the functions of the normalizing unit 142 will be described. FIG. 5 is a functional block diagram illustrating an example of main functions of the normalizing unit 142. As illustrated in FIG. 5, the normalizing unit 142 has a reference peak level detecting unit 181 and a normalization processing unit 182 as functional blocks.

The reference peak level detecting unit 181 detects a reference peak level (IPL) of the audio source from the histogram (I_HIST(m)) of the absolute value of the sample of one entire musical piece which is obtained by the audio source analyzing unit 141. The reference peak level (IPL) indicates a class value (a level value) of the largest bin searched from the HIST using a predetermined probability of occurrence density (for example, a probability of occurrence density P=0.01 [/dB]). Hereinafter, a unit [/dB] is omitted.) as a lower limit threshold value. The normalization processing unit 182 normalizes the power spectrum density (PSD) (that is, the average (I_PSD(i)) of the power spectrum densities of one entire musical piece) using the reference peak level (IPL) of the processing target audio source detected by the reference peak level detecting unit 181. The normalization will be described later in detail.

The normalizing unit 142 supplies the audio source file and the normalized PSD and HIST associated with the audio source file to the statistical analyzing unit 143.

<Statistical Analyzing Unit>

Figure 6:
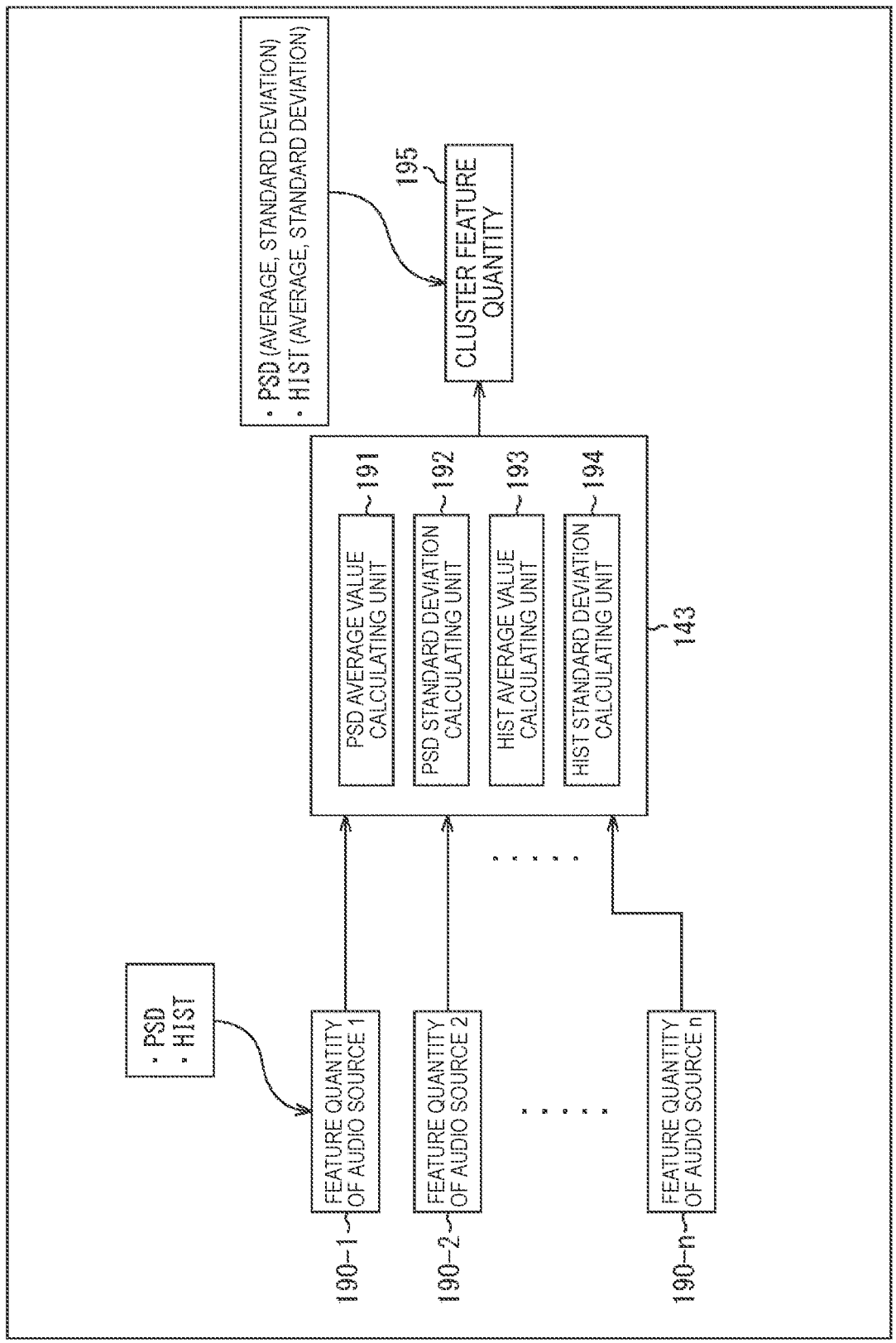
FIG. 6 is a functional block diagram illustrating a main configuration example of a statistical analyzing unit.

Next, the functions of the statistical analyzing unit 143 will be described. FIG. 6 is a functional block diagram illustrating an example of main functions of the statistical analyzing unit 143. As illustrated in FIG. 6, the statistical analyzing unit 143 includes a PSD average value calculating unit 191, a PSD standard deviation calculating unit 192, a HIST average value calculating unit 193, and a HIST standard deviation calculating unit 194 as functional blocks.

The statistical analyzing unit 143 performs statistical analysis on a plurality of audio source files. The statistical analysis is a process for obtaining statistical information of each audio source analysis result of a plurality of audio source files (an audio signal groups) (also referred to as a "cluster") serving as a processing target. For example, with the statistical analysis, for the processing target cluster, the statistical analyzing unit 143 obtains an average value (T_PSD_A(i)) of the power spectrum densities of all the audio source files in the cluster, a standard deviation value (T_PSD_S(i)) of the power spectrum densities of all the audio source files in the cluster, an average value (T_HIST_A(m)) of the histograms of the sample absolute values of all the audio source files in the cluster, and a standard deviation value (T_HIST_S(m)) of the histograms of the sample absolute values of all the audio source files in the cluster. Further, "i" indicates an index of a frequency, and "m" indicates an index of the sample absolute value bin.

In other words, the audio source analyzing unit 141 obtains feature quantities of the respective audio source files of the cluster of the processing target (the average (I_PSD(i)) of the power spectrum densities of one entire musical piece and the histogram (I_HIST(m)) of the absolute value of the sample of one entire musical piece). For example, in the example of FIG. 6, the audio source analyzing unit 141 analyzes n audio source files (n is an arbitrary natural number), and obtains each audio source feature quantity 190 (a feature quantity 190-1 of an audio source 1, a feature quantity 190-2 of an audio source 2, . . . , a feature quantity 190-*n* of an audio source n). As illustrated in FIG. 6, each audio source feature quantity 190 includes the average (I_PSD(i)) of the power spectrum densities of one entire musical piece and the histogram (I_HIST(m)) of the absolute value of the sample of one entire musical piece.

Each audio source feature quantity 190 is supplied to the statistical analyzing unit 143 via the normalizing unit 142. In other words, each audio source feature quantity 190 is normalized.

The PSD average value calculating unit 191 of the statistical analyzing unit 143 calculates the average value (T_PSD_A(i)) of the power spectrum densities of all the audio source files in the cluster from each audio source feature quantity 190. For example, the PSD average value calculating unit 191 calculates T_PSD_A(i) by adding I_PSD(i) of all the audio sources for each frequency bin and dividing an addition result by the number of audio sources n for each frequency bin.

Further, the PSD standard deviation calculating unit 192 of the statistical analyzing unit 143 calculates the standard deviation value (T_PSD_S(i)) of the power spectrum densities of all the audio source files in the cluster from each audio source feature quantity 190. For example, the PSD standard deviation calculating unit 192 calculates T_PSD_S(i) by dividing I_PSD(i) by the value of T_PSD_A(i) for each frequency bin, squaring a division result for each frequency bin, adding squaring results of all the audio sources for each frequency bin, and dividing an addition result by the number of audio sources n for each frequency bin.

Further, the HIST average value calculating unit 193 of the statistical analyzing unit 143 calculates the average value (T_HIST_A(m)) of the histograms of the sample absolute values of all the audio source files in the cluster from each audio source feature quantity 190. For example, the HIST average value calculating unit 193 calculates T_HIST_A(m) by adding I_HIST(m) of all the audio sources for each sample absolute value bin and dividing an addition result by the number of audio sources n for each sample absolute value bin.

Further, the HIST standard deviation calculating unit 194 of the statistical analyzing unit 143 calculates the standard deviation value (T_HIST_S(m)) of the histograms of the sample absolute values of all the audio source files in the cluster from each audio source feature quantity 190. For example, the HIST standard deviation calculating unit 194 calculates T_HIST_S(m) by dividing I_HIST(m) by the value of T_HIST_A(m) for each sample absolute value bin, squaring a division result for each sample absolute value bin, adding squaring results of all the audio sources for each sample absolute value bin, and dividing an addition result by the number of audio sources n for each sample absolute value bin.

The statistical analyzing unit 143 supplies these values to the target data database 144 as a cluster feature quantity 194 (that is, the target data) so that the values are registered.

Further, the statistical analyzing unit 143 can classify the audio signal group as the cluster using an arbitrary element as a classification criterion. For example, in a case in which the audio signal is music, a genre may be used as a classification criterion, and clustering is performed for each genre. Further, for example, instead of a genre, a performer, a producer, a production time, or the like may be used as the classification criterion. Of course, other elements may be used as the classification criterion. Further, for example, a plurality of elements may be used as the classification criterion. Further, an element to be used as the classification criterion may be predetermined or may be settable (updatable).

Example of PSD and HIST

Figure 7:
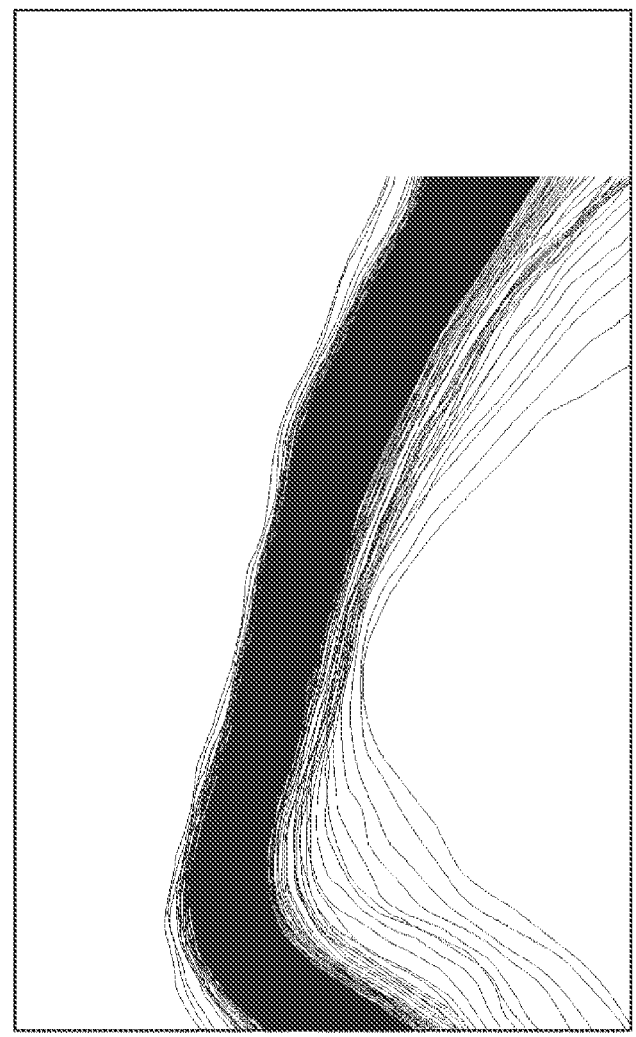
FIG. 7 is a diagram illustrating an example of a PSD of an audio signal group serving as a statistical analysis target.
Figure 8:
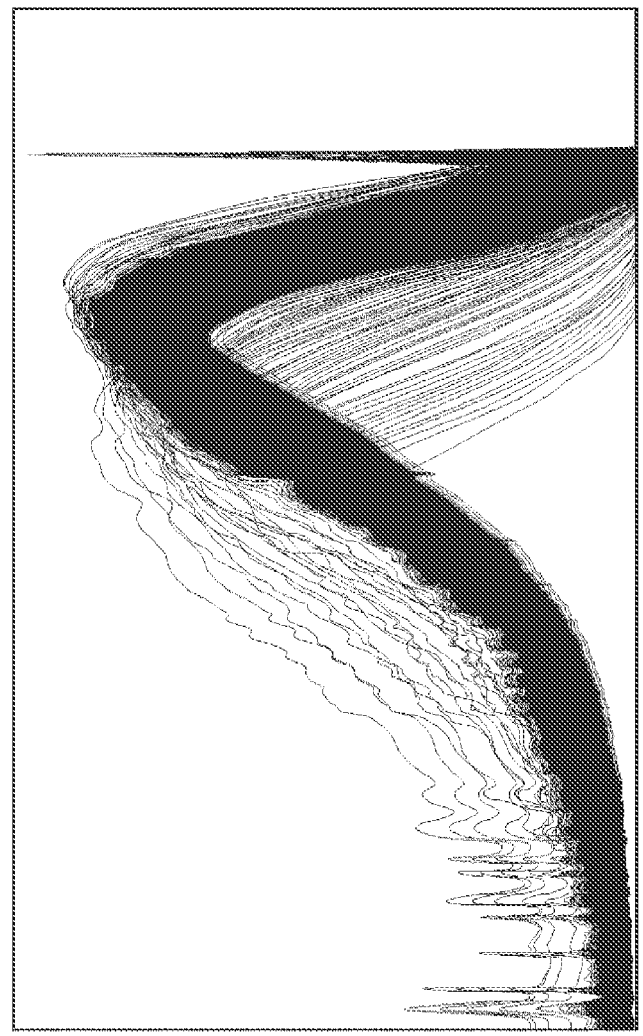
FIG. 8 is a diagram illustrating an example of an HIST of an audio signal group serving as a statistical analysis target.

For example, FIGS. 7 and 8 illustrate results of performing the audio source analysis on audio source files (musical pieces) belonging to a cluster which is a genre of a popular music, that is, a plurality of musical pieces having a genre of a popular music. FIG. 7 illustrates the PSDs of all the audio source files of the cluster, and FIG. 8 illustrates the HISTs of all the audio source files of the cluster.

Figure 9:
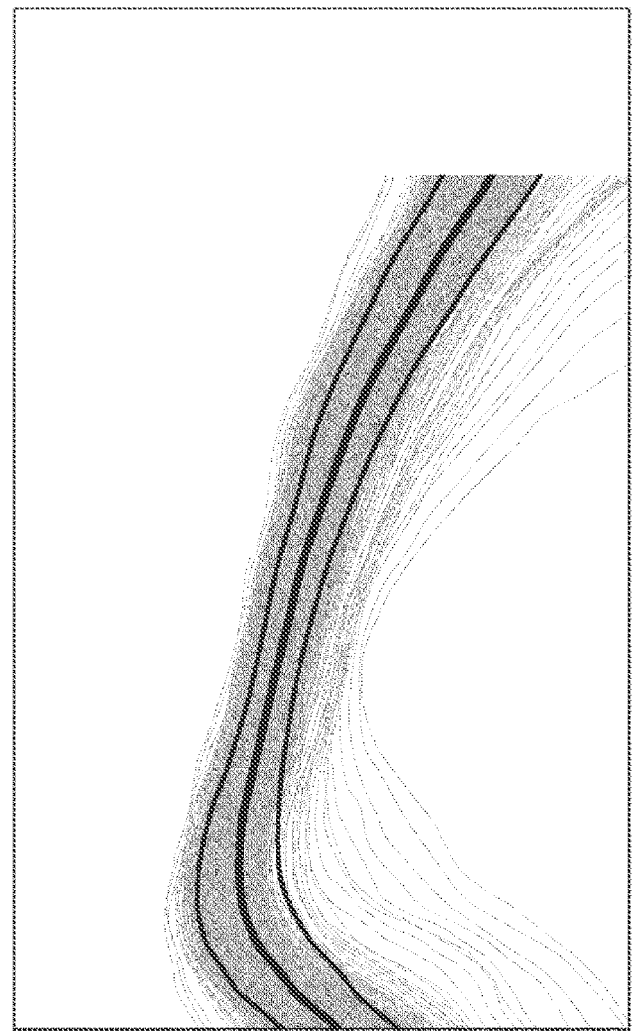
FIG. 9 is a diagram illustrating an example of an average value and a standard deviation value of a PSD.
Figure 10:
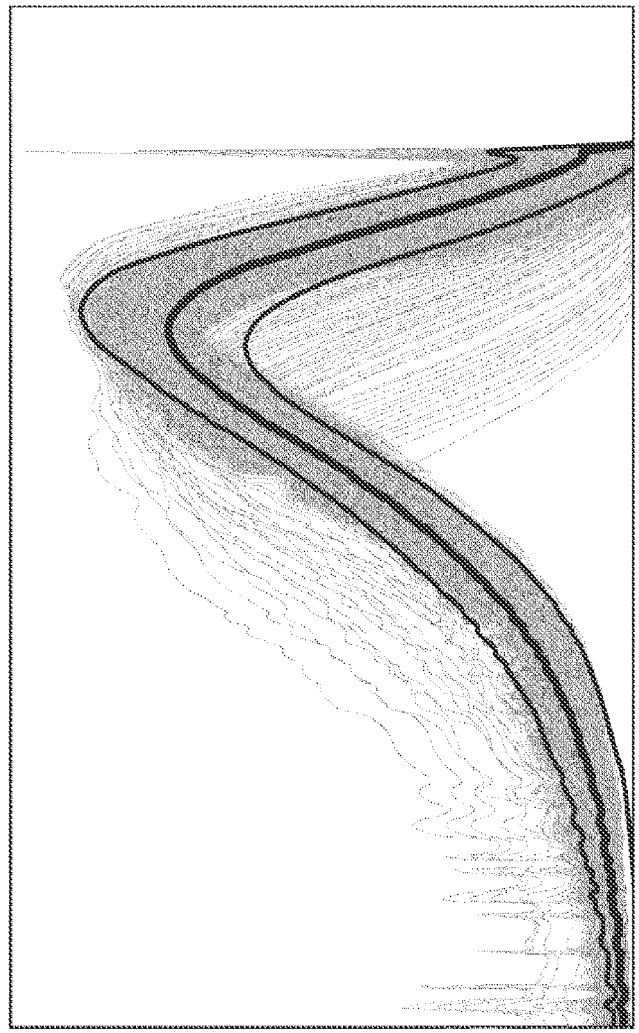
FIG. 10 is a diagram illustrating an example of an average value and a standard deviation value of an HIST.

The statistical analyzing unit 143 performs the statistical analysis using such an audio source analysis result as described above. FIG. 9 is a diagram illustrating an average value and an average value±a standard deviation value of the PSDs of all the audio source files of the processing target cluster illustrated in FIG. 7. In FIG. 9, among three curves which are illustrated superimposed on the curves illustrated in FIG. 7, a middle curve indicates the average value of the PSDs, and upper and lower curves indicate the average value±the standard deviation value of the PSDs. FIG. 10 is a diagram illustrating the average value and the average value±the standard deviation value of the HISTs of all the audio source files of the processing target cluster illustrated in FIG. 8. In FIG. 10, among three curves which are illustrated superimposed on the curves illustrated in FIG. 8, a middle curve indicates the average value of the HISTs, and upper and lower curves indicate the average value±the standard deviation value of the HISTs.

<Sound Volume Difference of Audio Source>

For example, in the popular music, in mastering which is a final production step, volume adjustment and equalization processes are generally performed for sound volume balance and sound quality adjustment among a plurality of tracks included in an album. Further, particularly in popular music in recent years, dynamic range adjustment by a limiter or compressor process is also often performed, and there are many producers who positively use a sound quality change caused by an excessive limiter or compressor process for audio production.

FIGS. 11A, 11B, and 11C illustrate an envelope waveform and an analysis result of a musical piece A produced in 1990. FIG. 11A illustrates an envelope waveform of the musical piece A. FIG. 11B illustrates the PSD of the musical piece A. FIG. 11C illustrates the HIST of the musical piece A.

Figure 12A:
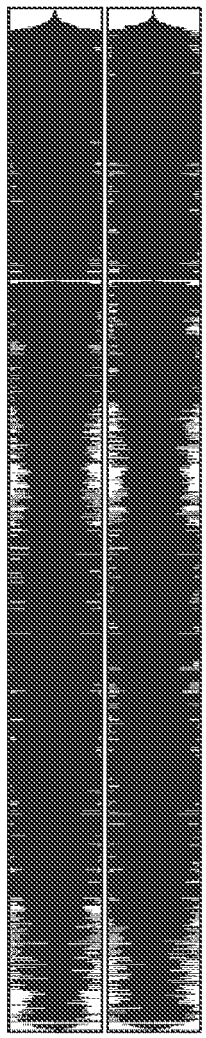
FIGS. 12A, 12B, and 12C are diagrams illustrating examples of an audio signal waveform, a PSD, and an HIST of a musical piece produced in 2012.
Figure 12C:
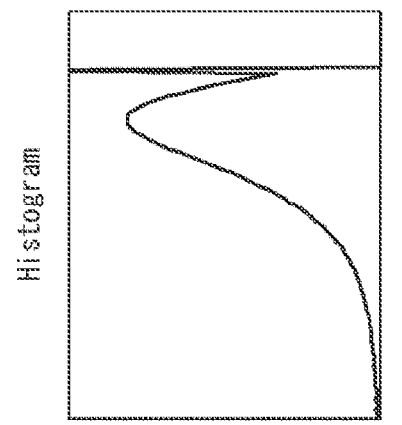
Figure 12B:
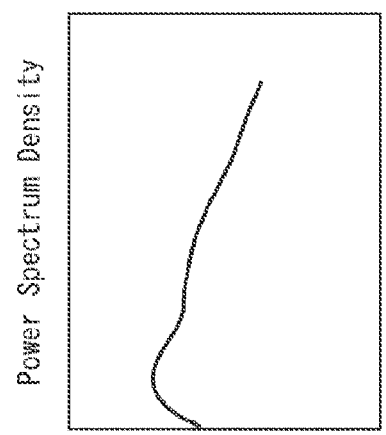

FIGS. 12A, 12B, and 12C illustrate an envelope waveform and an analysis result of a musical piece B produced in 2012. A of FIG. 12A illustrates an envelope waveform of the musical piece B. Further, a scale of a vertical axis is the same as that of FIG. 11A (the envelope waveform of the musical piece A). FIG. 12B illustrates the PSD of the musical piece B. FIG. 12C illustrates the HIST of the musical piece B.

Figure 13:
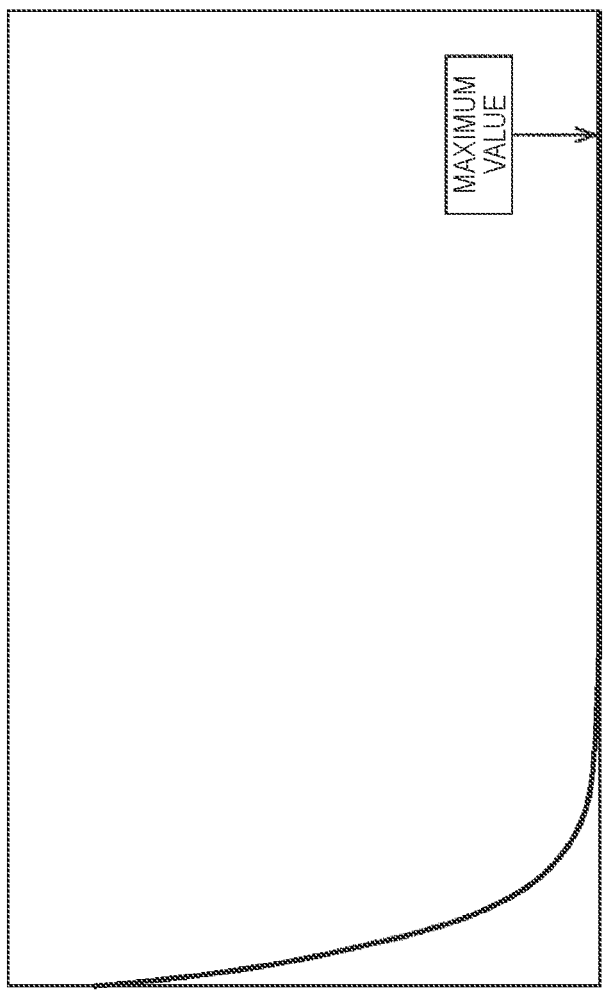
FIG. 13 is a diagram illustrating an example of an HIST (horizontal axis linear) of a musical piece produced in 1990.
Figure 14:
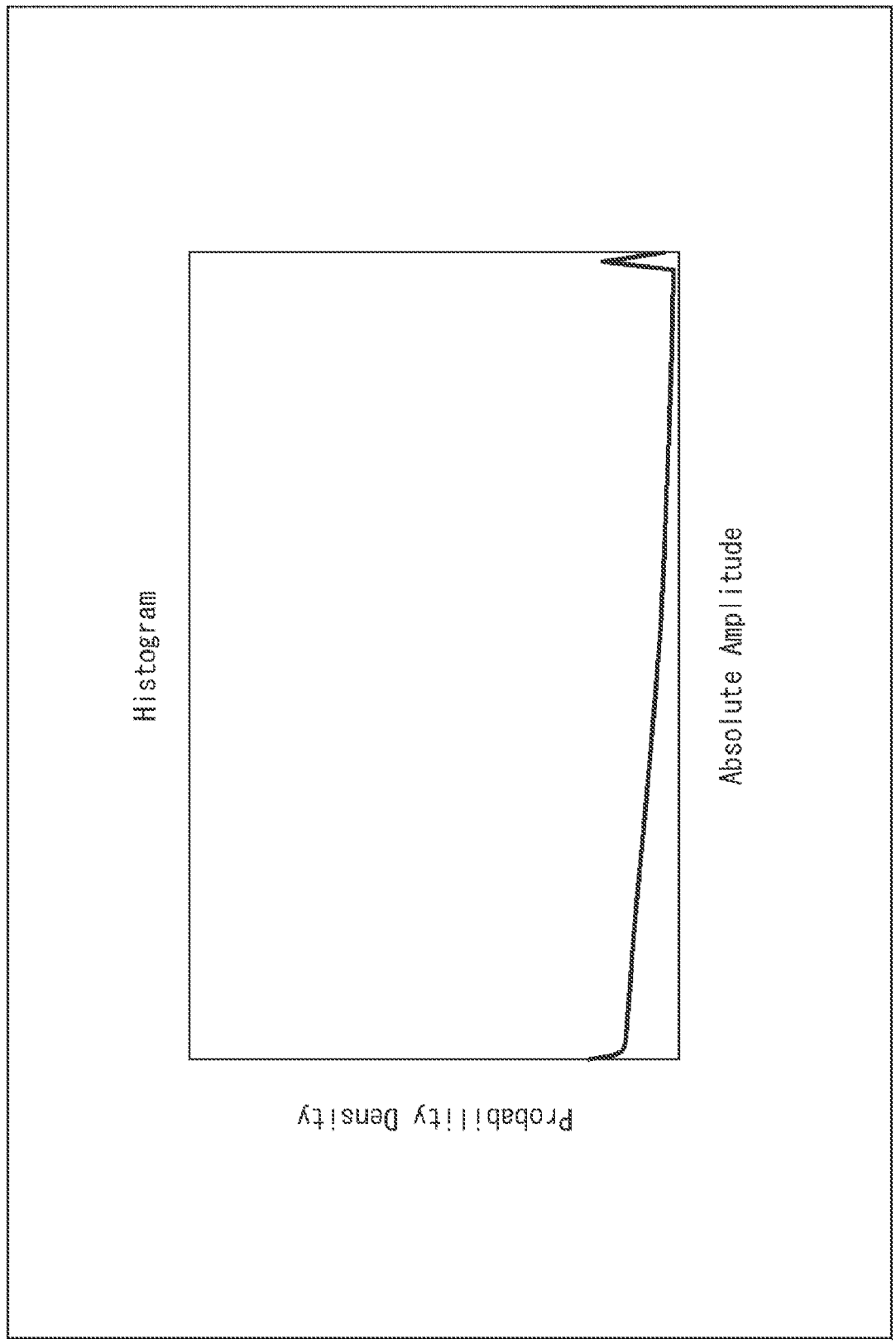
FIG. 14 is a diagram illustrating an example of an HIST (horizontal axis linear) of a musical piece produced in 2012.

Theoretically, if the limiter or compressor process is not performed, according to a central limit theorem, an amplitude distribution of a mixed waveform is considered to be able to approximate with a substantially normal distribution as the number of audio source elements (the number of audio source elements such as vocals, basses, drums, or the like) increases. For example, FIG. 13 illustrates a result of setting the horizontal axis of the HIST (FIG. 11C) of the musical piece A linearly and performing analysis. Further, FIG. 14 illustrates a result of setting the horizontal axis of the HIST (FIG. 12C) of the musical piece B linearly and performing analysis.

In the case of the musical piece A to which the limiter or compressor process is considered to be hardly applied, the HIST becomes a distribution close to the normal distribution except for a part near an amplitude absolute value 0 as illustrated in FIG. 13. Further, a maximum value of the amplitude absolute value of the musical piece A is at the position illustrated in FIG. 13. As described above, the musical piece to which the limiter or compressor process is not applied is very small in a frequency at which an amplitude near a peak is taken. On the other hand, in the case of the musical piece B, the waveform is saturated with a full scale value as illustrated in FIG. 14 due to excessive application of the limiter or compressor process.

Further, particularly, at the beginning stage of the CD release, mastering in which some of 16 bits corresponding to the number of quantization bits of a CD are used in any of musical pieces in an album (a peak value of the entire album musical piece is not normalized to 0 dBFS) was often seen. This is considered to have happened because restrictions on CD production environments at that time (digital audio workstation (DAW)) were not popular, the normalize process was unable to be performed easily, and there was a historical backdrop of mastering requirements (there was no need to recognize competing audio sources and increasing a sound volume excessively), but such a difference in the sound volume appears not only in the HIST but also in the PSD as parallel movement (variation) in the vertical axis direction.

In this regard, at the time of statistical analysis (cluster analysis) by the statistical analyzing unit 143 or at the time of calculation of the sound quality correction amount at the time of the reproduction process by the terminal device 103 to be described later, the variation of the PSD in the vertical axis direction caused by the difference in the sound volume is minimized by correction (normalization) in order to extract the sound quality-like feature from the PSD intensively.

<Normalization of PSD>

Figure 15:
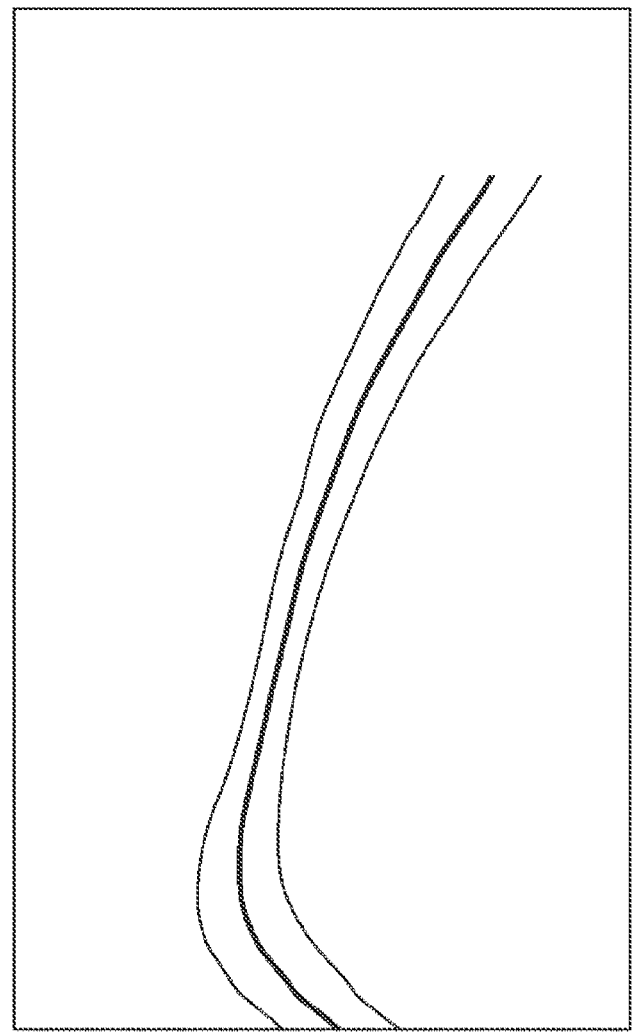
FIG. 15 is a diagram illustrating an example of a statistical process result in a case in which there is no normalization.
Figure 16:
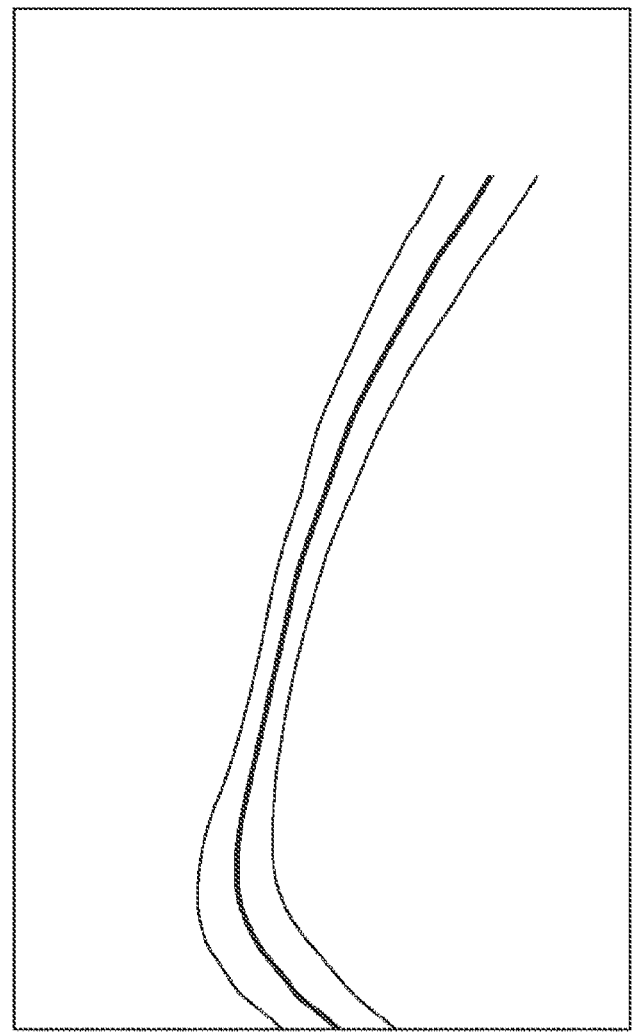
FIG. 16 is a diagram illustrating an example of a statistical process result of a PSD in a case in which normalization is performed with a maximum value (P=0.0).

FIG. 15 illustrates a result of performing the statistical analysis using information of the PSD without change on the popular music cluster. Further, FIG. 16 illustrates a result of detecting a clipping level (a level value of a bin with the highest index with a probability of occurrence density P=0.0 or more) as a reference level from the HIST of each musical piece for the same cluster and performing the statistical analysis after applying the normalization process in which the value is 0 dBFS to the PSD of each musical piece. In this result, since the standard deviation value of the PSD is somewhat decreased due to the addition of the normalization process, but there is no big change, it is understood that the effect of the normalization process (of extracting the sound quality-like features from the PSD intensively) is not sufficiently obtained in this normalization method.

This is because, in a case in which it is assumed that the amplitude value has a distribution close to the normal distribution, an appearance frequency of a sample having the clipping level is extremely low and is statistically unstable, and thus influence of the instability becomes a variation factor of the normalization process. In other words, in order to obtain the effect of the normalization process, it is necessary to perform the normalization at a reference level which has a certain appearance frequency or more and is statistically more stable than the clipping level instead of the clipping level.

Figure 17:
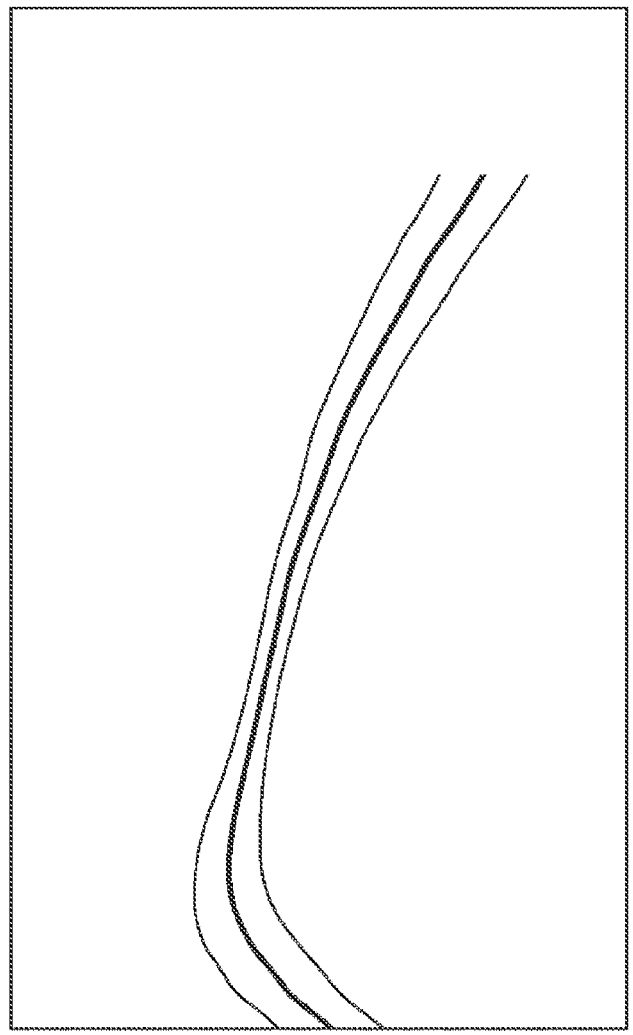
FIG. 17 is a diagram illustrating an example of a statistical process result of a PSD in a case in which normalization is performed with a maximum value (P=0.0001).
Figure 18:
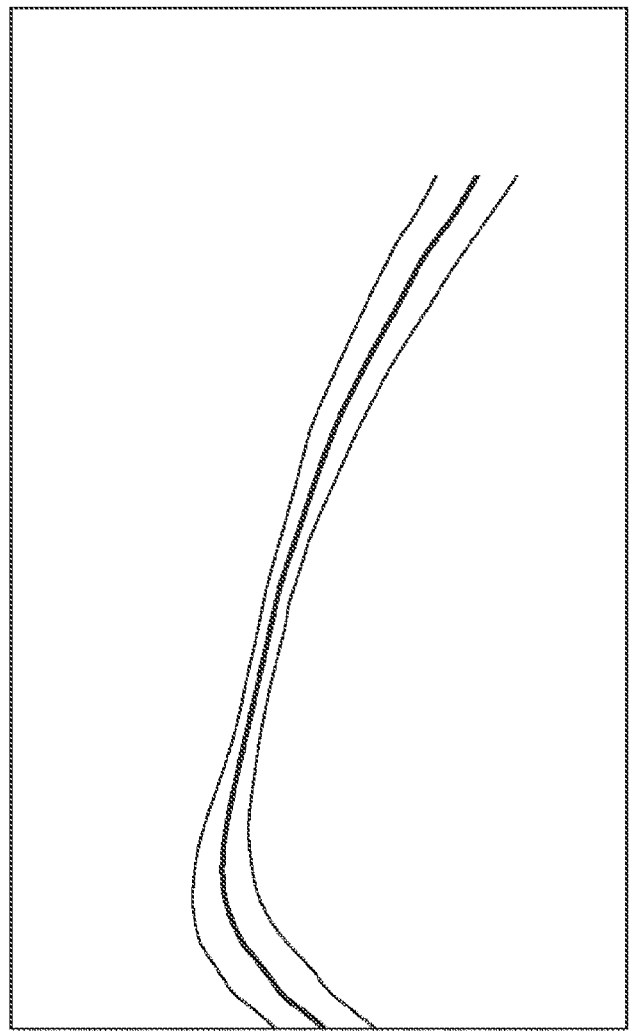
FIG. 18 is a diagram illustrating an example of a statistical process result of a PSD in a case in which normalization is performed with a maximum value (P=0.001).
Figure 19:
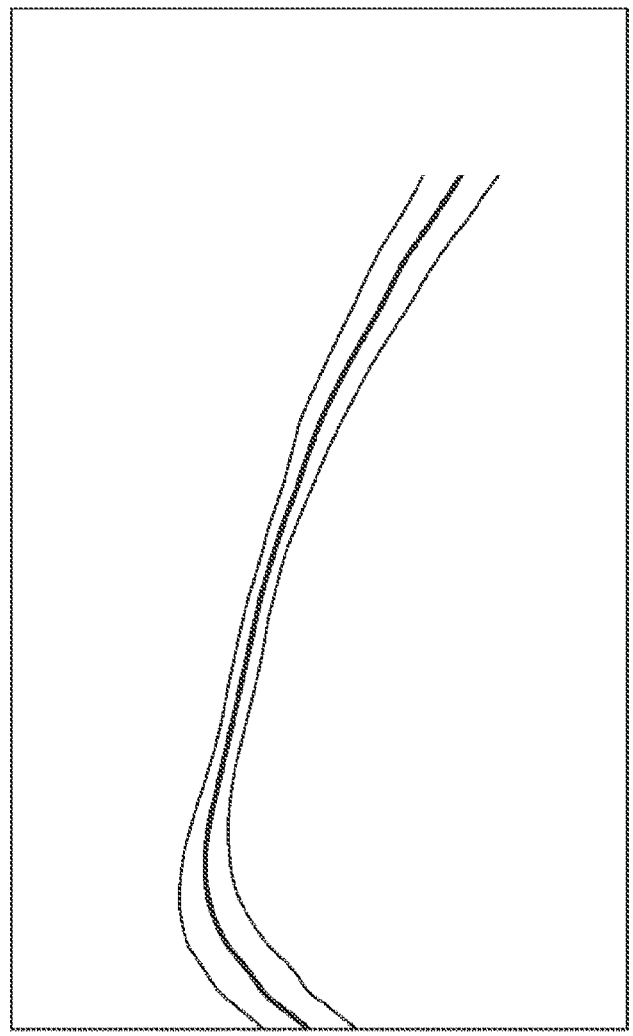
FIG. 19 is a diagram illustrating an example of a statistical process result of a PSD in a case in which normalization is performed with a maximum value (P=0.01).
Figure 20:
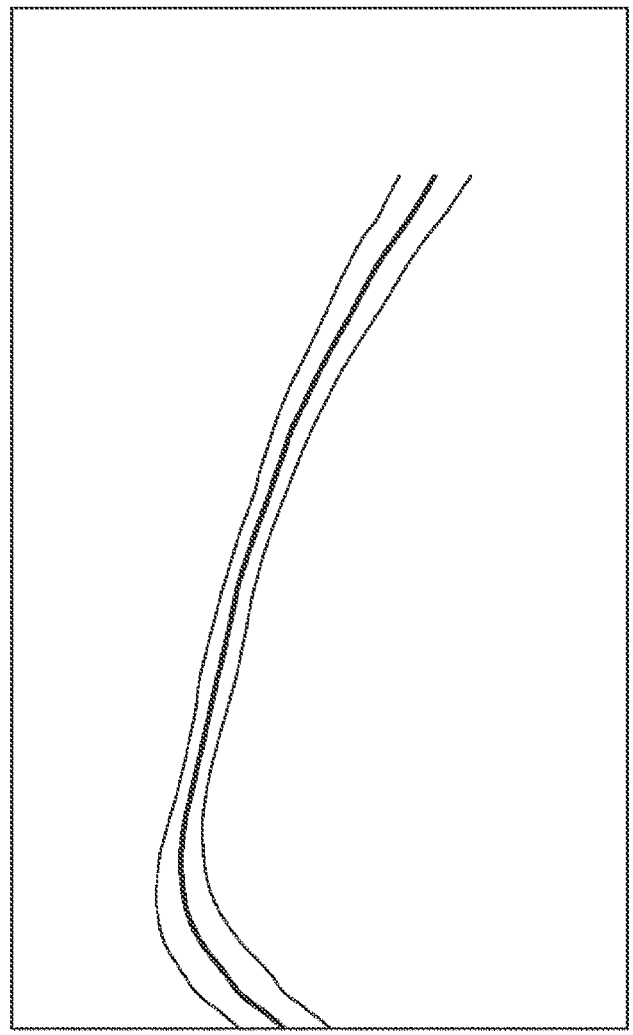
FIG. 20 is a diagram illustrating an example of a statistical process result of a PSD in a case in which normalization is performed with a maximum value (P=0.03).

Results of changing the method of detecting the reference level from the HIST of each musical piece from a "bin with the highest index at which the probability of occurrence density P is equal to or more than 0.0" of the clipping level to a "bin with the highest index which is equal to or more than a predetermined value of P=0.0 or more," detecting the reference level from the HIST, performing the normalization process of the PSD, and then performing the statistical analysis are illustrated in FIGS. 17 to 20. FIG. 17 is a diagram illustrating a result of performing the statistical analysis after normalization is performed with the maximum value (P=0.0001). FIG. 18 is a diagram illustrating a result of performing the statistical analysis after normalization is performed with the maximum value (P=0.001). FIG. 19 is a diagram illustrating a result of performing the statistical analysis after normalization is performed with the maximum value (P=0.01). FIG. 20 is a diagram illustrating the result of performing statistical analysis after normalization with the maximum value (P=0.03).

Figure 21:
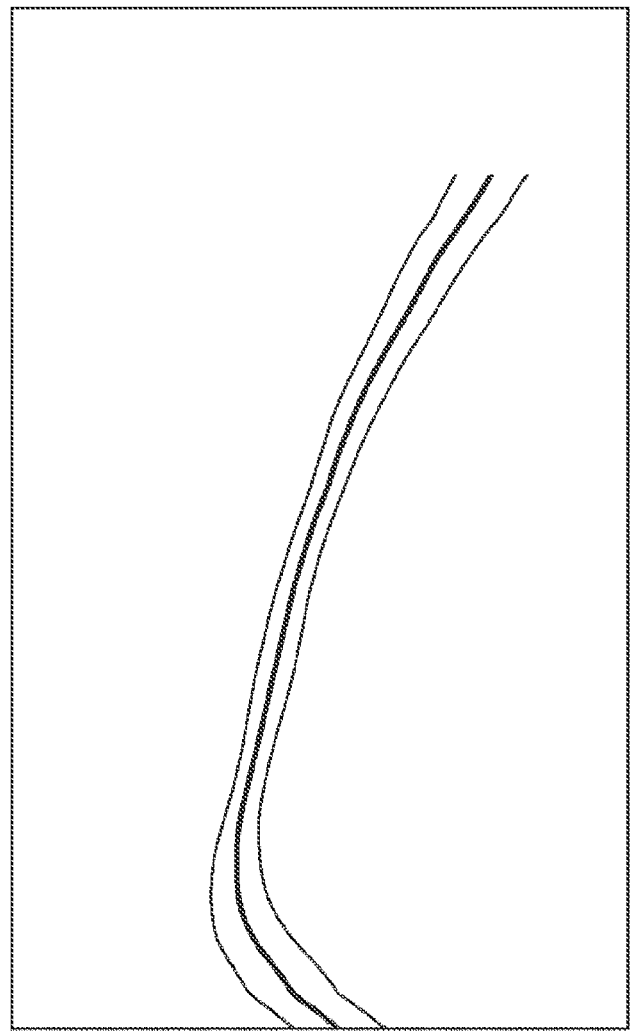
FIG. 21 is a diagram illustrating an example of a statistical process result of a PSD in a case in which normalization is performed with a mode value.
Figure 22:
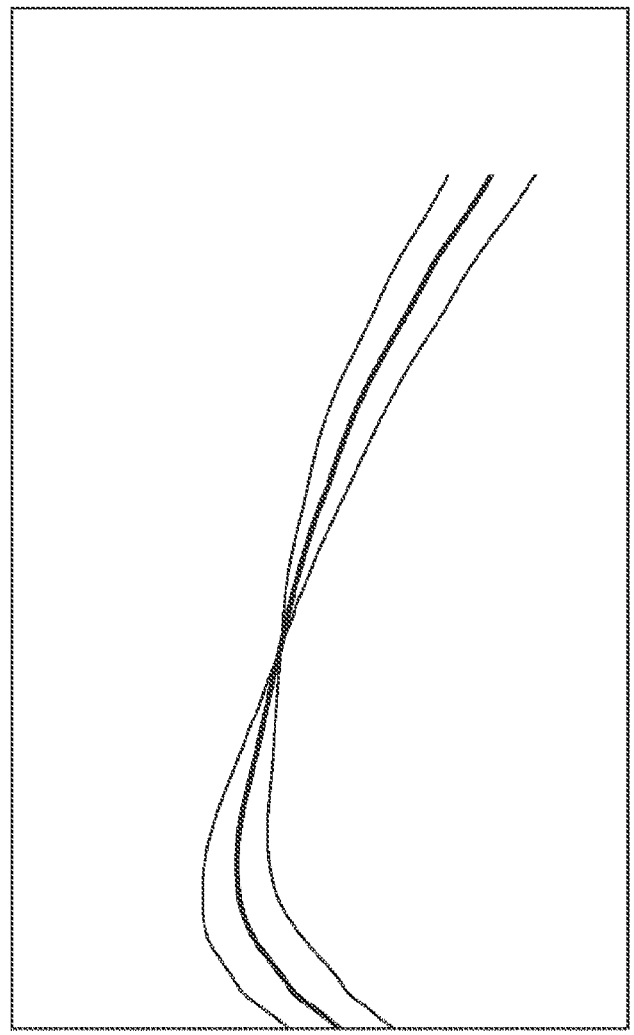
FIG. 22 is a diagram illustrating an example of a statistical process result of a PSD in a case in which normalization is performed with a value of 450 Hz.

Further, for comparison, a result of detecting a mode value (a "bin at which the probability of occurrence density is maximum") from information of the HIST of each musical piece, normalizing this value (the class value of the bin) into an "average value of the mode values of all the audio sources in the cluster," and performing the statistical analysis is illustrated in FIG. 21. Further, a result of normalizing a value of 450 Hz of each musical piece into an "average value of the values of 450 Hz of all the audio sources in the cluster" and performing the statistical analysis is illustrated in FIG. 22.

Figure 23:
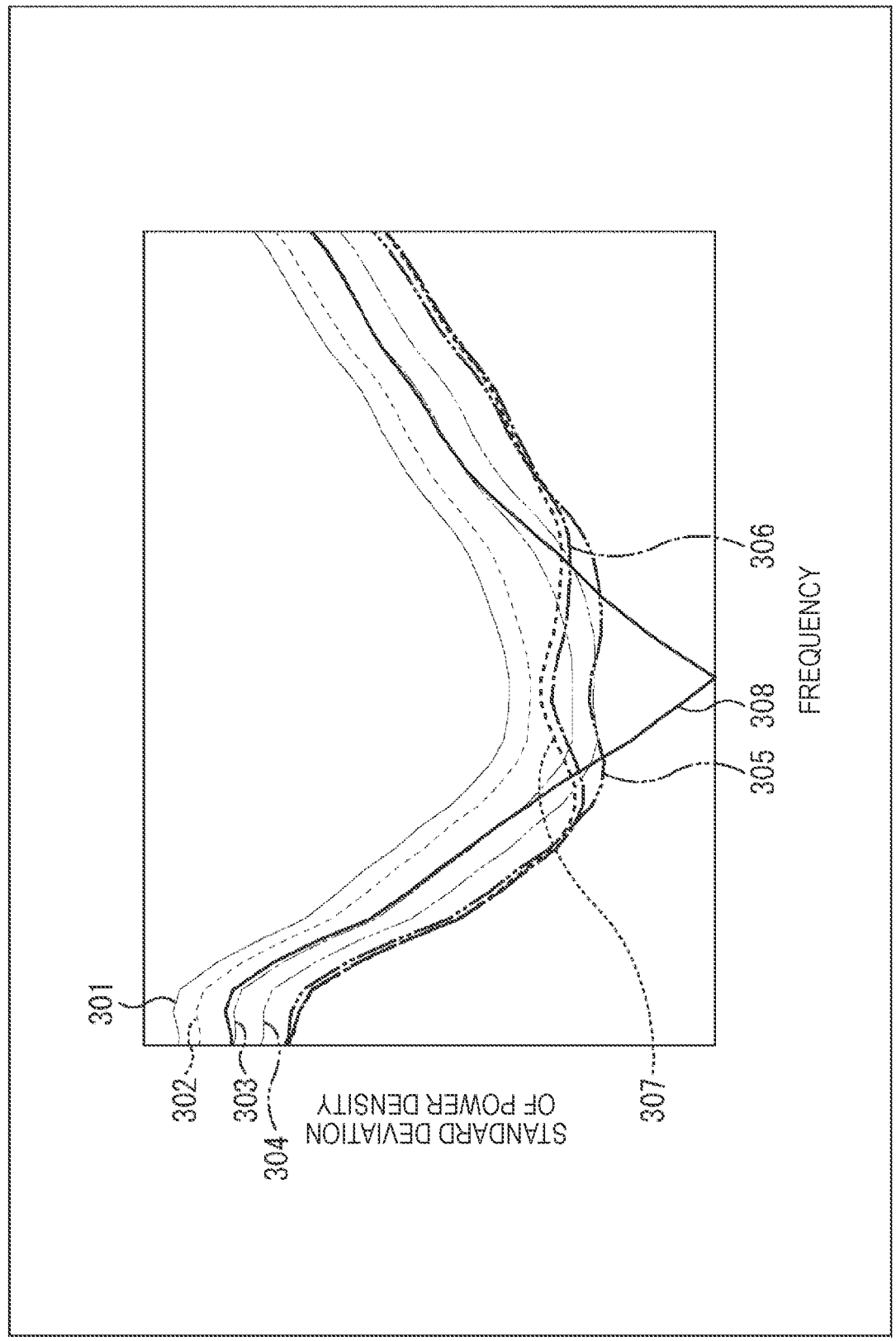
FIG. 23 is a diagram illustrating an example of a relationship between a PSD normalization method and a standard deviation value.

FIG. 23 illustrates a diagram obtained by extracting only standard deviation values of the PSD from these results and plotting them. In FIG. 23, a curve 301 is a curve indicating a standard deviation value of the result (FIG. 15) of performing the statistical analysis without normalizing the PSD. A curve 302 is a curve indicating a standard deviation value of the result (FIG. 16) of performing the statistical analysis after normalizing the PSD with the maximum value (P=0.0), that is, the clipping level. A curve 303 is a curve indicating a standard deviation value of the result (FIG. 17) of performing the statistical analysis after normalizing the PSD with the maximum value (P=0.0001). A curve 304 is a curve indicating a standard deviation value of the result (FIG. 18) of performing the statistical analysis after normalizing the PSD with the maximum value (P=0.001). A curve 305 is a curve indicating a standard deviation value of the result (FIG. 19) of performing the statistical analysis after normalizing the PSD with the maximum value (P=0.01). A curve 306 is a curve indicating a standard deviation value of the result (FIG. 20) of performing the statistical analysis after normalizing the PSD with the maximum value (P=0.03). A curve 307 is a curve indicating a standard deviation value of the result (FIG. 21) of performing the statistical analysis after normalizing the PSD with the mode value. A curve 308 is a curve indicating a standard deviation value of the result (FIG. 22) of performing the statistical analysis after normalizing the PSD with the value of 450 Hz.

It can be understood from the graph of FIG. 23 that, "in a case in which the maximum value is detected from HIST of each musical piece with a threshold value of the probability of occurrence density P=0.01, and the PSD is corrected on the basis of this value," the standard deviation is decreased over the entire frequency of the PSD (influence of a recording level can be most removed from the PSD). Therefore, in this case, it is possible to further suppress the variation in the PSD in the vertical axis direction by "detecting the maximum value from the HIST of each musical piece with the threshold value of the probability of occurrence density P=0.01, and correcting the PSD on the basis of this value." For example, the normalizing unit 142 described above performs the normalization of the PSD by this method for the statistical analysis.

Further, this is only an example, and the value used for the normalization of the PSD may be any value. For example, it may be a value obtained from the HIST as illustrated in FIG.

Figure 24:
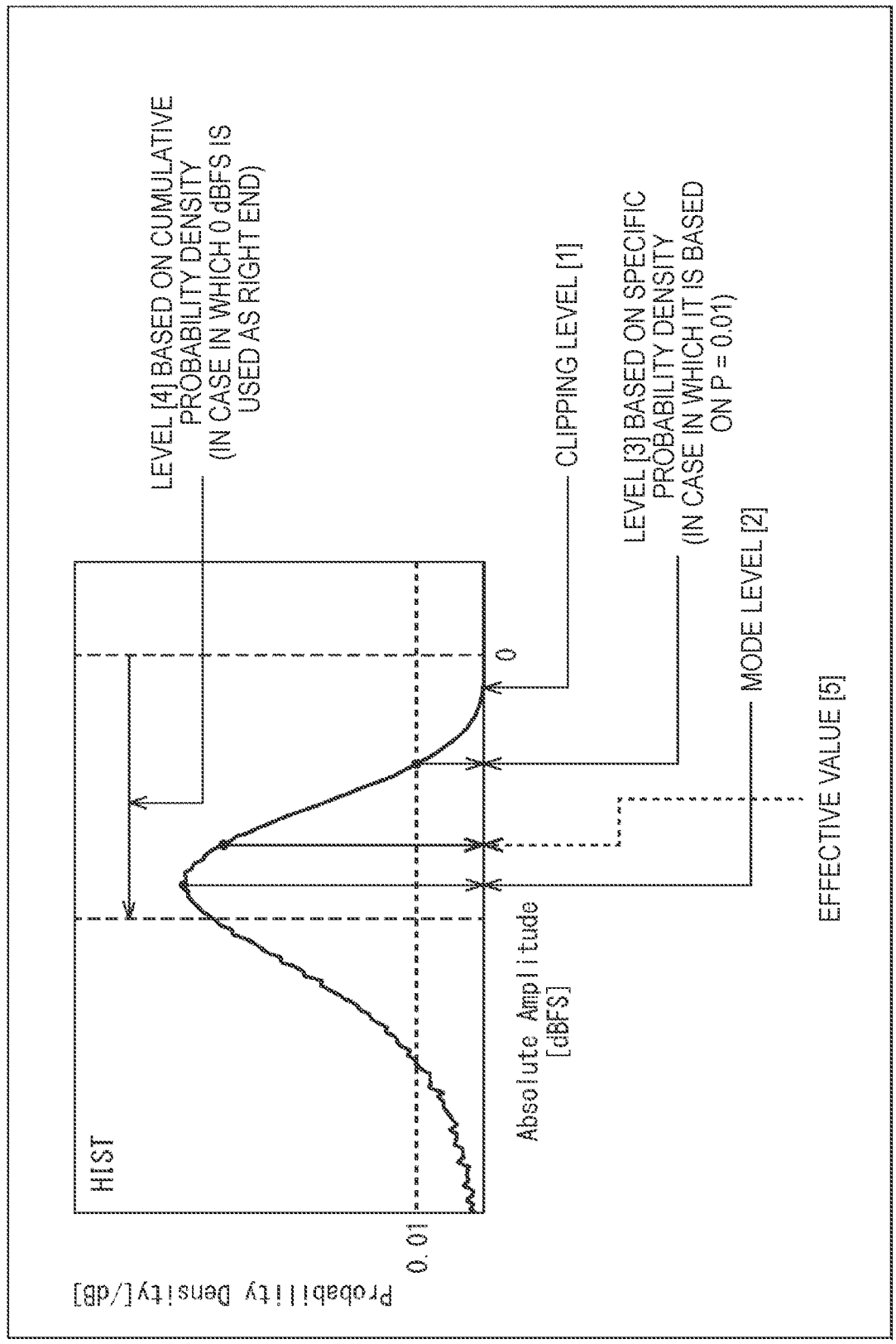
FIG. 24 is a diagram illustrating an example of parameters used for PSD normalization.
Figure 25:
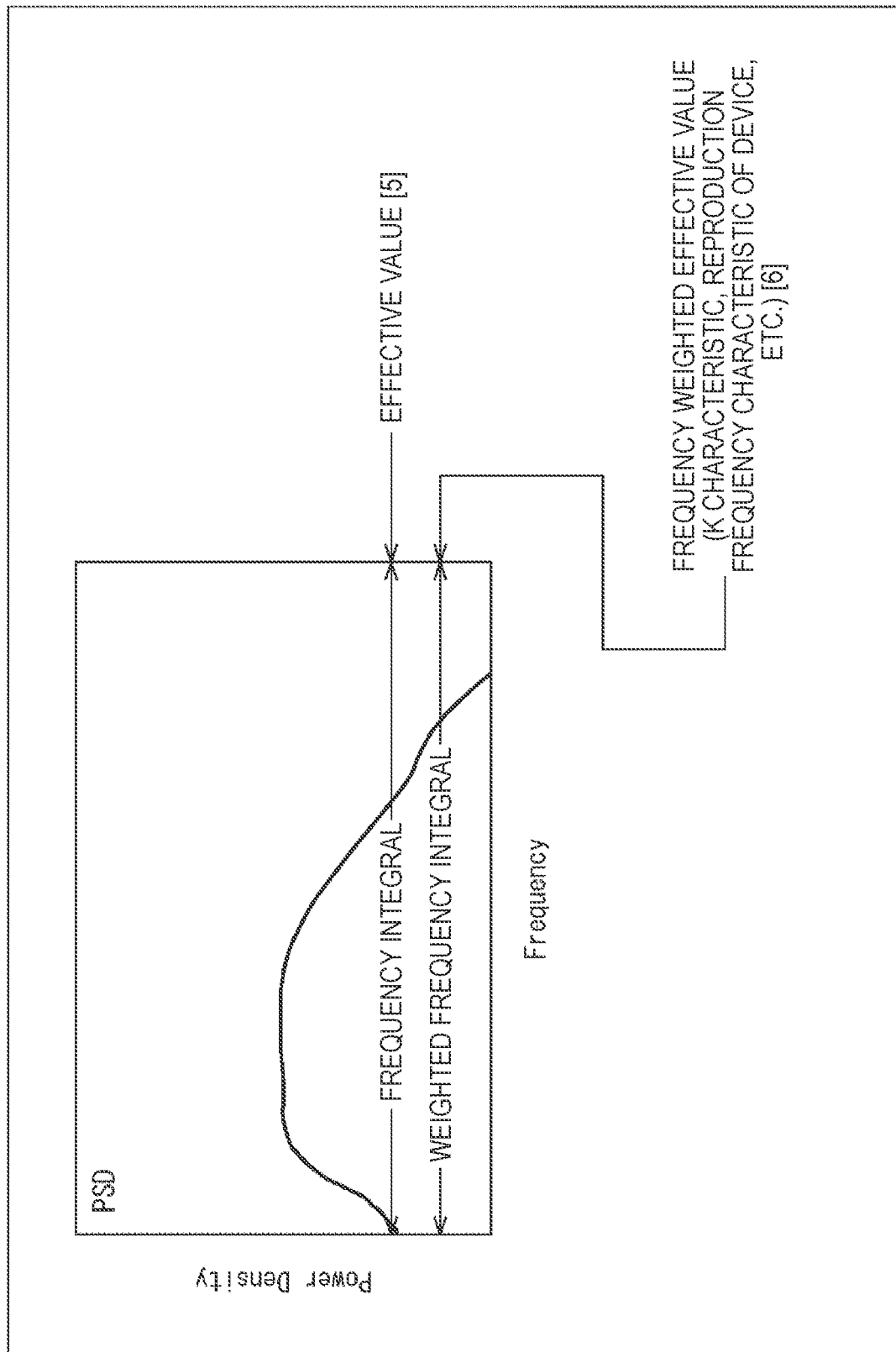
FIG. 25 is a diagram illustrating an example of parameters used for PSD normalization.

24, or may be a value obtained from the PSD as illustrated in FIG. 25. For example, it may be the maximum value of the HIST (a clipping level [1] in FIG. 24) or the mode value of the HIST (a mode level [2] in FIG. 24), may be a value at which the HIST has a specific probability density (a level [3] based on a specific probability density in FIG. 24 (in a case in which it is based on P=0.01)), may be a value at which a cumulative probability density of the HIST has a specific value (a level [4] based on a cumulative probability density of FIG. 24 (in a case in which 0 dBFS is used as a right end), may be an effective value in which a frequency integral value of the PSD is an input signal (an effective value [5] of FIGS. 24 and 25), or may be an effective value after a prefilter process in which a frequency weighted integral value of the PSD is an input signal (a frequency weighted effective value [6] of FIG. 25 (the K characteristic, a reproduction frequency characteristic of a device, or the like)). Further, it may be a value of a function having a plurality of values described above as an input, a table reference value, or the like. It is possible to extract the sound quality-like feature from the PSD further intensively by normalizing the PSD on the basis of a reference value in which is higher in a correlation value with the sound volume feeling (loudness) and higher in statistical stability.

<Flow of Target Data Registration Process>

Next, a process executed by the target data providing server 101 (FIG. 1) will be described. First, an example of a flow of a target data registration process executed when the target data providing server 101 generates the target data and registers the target data in the database will be described with reference to a flowchart of FIG. 26.

If the target data registration process is started, in step S101, the audio source analyzing unit 141 (FIG. 3) executes the audio source analysis process and analyzes the audio source file (audio signal) of the processing target. The audio source analyzing unit 141 executes the audio source analysis process on each audio source file (each audio signal) belonging to the processing target cluster. Further, the audio source analysis process will be described later in detail.

In step S102, the normalizing unit 142 executes the normalization process and normalizes the analysis result obtained in the process of step S101. The normalizing unit 142 executes the normalization process on the analysis result of each audio source file (each audio signal) belonging to the processing target cluster. Further, the normalization process will be described later in detail.

In step S103, the statistical analyzing unit 143 executes the statistical analysis process and obtains the statistical value of the analysis result normalized in the process of step S102. The statistical analyzing unit 143 executes the statistical analysis process on the analysis results of all the audio source files (all the audio signals) belonging to the processing target cluster and calculates the statistical value (that is, the target data) of the analysis result of the processing target cluster. Further, the statistical analysis process will be described later in detail.

In step S104, the target data database 144 registers and manages the target data obtained in the process of step S103.

If the process of step S104 ends, the target data registration process ends.

By executing the target data registration process as described above, the target data providing server 101 can more easily generate and manage more useful target data. In other words, the target data providing server 101 can more easily provide more useful target data. Accordingly, the terminal device 103 can obtain the sound volume correction effect more suitable for the auditory sensation.

<Flow of Audio Source Analysis Process>

Next, an example of a flow of the audio source analysis process executed in step S101 of FIG. 26 will be described with reference to a flowchart of FIG. 27.

If the audio source analysis process is started, in step S121, the sample value acquiring unit 151 (FIG. 4) acquires the sample value of the audio signal 150 of the audio source file of the processing target. In a case in which the audio signal 150 is an analog signal, the sample value acquiring unit 151 samples the audio signal 150 and generates the sample value. Further, in a case in which the audio signal 150 is a digital signal, the sample value acquiring unit 151 acquires a signal level of the audio signal 150 as the sample value.

In step S122, the power spectrum density calculating unit 152 calculates the power spectrum density for each measurement block using the sample value acquired in step S121.

In step S123, the absolute value histogram generating unit 153 generates the absolute value histogram of the sample value for each measurement block using the sample value acquired in step S121.

In step S124, the adding unit 161 and the dividing unit 162 calculate the average (I_PSD(i)) of the power spectrum densities of one entire musical piece by adding the power spectrum densities of the respective measurement blocks calculated in step S122 and divide an addition result by the number of measurement blocks. Further, the frequency smoothing unit 163 smooths the average (I_PSD(i)) of the power spectrum densities of one entire musical piece in the frequency direction.

In step S125, the decimation-in-frequency processing unit 164 performs the decimation-in-frequency process of decimating the frequency of the average (I_PSD(i)) of the power spectrum densities of one entire musical piece.

In step S126, the adding unit 161 and the dividing unit 165 converts the absolute value histogram into the probability of occurrence density function (that is, the histogram (I_HIST (m)) of the absolute value of the sample of one entire musical piece) by adding the absolute value histogram of each measurement block generated in step S123 for each sample absolute value bin and dividing an addition result by the number of measurement samples for each sample absolute value bin.

In step S127, the audio source analyzing unit 141 associates the average of the power spectrum densities of one entire musical piece and the absolute value histogram (the probability of occurrence density function) of one entire musical piece with the audio source file 171 as the metadata.

Figure 26:
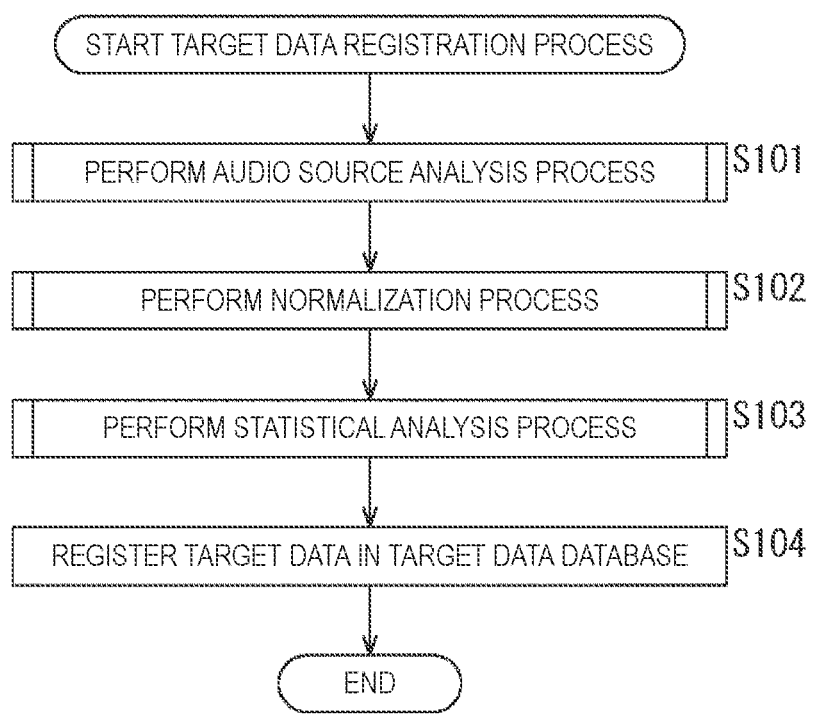
FIG. 26 is a flowchart illustrating an example of a flow of a target data registration process.
Figure 27:
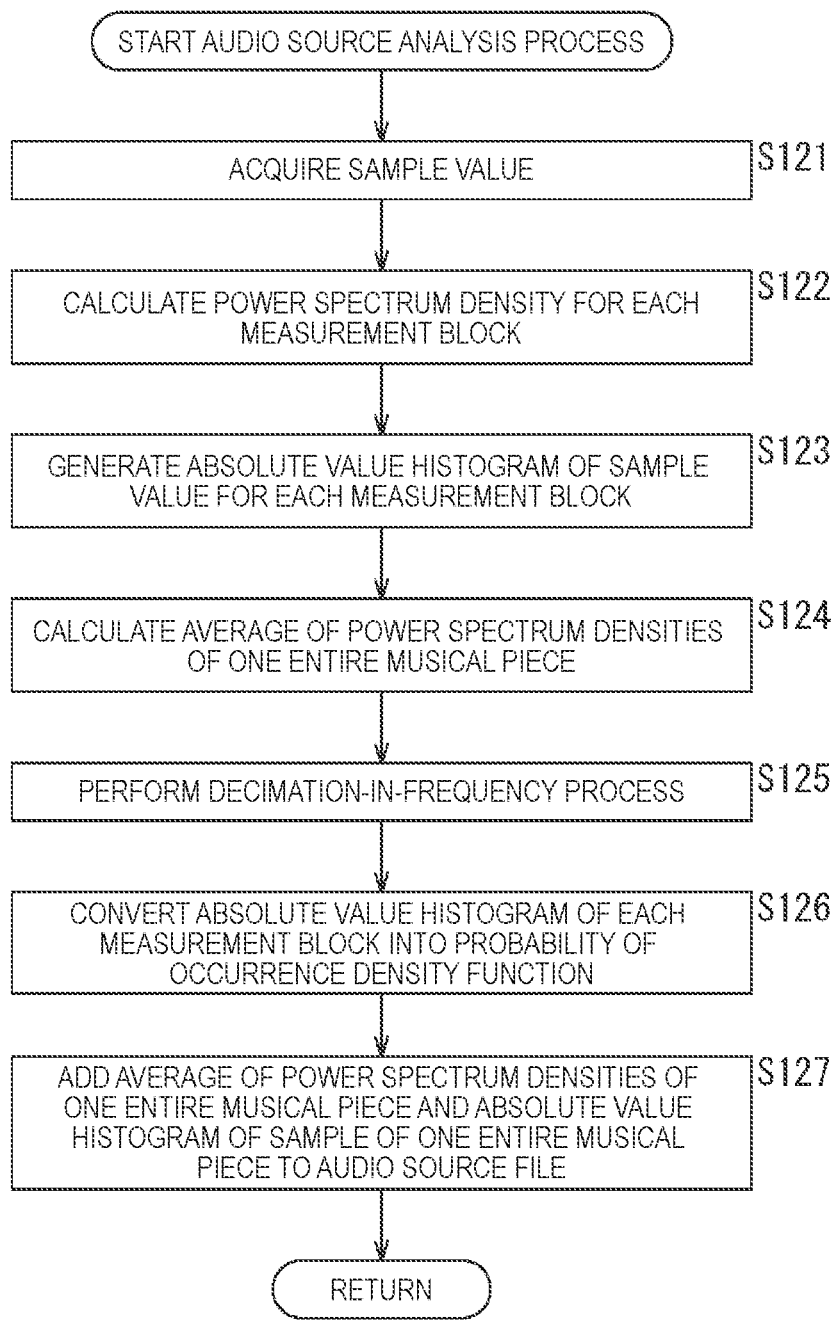
FIG. 27 is a flowchart for explaining an example of a flow of an audio source analysis process.

If the process of step S127 ends, the audio source analysis process ends, and the process returns to FIG. 26.

By performing the audio source analysis process as described above, it is possible to obtain the audio source analysis result (the power spectrum density or the absolute value histogram) more easily and effectively. In other words, the audio source analysis result (power spectrum density and absolute value histogram) can be used more easily and effectively for the sound volume correction or the sound quality correction. Accordingly, the terminal device 103 can obtain the sound volume correction effect more suitable for the auditory sensation.

<Flow of Normalization Process>

Figure 28:
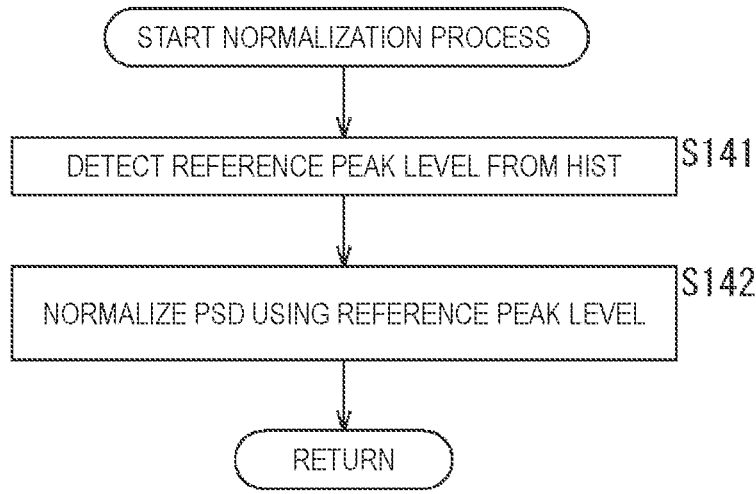
FIG. 28 is a flowchart illustrating an example of a flow of a normalization process.

Next, an example of a flow of the normalization process executed in step S102 of FIG. 26 will be described with reference to a flowchart of FIG. 28.

If the normalization process is started, in step S141, the reference peak level detecting unit 181 (FIG. 5) detects the reference peak level (IPL) of the processing target audio source from the absolute value histogram (HIST) obtained in the audio source analysis process (step S101 in FIG. 26). In step S142, the normalization processing unit 182 normalizes the PSD using the reference peak level.

If the process of step S142 ends, the normalization process ends, and the process returns to FIG. 26.

By performing the normalization process as described above, the variation in the vertical axis direction caused by the difference in the sound volume of the PSD can be suppressed. Therefore, the sound quality-like feature can be extracted from the PSD more intensively.

<Flow of Statistical Analysis Process>

Figure 29:
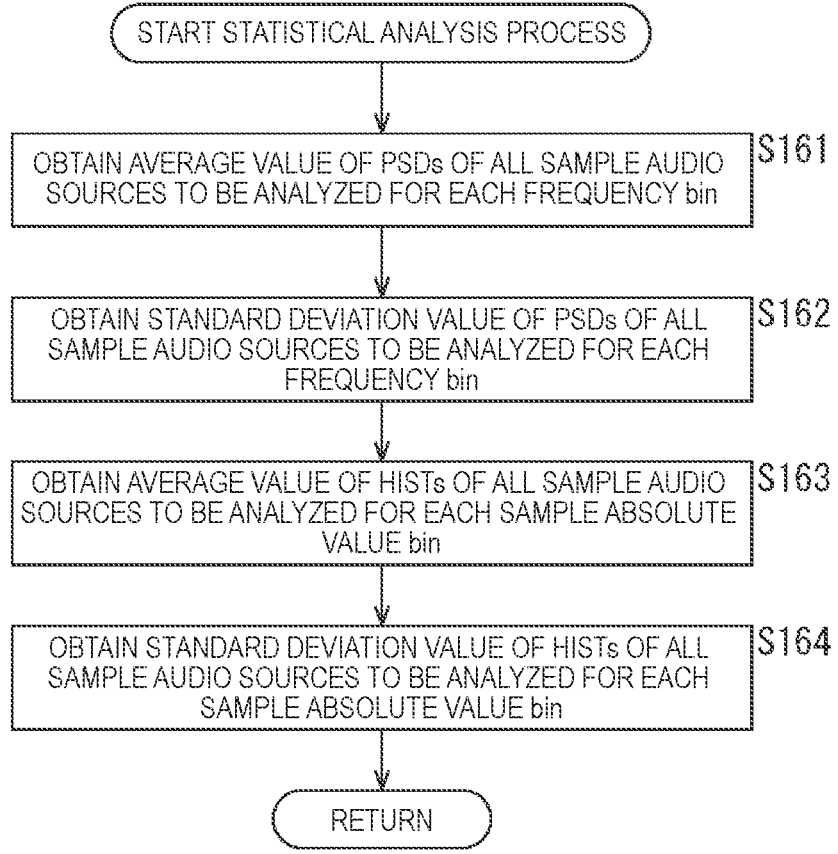
FIG. 29 is a flowchart illustrating an example of a flow of a statistical analysis process.

Next, an example of a flow of the statistical analysis process executed in step S103 of FIG. 26 will be described with reference to a flowchart of FIG. 29.

If the statistical analysis process is started, in step S161, the PSD average value calculating unit 191 (FIG. 6) obtains the average value of the PSDs of all the sample audio sources to be analyzed by adding I_PSD(i) of all the audio sources for each frequency bin and dividing an addition result by the number of audio sources n for each frequency bin. In step S162, the PSD standard deviation calculating unit 192 (FIG. 6) obtains the standard deviation value of the PSDs of all the sample audio sources to be analyzed by dividing I_PSD(i) by the value of T_PSD_A(i) for each frequency bin, squaring the division result for each frequency bin, adding the square results of all the audio sources for each bin, and dividing an addition result by the audio source number n for each frequency bin.

In step S163, the HIST average value calculating unit 193 (FIG. 6) obtains the average value of the HISTs of all the sample audio sources to be analyzed by adding I_HIST(m) of all the audio sources for each sample absolute value bin and dividing an addition result by the number of audio sources n for each sample absolute value bin. In step S164, the HIST standard deviation calculating unit 194 (FIG. 6) obtains the standard deviation value of the HISTs of all the sample audio sources to be analyzed by dividing I_HIST(m) by the value of T_HIST_A(m) for each sample absolute value bin, squaring a division result for each sample absolute value bin, adding squaring results of all the audio sources for each sample absolute value bin, and dividing an addition result by the number of audio sources n for each sample absolute value bin.

If the process of step S164 ends, the statistical analysis process ends, and the process returns to FIG. 26.

By performing the statistical analysis process as described above, it is possible to acquire the statistical information of the cluster (for example, the average value and the standard deviation value of the PSD or the average value and the standard deviation value of the HIST) more easily and effectively. Therefore, it is possible to use the statistical information for the sound volume correction or the sound quality correction more easily and effectively. Accordingly, the terminal device 103 can obtain the sound volume correction effect more suitable for the auditory sensation.

<Others>

Further, it is sufficient to perform the generation of the target data and the registration of the target data in the database before the reproduction to be reproduced audio source file. Further, an instruction to start execution of the process or the like may be given by the listener or may be performed by a third party other than the listener, by another process or the like.

Further, the process related to the generation of the target data and the registration of the target data in the database may be performed by the target data providing server 101 or may be performed by another device. For example, the terminal device 103 may execute the process related to the generation of target data and the registration of the target data in a database. Of course, devices other than the target data providing server 101 and the terminal device 103 may perform the process. Further, a plurality of devices (for example, the target data providing server 101 and the terminal device 103 or the like) may execute the process in cooperation with each other.

Further, the target data database 144 may be formed in the target data providing server 101, may be formed in the terminal device 103, or may be formed in any other information processing device. In other words, the target data may be managed by an arbitrary device. In a case in which the target data is managed by the terminal device 103 which is the reproducing device, since the target data is unique information depending on the reproducing device, the target data may be optimized (adjusted) as information depending on the reproducing device.

Further, the target data may be added to the tag information to be reproduced audio source file or the like.

Further, in the above example, the PSD and the HIST are obtained as the audio source analysis results, but other information may be included in the audio source analysis result. In other words, statistical information related to the analysis result other than the PSD and the HIST may be included in the target data. Further, statistical information other than the average value and the average value±the standard deviation of the PSD and the HIST may be included in the target data.

<Reproduction, Sound Volume Correction, and Sound Quality Correction>

<Physical Configuration of Terminal Device>

Figure 30:
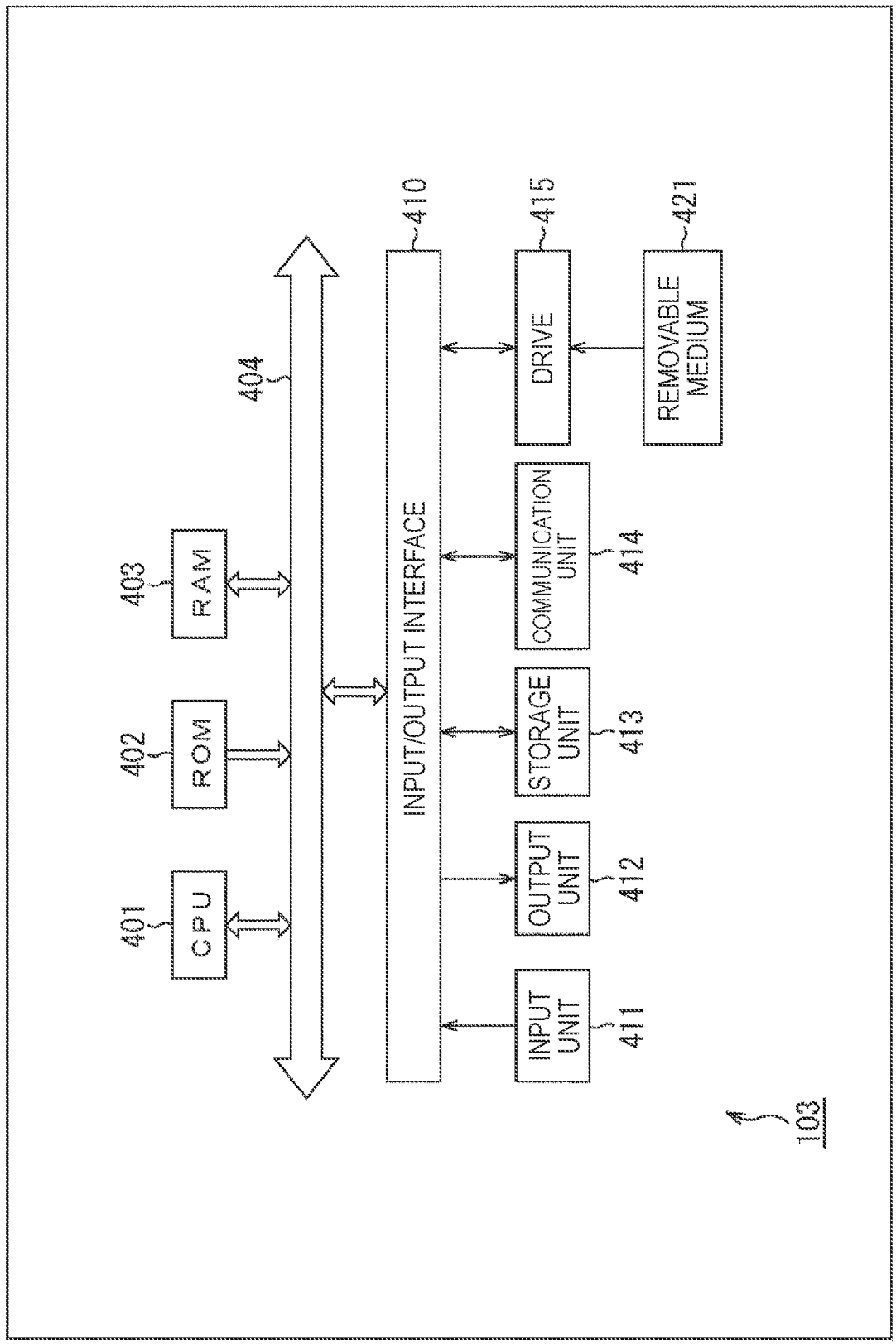
FIG. 30 is a block diagram illustrating a main configuration example of a terminal device.

Next, the reproduction of the audio source file (audio signal) and the sound volume correction/sound quality correction at that time will be described. FIG. 30 is a block diagram illustrating a main configuration example of a reproducing device 103 that performs the processes. As illustrated in FIG. 30, the terminal device 103 includes a CPU 401, a ROM 402, and a RAM 403 which are connected to one another via a bus 404.

An input/output interface 410 is also connected to a bus 404. An input unit 411, an output unit 412, a storage unit 413, a communication unit 414, and a drive 415 are connected to the input/output interface 410.

The input unit 411 includes an arbitrary input device such as, for example, a keyboard, a mouse, a touch panel, an image sensor, a microphone, a switch, an input terminal, or the like. Further, the input unit 411 includes an arbitrary sensor such as, for example, an acceleration sensor. The output unit 412 includes an arbitrary output device such as, for example, a display, a speaker, or an output terminal. The storage unit 413 includes an arbitrary storage medium such as, for example, a non-volatile memory such as a hard disk, a RAM disk, a SSD, or a USB memory. The communication unit 414 includes a wired and/or wireless communication interface of an arbitrary communication standard such as, for example, Ethernet (registered trademark), Bluetooth (registered trademark), USB, HDMI (registered trademark), or IrDA. The drive 415 drives a removable medium 421 having an arbitrary storage medium such as a magnetic disk, an optical disc, a magneto-optical disc, or a semiconductor memory which is loaded onto the drive 415.

In the terminal device 103 configured as described above, for example, functions to be described later are realized by loading a program stored in the storage unit 413 onto the RAM 403 via the input/output interface 410 and the bus 404 and executing the program by the CPU 401. Further, data or the like necessary for the CPU 401 to execute various types of processes is stored in the RAM 403 as appropriate.

The program executed by the CPU 401 can be recorded in the removable medium 421 serving as, for example, a package media or the like and applied. In this case, the removable medium 421 is loaded onto the drive 415, and then the program can be installed in the storage unit 413 via the input/output interface 410. Further, the program can also be provided via a wired or wireless transmission medium such as a local area network, the Internet, or digital satellite broadcasting. In this case, the program can be received by the communication unit 414 and installed in the storage unit 413. In addition, this program can be installed in the ROM 402 or the storage unit 413 in advance.

<Functional Configuration of Terminal Device>

Figure 31:
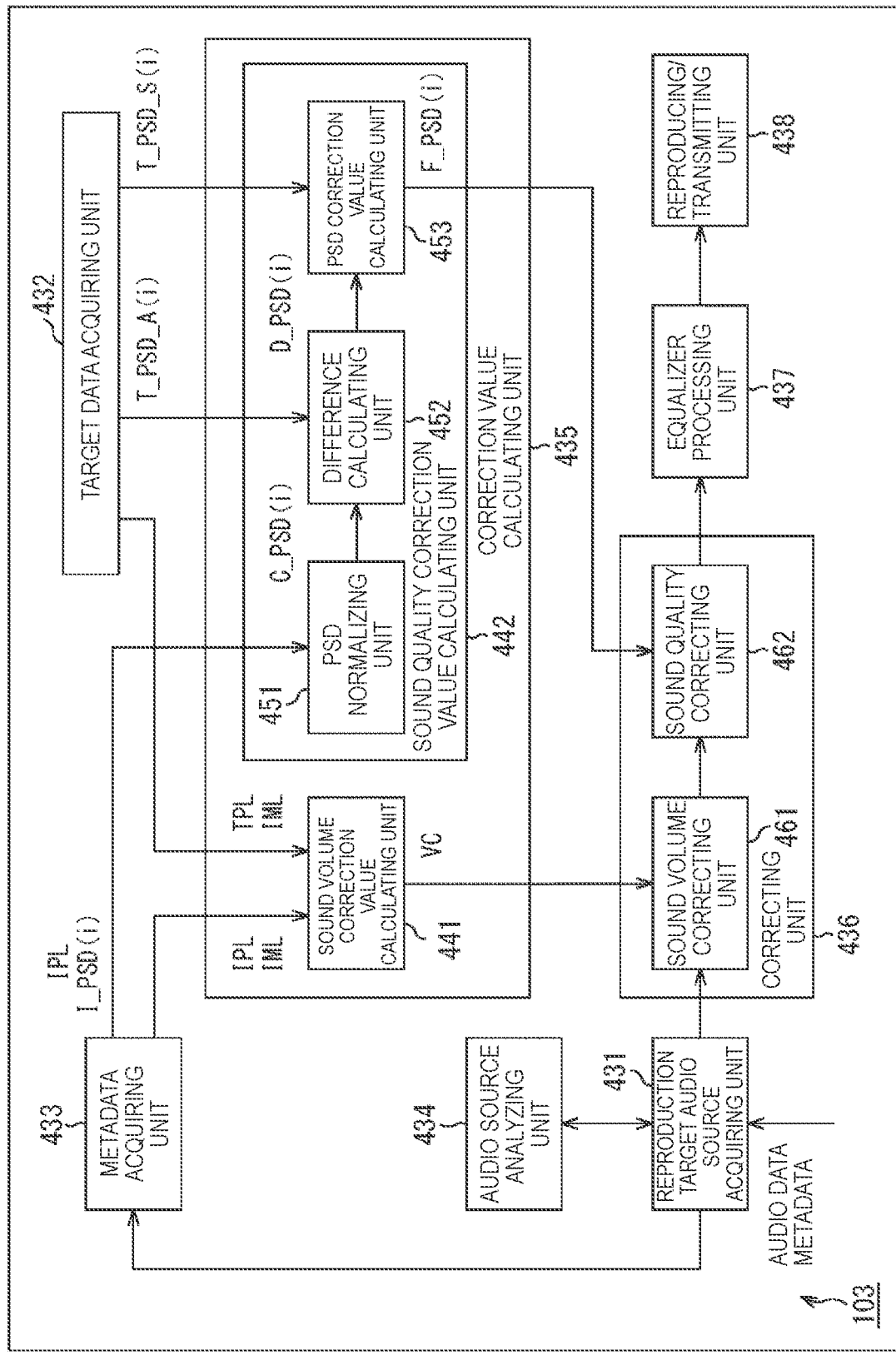
FIG. 31 is a functional block diagram illustrating a main function example of a terminal device.

FIG. 31 is a functional block diagram illustrating an example of main functions realized by the terminal device 103. As illustrated in FIG. 31, the terminal device 103 includes a reproduction target audio source acquiring unit 431, a target data acquiring unit 432, a metadata acquiring unit 433, an audio source analyzing unit 434, a correction value calculating unit 435, a correcting unit 436, an equalizer processing unit 437, and a reproducing/transmitting unit 438 as functional blocks.

The reproduction target audio source acquiring unit 431 performs the process related to the acquisition of the audio source file (audio signal) to be reproduced or the metadata thereof. For example, the reproduction target audio source acquiring unit 431 acquires the audio source file designated to be reproduced. A storage location (acquisition source) of the audio source file is arbitrary. An audio source file stored in the terminal device 103 may be acquired or an audio source file stored in another device may be acquired.

Further, in a case in which the metadata is associated with the audio source file, the reproduction target audio source acquiring unit 431 also acquires the metadata. For example, in a case in which the metadata is added to the audio source file (the metadata is embedded in the audio source file) or in a case in which the metadata is linked with the audio source file (the audio source file and the metadata are different pieces of data), the reproduction target audio source acquiring unit 431 also acquires the metadata. In a case in which the audio source file and the metadata thereof are linked, a storage location (acquisition source) of the metadata is arbitrary. For example, the reproduction target audio source acquiring unit 431 may acquire the metadata from the same location as the audio source file (for example, from the same storage area, the same device, or the like) or may acquire the metadata at a location different from the audio source file (for example, a different storage area, a different device, or the like).

Further, in a case in which the metadata is not associated with the audio source file, the reproduction target audio source acquiring unit 431 acquires the audio source file. Then, in this case, the reproduction target audio source acquiring unit 431 may supply the audio source file to the audio source analyzing unit 434 and cause the audio source analyzing unit 434 to analyze the audio source file and generate the metadata corresponding to the audio source file.

Further, for example, the average (I_PSD(i)) of the power spectrum densities of one entire musical piece and the histogram (I_HIST(m)) of the absolute value of the sample of one entire musical piece ("i" indicates the index of frequency, and "m" indicates the index of the sample absolute value bin) are included in the metadata.

The reproduction target audio source acquiring unit 431 supplies the metadata of the audio source file to be reproduced to the metadata acquiring unit 433. Further, the reproduction target audio source acquiring unit 431 supplies the audio source file to be reproduced to the correcting unit 436.

The target data acquiring unit 432 performs the process related to the acquisition of the target data. For example, the target data acquiring unit 432 acquires the target data of the cluster corresponding to the audio source file to be reproduced. For example, the target data acquiring unit 432 acquires the target data from the target data providing server 101 via the network 102. For example, the target data acquiring unit 432 supplies a request for the target data of the cluster including information designating the cluster corresponding to the audio source file to be reproduced to the target data providing server 101 via the network 102. The target data providing server 101 searches for the requested target data of the cluster from the target data managed by the target data database 144. In a case in which there is the requested target data, the target data providing server 101 supplies the target data to the terminal device 103 via the network 102. In a case in which there is no requested target data, the target data providing server 101 gives a notification indicating that there is no requested target data to the terminal device 103 via that network 102.

A storage location (acquisition source) of the target data is arbitrary, and the target data may be acquired from a location other than the target data providing server 101 such as the storage unit 413 of the terminal device 103, another device, or another server. For example, in a case in which the requested target data is not obtained from the target data providing server 101, the target data acquiring unit 432 may acquire (search for or request) the target data from another location (for example, the storage unit 413 of the terminal device 103, another device, another server, or the like).

Further, for example, the average value (T_PSD_A(i)) of the power spectrum densities of all the audio sources in the target cluster, the standard deviation value (T_PSD_S(i)) of the power spectrum densities of all the audio sources in the target cluster, the average value (T_HIST_A(m)) of the histograms of the absolute values of the sample values of all the audio sources in the target cluster, and the standard deviation value (T_HIST_S(m)) of the histograms of the sample absolute values of all the audio source files in the target cluster ("i" indicates the index of frequency, and "m" indicates the index of the sample absolute value bin) are included in the target data.

The metadata acquiring unit 433 acquires the metadata of the audio source file to be reproduced from the reproduction target audio source acquiring unit 431. The audio source analyzing unit 434 is an embodiment of a metadata generating unit to which the present technology is applied, and performs an audio source analysis process on the audio source file (audio signal) to be reproduced supplied from the reproduction target audio source acquiring unit 431 and generates the metadata. The audio source analysis process is a process similar to the audio source analysis process (FIG. 27) performed by the audio source analyzing unit 141 (FIG. 3, FIG. 4) of the target data providing server 101. The audio source analyzing unit 434 supplies the generated metadata to the reproduction target audio source acquiring unit 431 (in association with the audio source file to be reproduced).

The correction value calculating unit 435 performs a process related to the calculation of the correction value used for correcting the sound volume or the sound quality for the audio source file to be reproduced. The correcting unit 436 performs the process related to the correction of the sound volume or the sound quality of the audio source file (audio signal) to be reproduced supplied from the reproduction target audio source acquiring unit 431 using the correction value calculated by the correction value calculating unit 435. The correcting unit 436 supplies the corrected audio source file to be reproduced to the equalizer processing unit 437.

The equalizer processing unit 437 is an embodiment of a processing section to which the present technology is applied, and performs a process related to processing (processing of a frequency characteristic) of the sound quality of the audio source file (audio signal) to be reproduced whose sound volume or sound quality have been corrected by the correcting unit 436. The equalizer processing unit 437 processes the sound quality of the audio source file (audio signal) to be reproduced on the basis of, for example, an instruction (manipulation) or the like of the user without using the correction value calculated by the correction value calculating unit 435. In other words, with this process, the equalizer processing unit 437 sets the frequency characteristic according to the request of the user or the like. The equalizer processing unit 437 supplies the audio source file to be reproduced to the reproducing/transmitting unit 438.

The reproducing/transmitting unit 438 is an embodiment of an output unit to which the present technology is applied, and performs a process related to reproduction or transmission of the audio source file (audio signal) to be reproduced. For example, the reproducing/transmitting unit 438 reproduces the audio source file (audio signal) to be reproduced supplied from the equalizer processing unit 437 and outputs it from an output device such as a speaker. Further, for example, the reproducing/transmitting unit 438 outputs the audio source file (audio signal) to be reproduced supplied from the equalizer processing unit 437 to the outside of the terminal device 103 (for example, another device) or the like as data via an output terminal, a communication device, or the like.

<Functional Configuration of Correction Value Calculating Unit>

As illustrated in FIG. 31, the correction value calculating unit 435 includes a sound volume correction value calculating unit 441 and a sound quality correction value calculating unit 442 as functional blocks.

Figure 32A:
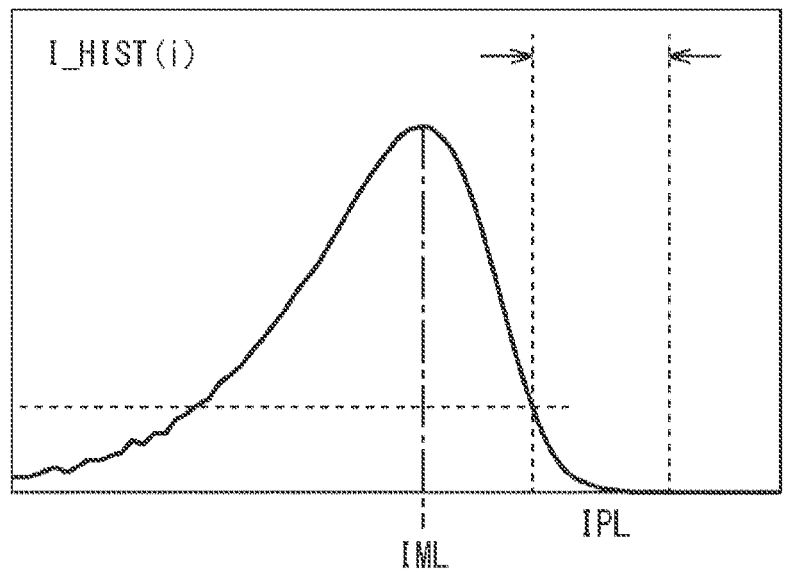
FIGS. 32A and 32B are diagrams illustrating an example of parameters used for sound volume correction value calculation.
Figure 32B:
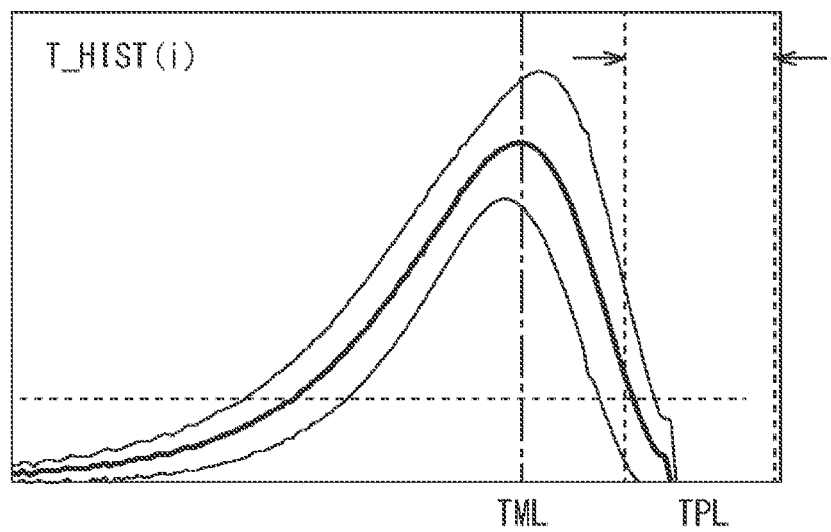

The sound volume correction value calculating unit 441 performs the process related to the calculation of the correction value related to the correction of the sound volume for the audio source file to be reproduced. The metadata acquiring unit 433 detects the reference peak level (IPL) to be reproduced audio source and the mode value to be reproduced audio source (the class value (level value) of bin having the highest frequency) (IML) from the histogram (I_HIST(m)) of the absolute value of the sample of one entire musical piece of the metadata corresponding to the audio source file to be reproduced as in an example illustrated in FIG. 32A. The metadata acquiring unit 433 supplies the detected IPL and IML to the sound volume correction value calculating unit 441. Further, the target data acquiring unit 432 detects the reference peak level (TPL) of the target data and the mode value (TML) of the target data from the average value (T_HIST_A(m)) of the histograms of the absolute values of the sample values of all the audio sources in the cluster to which the audio source file to be reproduced belongs as in an example illustrated in FIG. 32B. Further, the method of detecting the TPL or the TML is similar to that of the IPL or the IML. The target data acquiring unit 432 supplies the detected TPL and TML to the sound volume correction value calculating unit 441.

The sound volume correction value calculating unit 441 obtains a sound volume correction value VC using these parameters (IPL, IML, TPL, and TML). The sound volume correction value calculating unit 441 supplies the obtained sound volume correction value VC to the correcting unit 436 (a sound volume correcting unit 461). Further, a method of calculating the sound volume correction value VC is arbitrary. For example, the sound volume correction value VC may be calculated by an operation or may be obtained with reference to table information or the like. In case of calculating by an operation, for example, the sound volume correction value VC may be calculated as in the following Formula (6).

$$VC = PARAM\_WP*(TPL-IPL) + PARAM\_WM*(TML-IML) \quad (6)$$

Here, PARAM_WP and PARAM_WM are weight coefficients, respectively, and, for example, a value such as 0.5 is set. Further, in a case in which the reproduction target audio source file does not belong to the cluster of the target data, the absolute value of the sound volume correction value VC is likely to increase abnormally without performing a calculation of an appropriate correction amount. In order to prevent such occurrence, either or both of the upper limit value PARAM_VCMAX or the lower limit value PARAM_VCMIN of the sound volume correction value VC may be set, and the range of sound volume correction value VC may be restricted using them.

The sound quality correction value calculating unit 442 performs the process related to the calculation of the correction value related to the sound quality correction for the audio source file to be reproduced.

<Functional Configuration of Sound Quality Correction Value Calculating Unit>

As illustrated in FIG. 31, the sound quality correction value calculating unit 442 includes a PSD normalizing unit 451, a difference calculating unit 452, and a PSD correction value calculating unit 453 as functional blocks.

The PSD normalizing unit 451 performs the process related to the normalization of the PSD. The normalization process is a process for suppressing the variation of the PSD in the vertical axis direction caused by the difference in the sound volume as described above in <Sound volume difference of audio source>, <Normalization of PSD>, or the like, and is a process performed for extracting the sound quality-like feature from the PSD intensively. For the normalization of the PSD, the metadata acquiring unit 433 supplies the reference peak level (IPL) to be reproduced audio source obtained from the histogram (I_HIST(m)) of the absolute value of the sample of one entire musical piece of the metadata corresponding to audio source file to be reproduced and the average (I_PSD(i)) of the power spectrum densities of one entire musical piece to the PSD normalizing unit 451.

Figure 33:
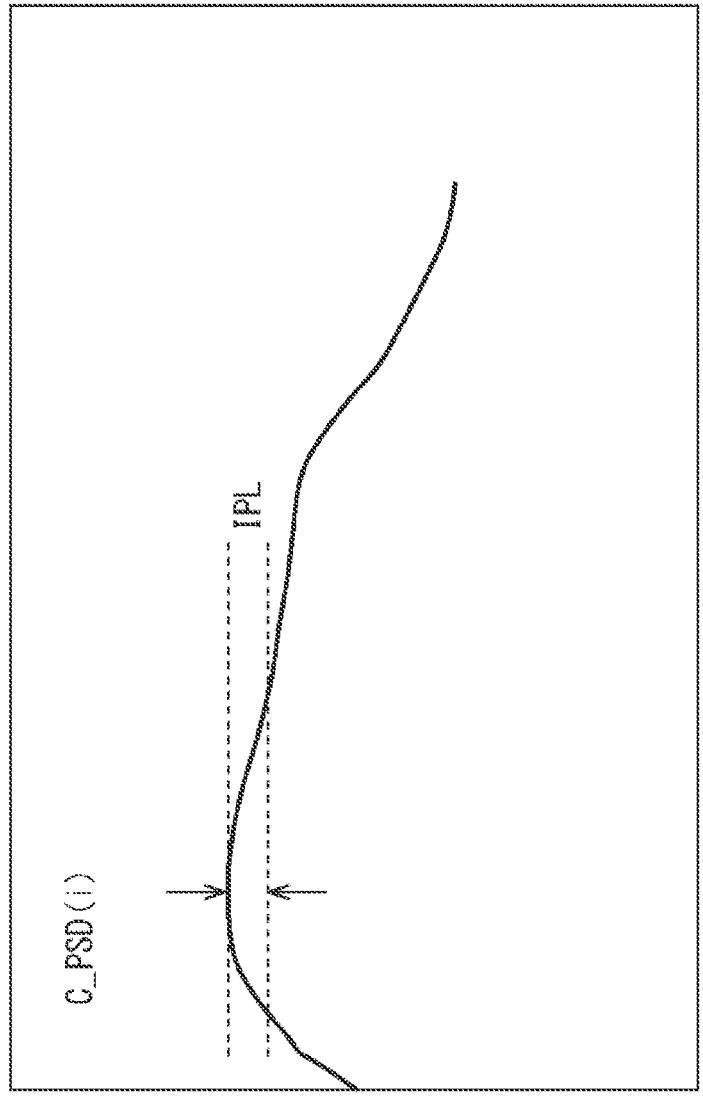
FIG. 33 is a diagram illustrating an example of a form of PSD normalization.

By normalizing I_PSD(i) using the IPL, as illustrated in FIG. 33, the PSD normalizing unit 451 removes a component caused by the variation in the sound volume from I_PSD(i), and calculates the average C_PSD(i) of the corrected power spectrum density which is the PSD suitable for the sound quality correction. The PSD normalizing unit 451 supplies the average C_PSD(i) of the calculated corrected power spectrum density to the difference calculating unit 452. The PSD normalizing unit 451 calculates the average C_PSD(i) of the corrected power spectrum density, for example, as in the following Formula (7).

$$C\_PSD(i)=I\_PSD(i)-IPL \quad (7)$$

Further, as the value used for the normalization of I_PSD(i), the same value as the value used in the normalization performed by the normalizing unit 142 is used in order to achieve consistency with the target data. As described above in <Normalization of PSD>, the value used for the normalization may be any value as long as it is a value in which the sound volume to be reproduced audio source file is reflected.

Figure 34:
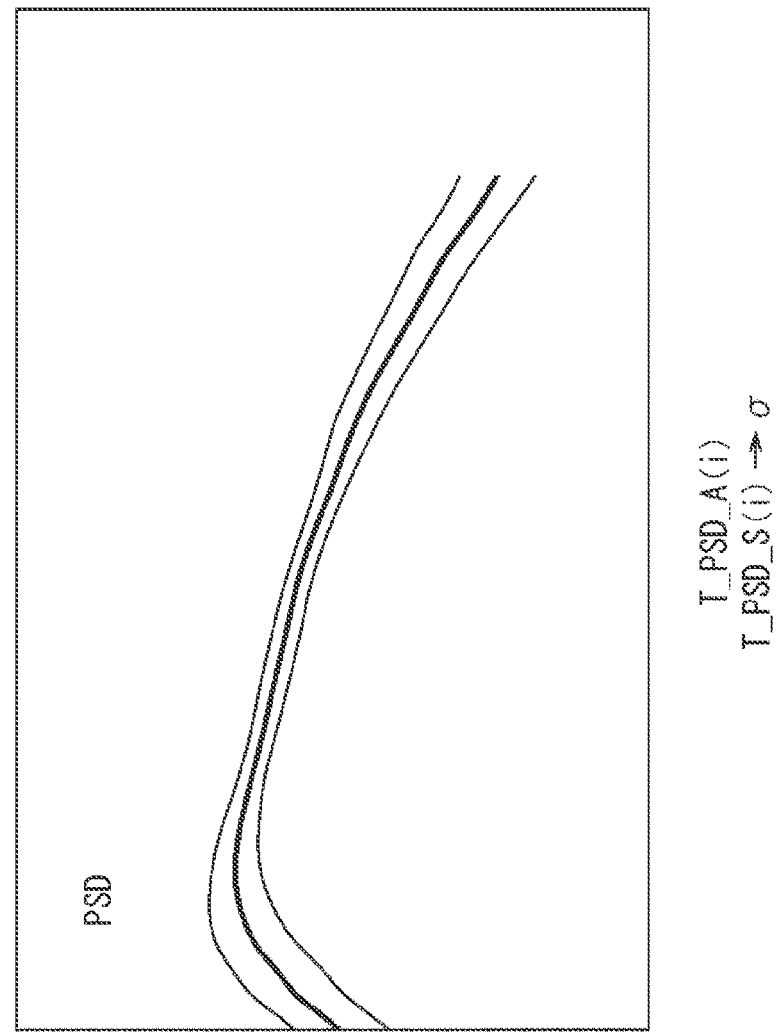
FIG. 34 is a diagram illustrating an example of an average value and a standard deviation value of a PSD used for calculating a PSD correction value.

The difference calculating unit 452 performs a process related to a calculation of a difference between the PSD of the target data and the PSD of the metadata. For the difference calculation, the target data acquiring unit 432 supplies the average value (T_PSD_A(i)) of the power spectrum densities of all the audio sources in the target cluster (a middle curve in three curves in FIG. 34) to the difference calculating unit 452.

The difference calculating unit 452 calculates a PSD difference D_PSD(i) between T_PSD_A(i) and C_PSD(i) as in the following Formula (8).

$$D\_PSD(i)=C\_PSD(i)-T\_PSD\_A(i) \quad (8)$$

The difference calculating unit 452 supplies the calculated PSD difference D_PSD(i) to the PSD correction value calculating unit 453.

The PSD correction value calculating unit 453 calculates the correction value for sound quality correction, that is, the correction value of the PSD. For the calculation of the correction value, the target data acquiring unit 432 supplies the standard deviation value (T_PSD_S(i)) of the power spectrum densities of all the audio sources in the target cluster (one obtained by excluding a middle curve from a top curve among three curves of FIG. 34, that is, one obtained by excluding a bottom curve from the middle curve among the three curves of FIG. 34) to the PSD correction value calculating unit 453.

The PSD correction value calculating unit 453 calculates a PSD correction value F_PSD(i) using D_PSD(i) and T_PSD_S(i) as in the following Formula (9).

$$F\_PSD(i)=f(D\_PSD(i)) \quad (9)$$

Figure 35:
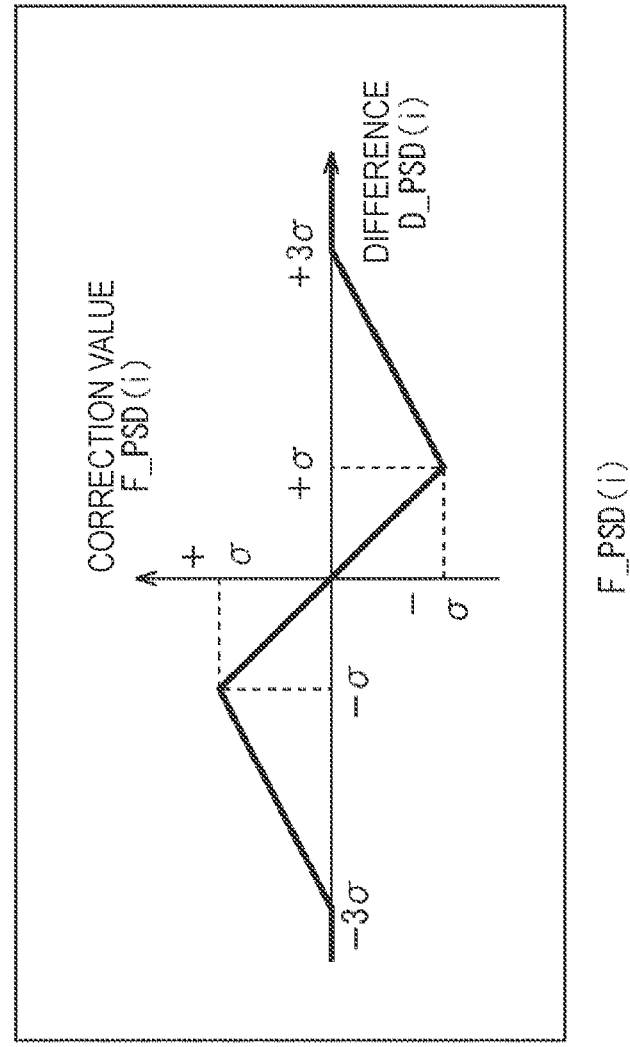
FIG. 35 is a diagram illustrating an example of a PSD correction value.

Here, f( ) indicates a non-linear operation or a table reference. For example, as illustrated in FIG. 35, the PSD correction value calculating unit 453 may obtain the correction value F_PSD(i) from the difference D_PSD(i) of the PSD by linear interpolation of a plurality of points having the standard deviation value T_PSD_S(i) as a parameter. The PSD correction value calculating unit 453 designs a filter coefficient used for the sound quality correction (correction of the frequency characteristic) by the correcting unit 436 (a sound quality correcting unit 462) to approximate the calculated PSD correction value F_PSD(i). The PSD correction value calculating unit 453 supplies the designed filter coefficient to the correcting unit 436 (the sound quality correcting unit 462).

Figure 36:
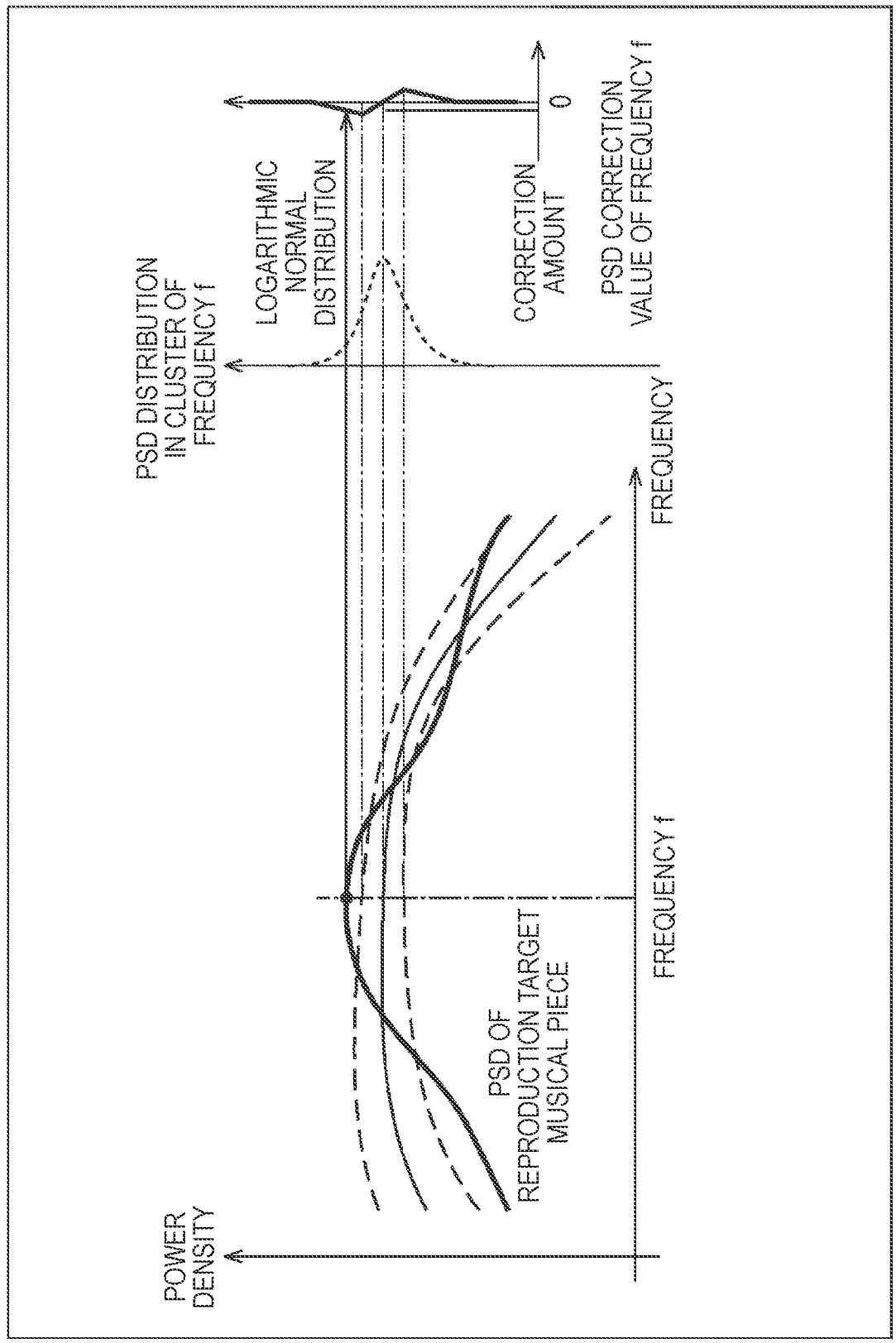
FIG. 36 is a diagram illustrating an example of a form of sound quality correction.
Figure 37:
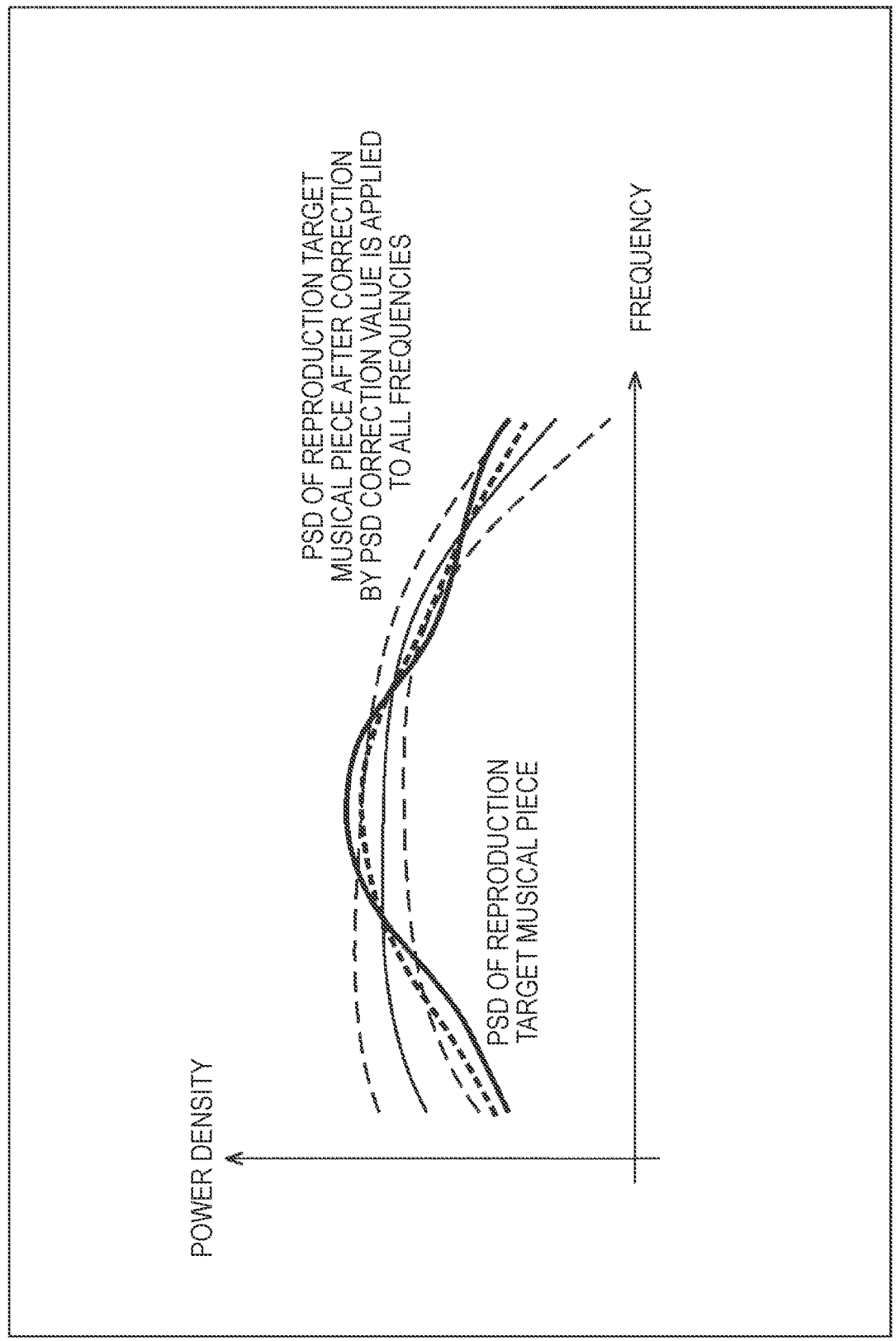
FIG. 37 is a diagram illustrating an example of a form of sound quality correction.

As described above, the difference D_PSD(i) of the PSD serves as information reflecting the difference from the average sound quality of the cluster due to the normalization of the PSD by the PSD normalizing unit 451. The sound volume or sound quality adjustment performed at the final stage of popular audio source production is called mastering, but a variation in an adjustment amount of a worker in the mastering process is a big factor that causes the absolute value of D_PSD(i) to increase. Since a sense amount of a size of a sound is a logarithmic scale (Fechener's law), the variation in the adjustment amount of the worker occurred in the mastering process tends to follow a logarithmic normal distribution well. Therefore, as illustrated in FIG. 36, by calculating F_PSD(i) so that the variance of the logarithmic normal distribution is reduced assuming the logarithmic normal distribution as the distribution of each frequency bin of D_PSD(i), it is possible to correct the variations in the mastering process effectively as illustrated in FIG. 37.

Here, the effective correction is correction of increasing a desirable sound quality correction effect by giving a large correction amount in a case in which a probability that the reproduction target audio source belongs to the cluster of the target data is considered to be high and decreasing an undesirable sound quality correction effect by the target data of the erroneous cluster by giving a small correction amount in a case in which a probability that the reproduction target audio source belongs to the cluster of the target data is considered to be low.

As described above, the conversion from D_PSD(i) to F_PSD(i) by the PSD correction value calculating unit 453 is performed by a non-linear operation having T_PSD_S(i) and D_PSD(i) of the target data as an input, the table reference, or the like, and a conversion of increasing a desirable correction effect or decreasing an undesirable correction effect is performed in accordance with a probability distribution shape of the logarithmic normal distribution.

<Functional Configuration of Correcting Unit>

As illustrated in FIG. 31, the correcting unit 436 includes a sound volume correcting unit 461 and a sound quality correcting unit 462 as functional blocks.

The sound volume correcting unit 461 corrects the sound volume of the audio source file (audio signal) to be reproduced supplied from the reproduction target audio source acquiring unit 431 using the sound volume correction value VC supplied from the sound volume correction value calculating unit 441. The sound volume correcting unit 461 supplies the audio source file to be reproduced in which the sound volume is corrected to the sound quality correcting unit 462.

The sound quality correcting unit 462 performs a filter process using a filter coefficient (a filter coefficient approximating the PSD correction value F_PSD(i)) supplied from the PSD correction value calculating unit 453 on the audio source file (audio signal) to be reproduced, and corrects the frequency characteristic. Further, a filter used for the sound quality correction is arbitrary and may be, for example, a finite impulse response (FIR) filter or an infinite impulse response (IIR) filter. The sound quality correcting unit 462 supplies the audio source file to be reproduced in which the sound quality is corrected to the equalizer processing unit 437.

In the case of the sound volume correction using the effective value described in Patent Literature described above or the like, when the frequency characteristic of the reproducing device is not flat, it does not become a true effective value finally sensed by a listener in principle unless the effective value is calculated taking the characteristic into consideration, and the sound volume correction effect is not sufficiently obtained. On the other hand, in the case of the sound volume correction by the terminal device 103 described above, since energy (effective value) included in all frequency bands is equally corrected by an action of the sound quality correction operation, even in a case in which the frequency characteristic of the reproducing device is not flat, the effective value perceived by the listener through the reproducing device can be aligned, and thus it is possible to cause the sound volume correction effect to further match the auditory sensation of the user.

<Flow of Reproduction Control Process>

Next, a process executed by the terminal device 103 (FIG. 1) will be described. First, an example of a flow of the reproduction control process executed when the terminal device 103 reproduces the audio source file will be described with reference to a flowchart of FIG. 38.

If the reproduction control process is started, in step S401, the target data acquiring unit 432 (FIG. 31) performs a target data acquisition process and acquires the target data. Further, the target data acquisition process will be described later in detail.

In step S402, the reproduction target audio source acquiring unit 431 determines whether or not reproduction is started, and is on standby until reproduction is determined to be started. In a case in which reproduction is determined to be started, the process proceeds to step S403.

In step S403, the reproduction target audio source acquiring unit 431 determines whether or not there is metadata of the audio source file to be reproduced. In a case in which it is determined that there is no metadata, the process proceeds to step S404.

In step S404, the audio source analyzing unit 434 determines whether or not the metadata is generated before reproduction. In a case in which it is determined that the metadata is generated, the process proceeds to step S405.

In step S405, the audio source analyzing unit 434 performs an audio source analysis process and generates the metadata of the audio source file to be reproduced. Further, the audio source analysis process is executed similarly to that described with reference to the flowchart of FIG. 27.

If the audio source analysis process ends, the process proceeds to step S406. Further, in a case in which it is determined in step S403 that there is metadata in the audio source file to be reproduced, the processes of step S404 and step S405 are skipped, and the process proceeds to step S406.

In step S406, the correcting unit 436 determines whether or not the sound volume or the sound quality of the audio source file to be reproduced is corrected. In a case in which it is determined that correction is performed, the process proceeds to step S407.

In step S407, the metadata acquiring unit 433 executes a metadata acquisition process and acquires the metadata of the audio source file to be reproduced. The metadata acquisition process will be described later in detail.

In step S408, the correction value calculating unit 435 executes a correction filter characteristic calculation process and calculate a characteristic of a correction filter. The correction filter characteristic calculation process will be described later in detail.

In step S409, the correcting unit 436, the equalizer processing unit 437, and the reproducing/transmitting unit 438 execute the correction-applied reproduction process and reproduce the audio source file to be reproduced by applying the correction. The correction-applied reproduction process will be described later in detail. If the correction-applied reproduction process ends, the process proceeds to step S414.

Further, in a case in which it is determined in step S406 that correction is not performed, the process proceeds to step S410. In step S410, the correcting unit 436, the equalizer processing unit 437, and the reproducing/transmitting unit 438 execute the non-correction-applied reproduction process and reproduce the audio source file to be reproduced without correction. The non-correction-applied reproduction process will be described later in detail. If the non-correction-applied reproduction process ends, the process proceeds to step S414.

Further, in a case in which it is determined in step S404 that the metadata is not generated before reproduction, the process proceeds to step S411. In step S411, the correcting unit 436, the equalizer processing unit 437, and the reproducing/transmitting unit 438 execute the non-correction-applied reproduction process and reproduce the audio source file to be reproduced without correction. This non-correction-applied reproduction process is executed similarly to the process of step S410.

In parallel with the non-correction-applied reproduction process of step S411, the processes of step S412 and step S413 are executed. In step S412, the audio source analyzing unit 434 determines whether or not the metadata is generated at the time of reproduction. In a case in which it is determined that the metadata is generated, the process proceeds to step S413. In step S413, the audio source analyzing unit 434 performs the audio source analysis process and generates the metadata of the audio source file to be reproduced. Further, the audio source analysis process is executed similarly to the process of step S405.

If the non-correction-applied reproduction process of step S411 and the audio source analysis process of step S413 end, the process proceeds to step S414. Further, in a case in which it is determined in step S412 that the metadata is not generated, the process of step S413 is skipped. In this case, if the non-correction-applied reproduction process of step S411 ends, the process proceeds to step S414.

In step S414, the reproduction target audio source acquiring unit 431 determines whether or not another audio source file is reproduced. In a case in which it is determined that another audio source file is reproduced, the process returns to step S403, and the subsequent process is executed using another audio source file as a new reproduction target. Further, in a case in which it is determined in step S414 that another audio source file is not reproduced, the reproduction control process ends.

By executing the reproduction control process as described above, the terminal device 103 can correct the audio source file to be reproduced by using the metadata or the target data of the reproduce audio source file. Accordingly, the terminal device 103 can perform the sound quality correction as well as the sound volume correction and can obtain the sound volume correction effect more suitable for the auditory sensation.

<Flow of Target Data Acquisition Process>

Figure 38:
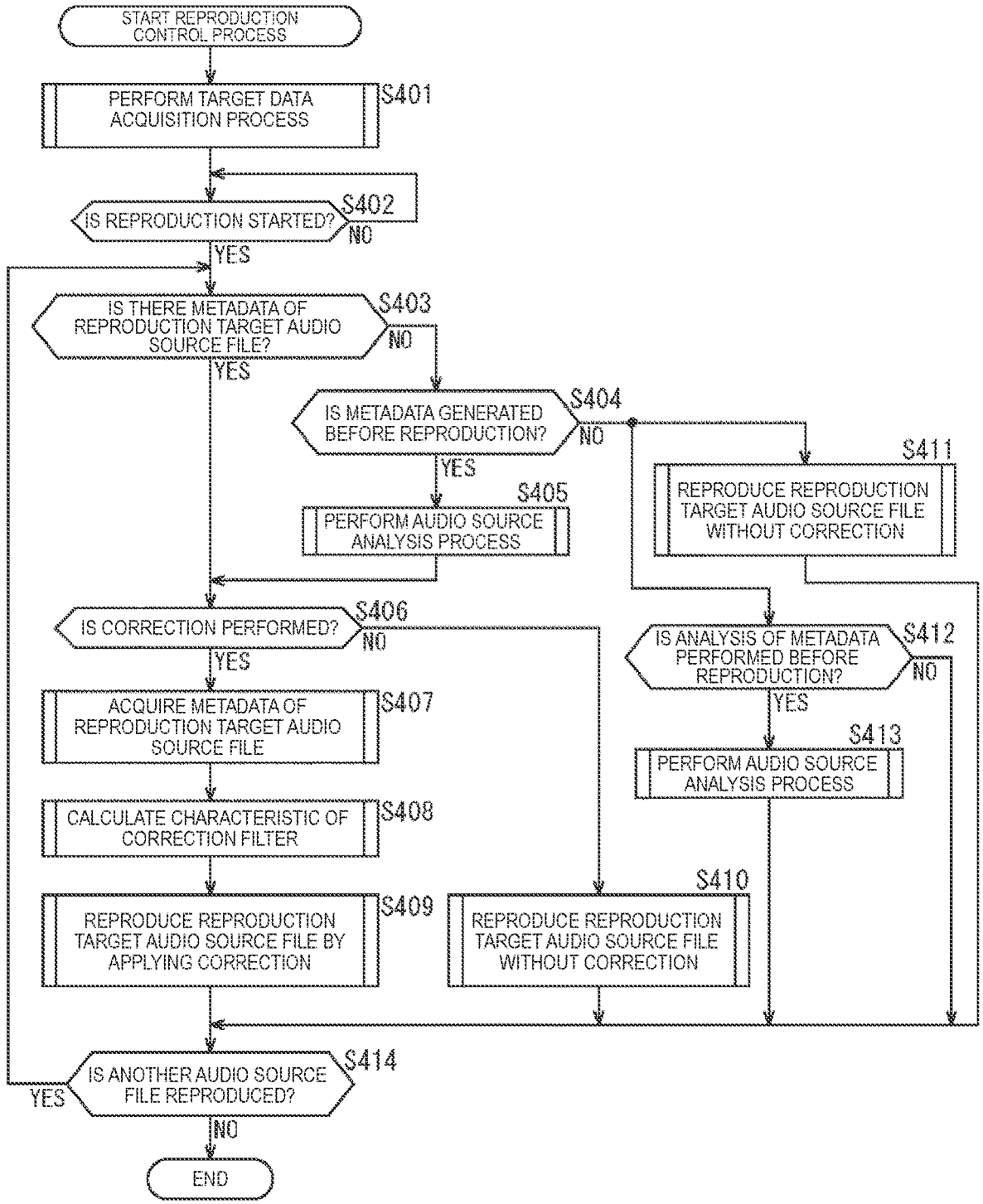
FIG. 38 is a flowchart illustrating an example of a flow of a reproduction control process.
Figure 39:
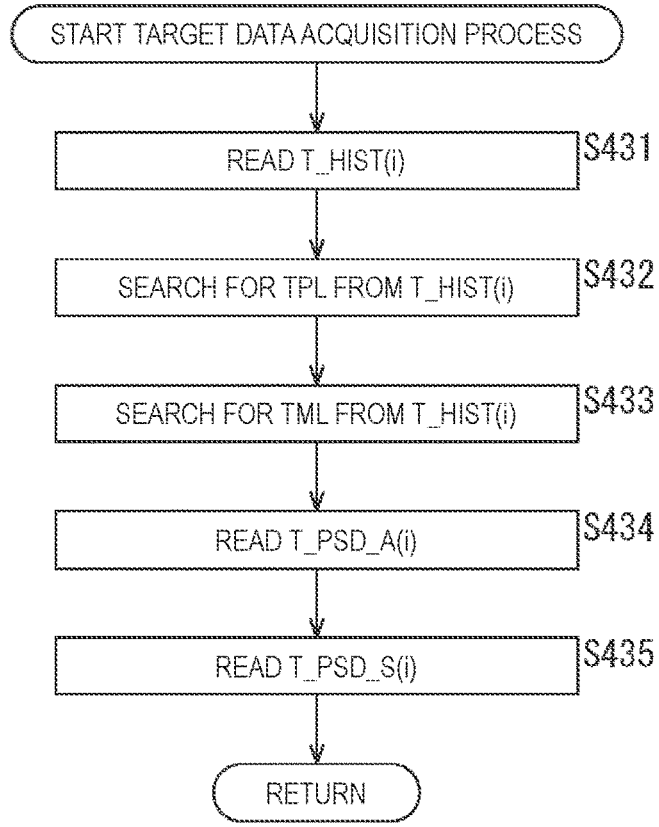
FIG. 39 is a flowchart illustrating an example of a flow of a target data acquisition process.

Next, an example of a flow of the target data acquisition process executed in step S401 of FIG. 38 will be described with reference to a flowchart of FIG. 39.

If the target data acquisition process is started, in step S431, the target data acquiring unit 432 (FIG. 31) reads the histogram (T_HIST(m)) of the absolute values of the sample values of all the audio sources in the target cluster. Further, in step S432, the target data acquiring unit 432 (FIG. 31) detects the reference peak level (TPL) of the target data from T_HIST(m) read in step S431. Further, in step S433, the target data acquiring unit 432 (FIG. 31) detects the mode value (TML) of the target data from T_HIST(m) read in step S431.

In step S434, the target data acquiring unit 432 reads the average value (T_PSD_A(i)) of the power spectrum densities of all the audio sources in the target cluster. Further, in step S435, the target data acquiring unit 432 reads the standard deviation value (T_PSD_S(i)) of the power spectrum densities of all the audio sources in the target cluster. If the process of step S435 ends, the process returns to FIG. 38.

By performing the target data acquisition process as described above, it is possible to acquire the target data more easily. Therefore, it is possible to use the target data more easily for the sound volume correction or the sound quality correction. Accordingly, the terminal device 103 can obtain the sound volume correction effect more suitable for the auditory sensation.

<Flow of Metadata Acquisition Process>

Figure 40:
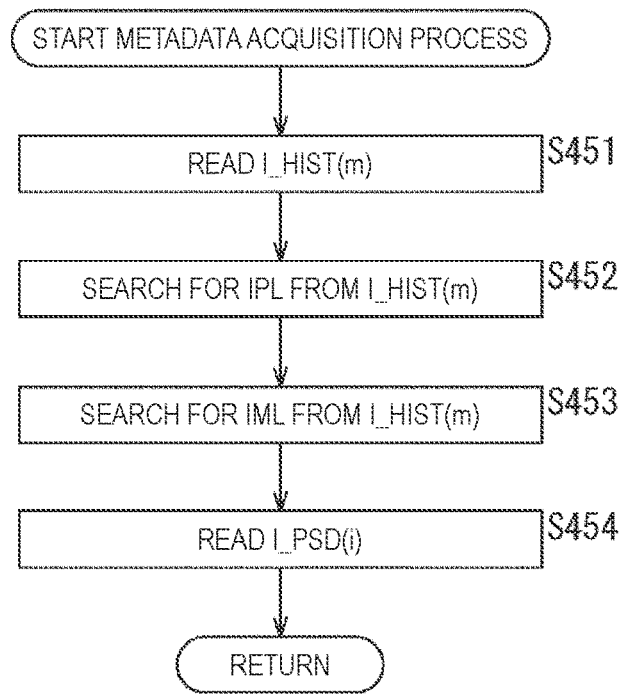
FIG. 40 is a flowchart illustrating an example of a flow of a metadata acquisition process.

Next, an example of a flow of the metadata acquisition process executed in step S407 of FIG. 38 will be described with reference to a flowchart of FIG. 40.

If the metadata acquisition process is started, in step S451, the metadata acquiring unit 433 (FIG. 31) reads the histogram (I_HIST(m)) of the absolute value of the sample of the entire audio source file to be reproduced (one entire musical piece). In step S452, the metadata acquiring unit 433 detects the reference peak level (IPL) to be reproduced audio source from I_HIST(m) read in step S451. In step S453, the metadata acquiring unit 433 detects the mode value (IML) to be reproduced audio source from I_HIST(m) read in step S451.

In step S454, the metadata acquiring unit 433 reads the average (I_PSD(i)) of the power spectrum density of the entire audio source file to be reproduced (one entire musical piece). If the process of step S454 ends, the process returns to FIG. 38.

By performing the metadata acquisition process as described above, it is possible to acquire the metadata more easily and effectively. Therefore, it is possible to use the metadata for the sound volume correction or the sound quality correction more easily and effectively. Accordingly, the terminal device 103 can obtain the sound volume correction effect more suitable for the auditory sensation.

<Flow of Correction Filter Characteristic Calculation Process>

Figure 41:
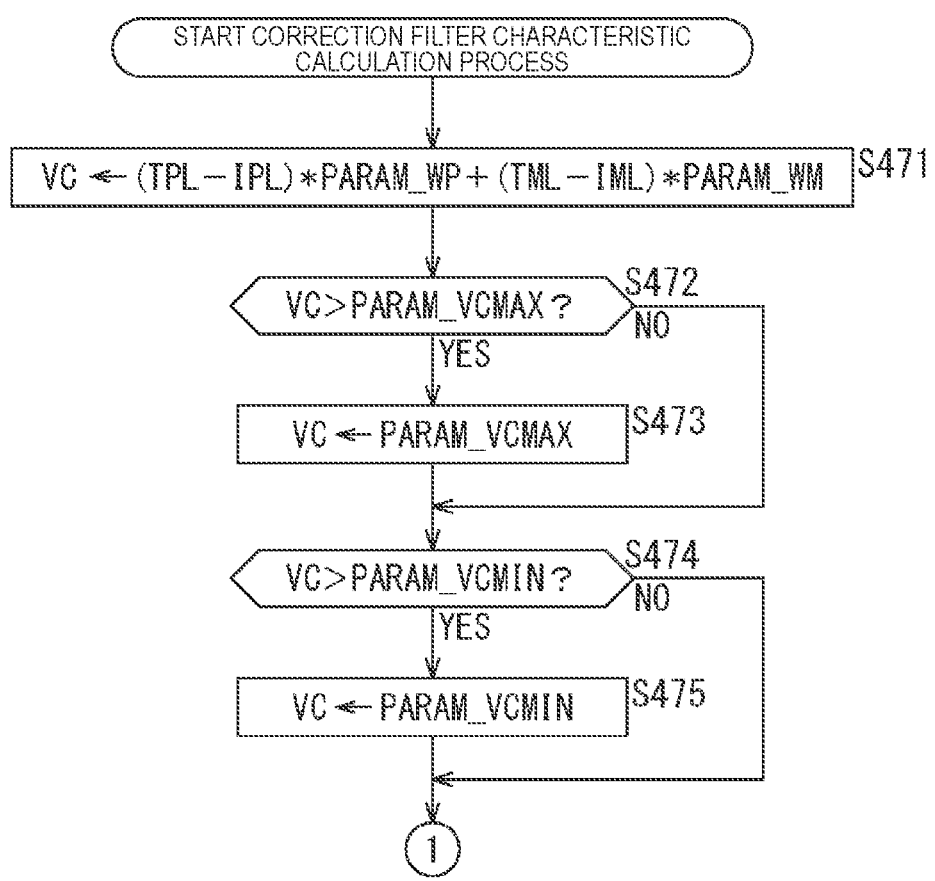
FIG. 41 is a flowchart illustrating an example of a flow of a correction filter characteristic calculation process.
Figure 42:
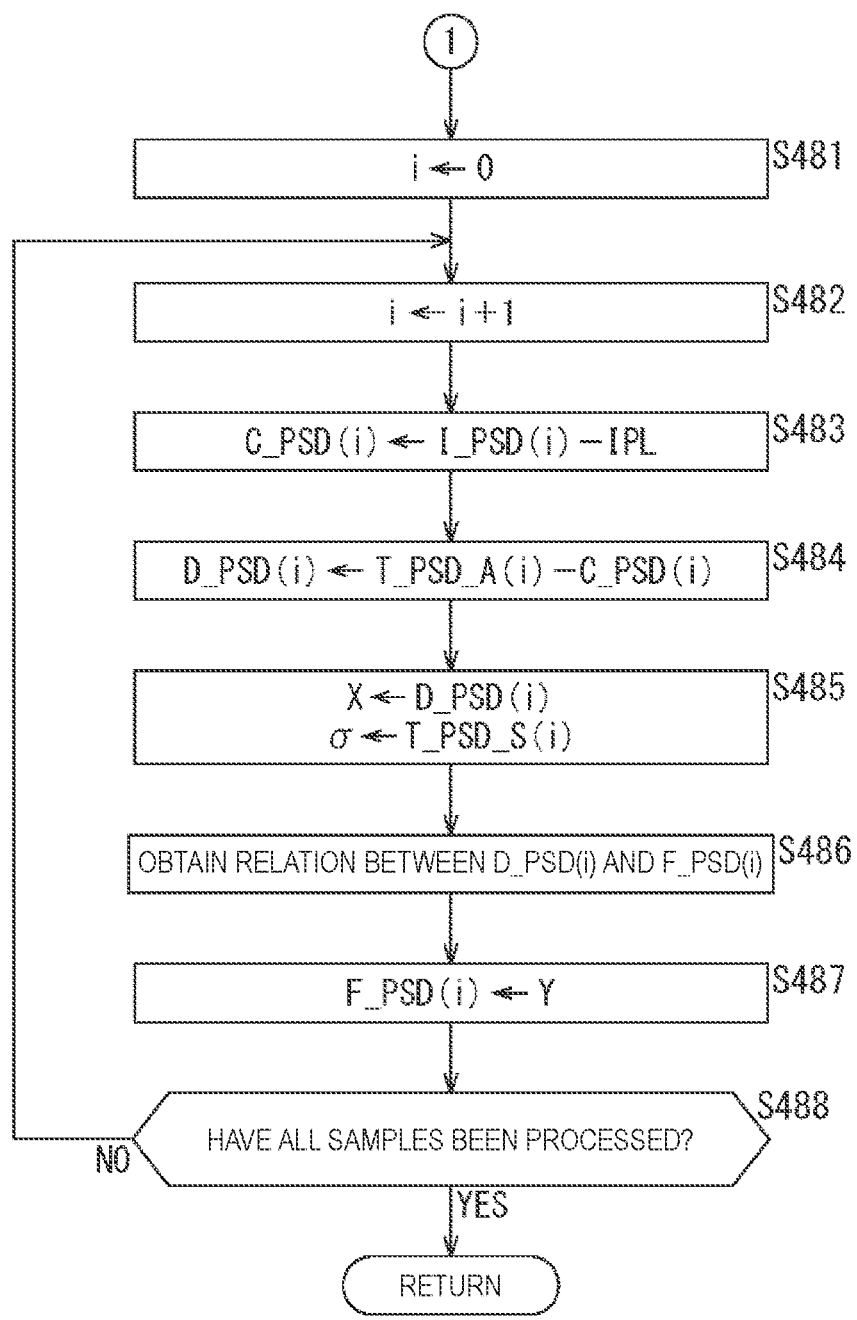
FIG. 42 is a flowchart subsequent to FIG. 41, illustrating an example of a flow of a correction filter characteristic calculation process.

Next, an example of a flow of the correction filter characteristic calculation process executed in step S408 of FIG. 38 will be described with reference to flowcharts of FIGS. 41 and 42.

If the correction filter characteristic calculation process is started, in step S471, the sound volume correction value calculating unit 441 (FIG. 31) obtains the sound volume correction value VC using the reference peak level (IPL) to be reproduced audio source, the mode value (IML) to be reproduced audio source, the reference peak level (TPL) of the target data, and the mode value (TML) of the target data. For example, the sound volume correction value calculating unit 441 calculates the sound volume correction value VC as in Formula (6) as described above.

In step S472, the sound volume correction value calculating unit 441 determines whether or not the sound volume correction value VC calculated in step S471 is larger than the upper limit value PARAM_VCMAX. In a case in which it is determined that the sound volume correction value VC is larger than the upper limit value PARAM_VCMAX, the process proceeds to step S473.

In step S473, the sound volume correction value calculating unit 441 updates the sound volume correction value VC to the upper limit value PARAM_VCMAX. If the process of step S473 ends, the process proceeds to step S474. Further, in a case in which it is determined in step S472 that the sound volume correction value VC is not larger than the upper limit value PARAM_VCMAX, the process of step S473 is skipped, and the process proceeds to step S474.

In step S474, the sound volume correction value calculating unit 441 determines whether or not the sound volume correction value VC calculated in step S471 is smaller than the lower limit value PARAM_VCMIN. In a case in which it is determined that the sound volume correction value VC is smaller than the lower limit value PARAM_VCMIN, the process proceeds to step S475.

In step S475, the sound volume correction value calculating unit 441 updates the sound volume correction value VC to the lower limit value PARAM_VCMIN. If the process of step S475 ends, the process proceeds to step S481 of FIG. 42. Further, in a case in which it is determined in step S474 of FIG. 41 that the sound volume correction value VC is not smaller than the lower limit value PARAM_VCMIN, the process of step S475 is skipped, and the process proceeds to step S481 of FIG. 42.

In step S481, the sound quality correction value calculating unit 442 sets a variable i to an initial value (for example, "0"). In step S482, the sound quality correction value calculating unit 442 increments the variable i (for example, causes it to be increased by "1").

In step S483, the PSD normalizing unit 451 normalizes the average (I_PSD(i)) of the power spectrum densities of one entire musical piece using the reference peak level (IPL) to be reproduced audio source. For example, the PSD normalizing unit 451 calculates the average (C_PSD(i)) of the power spectrum densities of one entire musical piece after correction as in Formula (7) described above.

In step S484, the difference calculating unit 452 calculates the difference (D_PSD(i)) between the average value (T_PSD_A(i)) of the power spectrum densities of all the audio sources in the target cluster and the average (C_PSD(i)) of the power spectrum densities of one entire musical piece after correction (Formula (8)).

In step S485, the PSD correction value calculating unit 453 sets the difference (D_PSD(i)) as an X axis, and sets the standard deviation value (T_PSD_S(i)) of the power spectrum densities of all the audio sources in the target cluster as 6. In step S486, the PSD correction value calculating unit 453 obtains a relation between D_PSD(i) and F_PSD(i), for example, as illustrated in FIG. 35. In step S487, the PSD correction value calculating unit 453 converts D_PSD(i) into to F_PSD(i) on the basis of the relation (F_PSD(i)←Y).

In step S488, the sound quality correction value calculating unit 442 determines whether or not all the samples have been processed. In a case in which it is determined that the value of the variable i does not reach the number of samples, and there is an unprocessed sample, the process returns to step S482, and the subsequent process is repeated. In other words, a new processing target is selected from the unprocessed samples, and the PSD correction value F_PSD(i) is obtained for the new processing target. In a case in which it is determined in step S488 that the value of the variable i reaches the sample number, and all the samples have been processed, the correction filter characteristic calculation process ends, and the process returns to FIG. 38.

As described above, by executing the correction filter characteristic calculation process, it is possible to more easily and effectively calculate the correction value using the metadata or the target data. Therefore, it is possible to use the correction value more easily and effectively for the sound volume correction or the sound quality correction.

Accordingly, the terminal device 103 can obtain the sound volume correction effect more suitable for the auditory sensation.

<Flow of Correction-Applied Reproduction Process>

Figure 43:
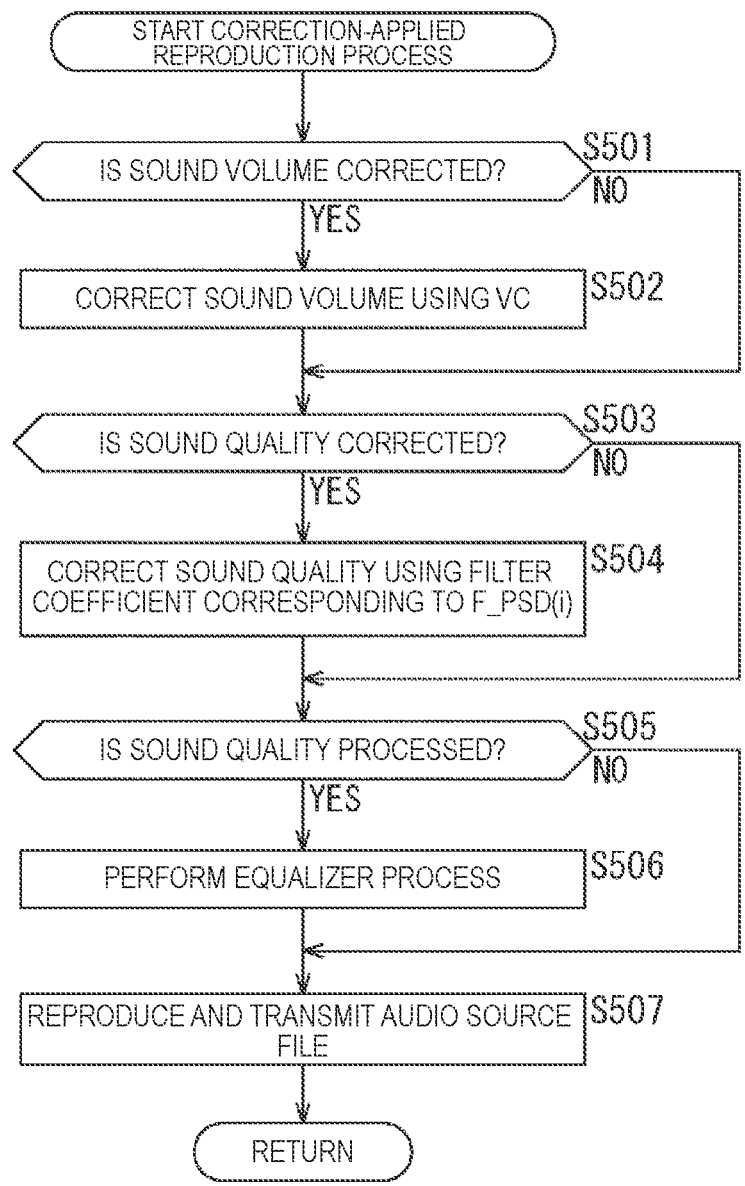
FIG. 43 is a flowchart illustrating an example of a flow of a correction-applied reproduction process.

Next, an example of a flow of the correction-applied reproduction process executed in step S409 of FIG. 38 will be described with reference to a flowchart of FIG. 43.

If the correction-applied reproduction process is started, the sound volume correcting unit 461 (FIG. 31) determines whether or not the sound volume of the audio source file to be reproduced is corrected. In a case in which it is determined that the sound volume of the audio source file to be reproduced is corrected, the process proceeds to step S502. In step S502, the sound volume correcting unit 461 corrects the sound volume of the audio source file to be reproduced by using the sound volume correction value VC obtained in step S408 of FIG. 38. If the process of step S502 ends, the process proceeds to step S503. Further, in a case in which it is determined in step S501 that the sound volume is not corrected, the process of step S502 is skipped, and the process proceeds to step S503.

In step S503, the sound quality correcting unit 462 determines whether or not the sound quality of the audio source file to be reproduced is corrected. In a case in which it is determined that the sound quality of the audio source file to be reproduced is corrected, the process proceeds to step S504. In step S504, the sound quality correcting unit 462 performs a filter process using the filter coefficient corresponding to the PSD correction value F_PSD(i) obtained in step S408 of FIG. 38, and corrects the sound quality of the audio source file to be reproduced. If the process of step S504 ends, the process proceeds to step S505. Further, in a case in which it is determined in step S503 that the sound quality is not corrected, the process of step S504 is skipped, and the process proceeds to step S505.

In step S505, the equalizer processing unit 437 determines whether or not the sound quality (frequency characteristic) of the audio source file to be reproduced is processed. In a case in which it is determined that the sound quality (frequency characteristic) of the audio source file to be reproduced is processed, the process proceeds to step S506. In step S506, the equalizer processing unit 437 performs an equalizer process and processes the sound quality of the audio source file to be reproduced in response to a request from the user or the like. If the process of step S506 ends, the process proceeds to step S507. Further, in a case in which it is determined in step S505 that the sound quality is not processed, the process of step S506 is skipped, and the process proceeds to step S507.

In step S507, the reproducing/transmitting unit 438 reproduces and transmits the audio source file. If the process of step S507 ends, the process returns to FIG. 38.

By executing the correction-applied reproduction process as described above, it is possible to realize the sound volume correction and the sound quality correction using the metadata or the target data more easily and effectively. Accordingly, the terminal device 103 can obtain the sound volume correction effect more suitable for the auditory sensation.

<Flow of Non-Correction-Applied Reproduction Process>

Figure 44:
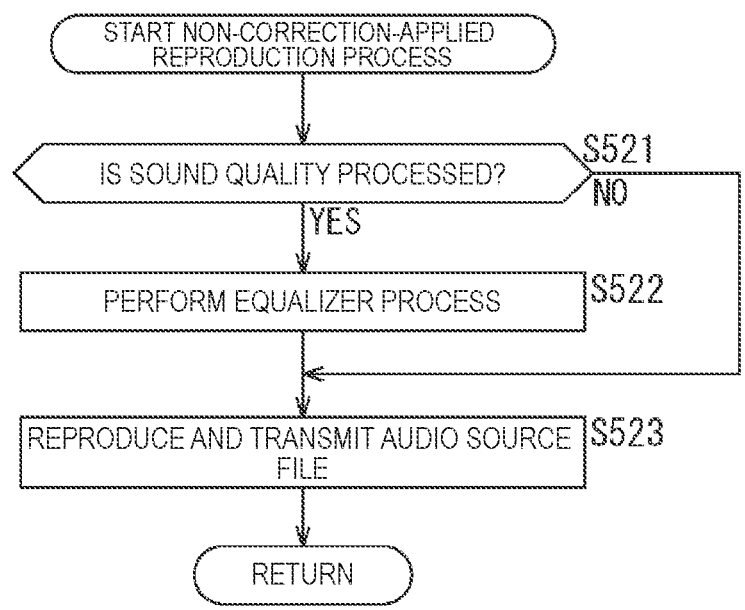
FIG. 44 is a flowchart illustrating an example of a flow of a non-correction-applied reproduction process.

Next, an example of a flow of the non-correction-applied reproduction process executed in step S410 or step S411 of FIG. 38 will be described with reference to a flowchart of FIG. 44.

If the non-correction-applied reproduction process is started, the correcting unit 436 supplies the audio source file to be reproduced to the equalizer processing unit 437 without performing the sound volume correction or sound quality correction. Then, in step S521, the equalizer processing unit 437 determines whether or not the sound quality (frequency characteristic) of the audio source file to be reproduced is processed. In a case in which it is determined that the sound quality (frequency characteristic) of the audio source file to be reproduced is processed, the process proceeds to step S522. In step S522, the equalizer processing unit 437 performs an equalizer process and processes the sound quality of the audio source file to be reproduced in response to a request from the user or the like. If the process of step S522 ends, the process proceeds to step S523. Further, in a case in which it is determined in step S521 that the sound quality is not processed, the process of step S522 is skipped, and the process proceeds to step S523.

In step S523, the reproducing/transmitting unit 438 reproduces and transmits the audio source file. If the process of step S523 ends, the process returns to FIG. 38.

By executing the non-correction-applied reproduction process as described above, the terminal device 103 can reproduce the audio source file without performing the sound volume correction or the sound quality correction using the metadata or the target data.

<Others>

Further, in the above example, the respective processes are performed in the order of the sound volume correction, the sound quality correction, and the equalizer process, but the processing order of these processes is arbitrary. Further, two or more of these processes may be combined. In the above example, the correction value calculating unit 435 calculates both the correction value of the sound volume correction and the correction value of the sound quality correction, but the correction value calculating unit 435 may calculate any one of the correction value of the sound volume and the correction value of the sound quality. In this case, the correcting unit 436 performs one of the sound volume correction and the sound quality correction for which the correction value is calculated.

In general, since the mastering is performed in units of albums, it becomes a state in which the sound volumes or the sound qualities of all musical pieces in an album are aligned. Further, in the case of an album in which no silence interval is interposed between tracks such as a live album, if the sound volume and the sound quality are corrected in units of one musical piece, discontinuity occurs in the sample value between musical pieces, and it causes a noise in a case in which the listener listens to through one album. For this reason, in a case in which the listener listens to through one album, it is desirable to correct the sound volume and the sound quality while regarding all musical pieces of one album as one musical piece instead of correcting the sound volume and the sound quality in units of one musical piece (track).

In the case of the correction method described above, since the analyzed metadata has linearity, the terminal device 103 can obtain the same metadata as that when all musical pieces of one album are regarded as one musical piece indirectly by combining metadata of a plurality of musical pieces with a linear operation. In other words, it is possible to obtain metadata of one entire album by obtaining a weighted average of all musical pieces included in an album with a length of a musical piece as in the following Formula (10).

metadata of one entire album =   (10)

(length of first musical piece × metadata value of first musical piece + length of second musical piece × metadata value of second musical piece + ... + length of N-th musical piece × metadata of N-th musical piece) ÷

(length of first musical piece + length of second musical piece + ... + length of -th musical piece)

<Application of Present Technology>

By applying the present technology as described above, it is possible to effectively correct the variation in the sound volume and the sound quality of a musical piece, and even in a case in which the listener consecutively listens to different musical pieces in order, the listener can listen to the musical pieces comfortably without any discomfort. Further, in a case in which the listener corrects the sound quality by using the sound quality correction function such as the equalizer installed in the reproducing device, it is possible to suppress a difference in equalizer settings that the listener feels are optimum for each musical piece and improve the convenience of quality adjustment by the listener.

2. Second Embodiment

<Other Systems>

The present technology is not limited to the electronic shelf label system described above and may be applied to systems used for arbitrary applications in arbitrary fields such as, for example, traffic, medical care, crime prevention, agriculture, livestock industry, mining, beauty, factory, home appliance, weather, and natural surveillance.

<Computer>

A series of processes described above can be executed by hardware or can be executed by software. In a case in which a series of processes is executed by software, it is sufficient to provide a configuration serving as a computer which can execute the software. Examples of the computer include a computer incorporated into dedicated hardware and a general-purpose computer capable of executing arbitrary functions through various programs installed therein.

For example, in the case of the target data providing server 101 of FIG. 2, as the CPU 111 loads, for example, the program stored in the storage unit 123 onto the RAM 113 via the input/output interface 120 and the bus 114 and executes the program, it is possible to realize functions equivalent to some or all of the hardware components described above in each embodiment. In other words, at least a part of a series of processes described above is performed. The RAM 113 also stores data or the like necessary for the CPU 111 to execute various types of processes as appropriate.

The program executed by the CPU 111 can be recorded in the removable medium 131 serving as, for example, a package media or the like and applied. In this case, the removable medium 131 is loaded onto the drive 125, and then the program can be installed in the storage unit 123 via the input/output interface 120. Further, the program can also be provided via a wired or wireless transmission medium such as a local area network, the Internet, or digital satellite broadcasting. In this case, the program can be received by the communication unit 124 and installed in the storage unit 123. In addition, this program can be installed in the ROM 112 or the storage unit 123 in advance.

Further, for example, in the case of the terminal device 103 in FIG. 30, as the CPU 401 loads, for example, the program stored in the storage unit 413 onto the RAM 403 via the input/output interface 410 and the bus 404 and executes the program, it is possible to realize functions equivalent to some or all of the hardware components described above in each embodiment. In other words, at least a part of a series of processes described above is performed. The RAM 403 also stores data or the like necessary for the CPU 401 to execute various types of processes as appropriate.

The program executed by the CPU 401 may be applied by being recorded onto the removable medium 421 as packaged media or the like, for example. In this case, the program may be installed in the storage unit 413 via the input/output interface 410 by inserting the removable medium 421 into the drive 415. In addition, the program may also be provided via a wired or wireless transmission medium such as a local area network, the Internet, or digital satellite broadcasting. In this case, the program may be received by the communication unit 414 and installed in the storage unit 413. Otherwise, the program may be preinstalled in the ROM 402 or the storage unit 413.

Further, it is possible to cause hardware to execute a part of a series of processes described above and causes other processes to be executed by software.

<Others>

An embodiment of the present technology is not limited to the embodiments described above, and various changes and modifications may be made without departing from the scope of the present technology.

Further, for example, the present technology can be carried out as any component constituting a device or a system, for example, a processor serving as a system large scale integration (LSI) or the like, a module using a plurality of processors or the like, a unit using a plurality of modules or the like, a set in which other functions are added to a unit, or the like (that is, some components of a device).

Note that in this specification, a system means a set of a plurality of constituent elements (e.g., devices or modules (parts)), regardless of whether all the constituent elements are in the same housing. Accordingly, a plurality of devices that is contained in different housings and connected via a network and one device in which a plurality of modules is contained in one housing are both systems.

Further, for example, an element described as a single device (or processing unit) may be divided and configured as a plurality of devices (or processing units). Conversely, elements described as a plurality of devices (or processing units) above may be configured collectively as a single device (or processing unit). Further, an element other than those described above may be added to the configuration of each device (or processing unit). Furthermore, a part of the configuration of a given device (or processing unit) may be included in the configuration of another device (or another processing unit) as long as the configuration or operation of the system as a whole is substantially the same.

In addition, for example, the present technology can adopt a configuration of cloud computing which performs processing by allocating and sharing one function by a plurality of devices through a network.

In addition, for example, the program described above can be executed in any device. In that case, it is sufficient if the device has a necessary function (functional block etc.) and can obtain necessary information.

In addition, for example, each step described by the above-described flowcharts can be executed by one device or executed by being allocated to a plurality of devices.

Furthermore, in the case where a plurality of processes is included in one step, the plurality of processes included in this one step can be executed by one device or executed by being allocated to a plurality of devices. In other words, a plurality of processes included in one step can be executed as processing of a plurality of steps. Conversely, processing described as a plurality of steps can be executed collectively as one step.

Note that in a program executed by a computer, processing in steps describing the program may be executed chronologically along the order described in this specification, or may be executed concurrently, or individually at necessary timing such as when a call is made. In other words, unless a contradiction arises, processing in the steps may be executed in an order different from the order described above. Furthermore, processing in steps describing the program may be executed concurrently with processing of another program, or may be executed in combination with processing of another program.

Note that the plurality of present technologies described in this specification can be performed alone independently of each other, unless a contradiction arises. Of course, any plurality of the present technologies can be performed in combination. For example, part or the whole of the present technology described in any of the embodiments can be performed in combination with part or whole of the present technology described in another embodiment. In addition, part or the whole of any of the present technologies described above can be performed in combination with another technology that is not described above.

Additionally, the present technology may also be configured as below.

(1)

An information processing device, including:

a target data acquiring unit configured to acquire target data which is a statistical value of metadata of each audio signal of an audio signal group;

a metadata acquiring unit configured to acquire metadata of an audio signal to be reproduced; and a correction value calculating unit configured to calculate either or both of a correction value of a sound volume of the audio signal to be reproduced and a correction value of a sound quality of the audio signal to be reproduced using the target data acquired by the target data acquiring unit and the metadata acquired by the metadata acquiring unit.

(2)

The information processing device according to (1), in which the metadata includes a power spectrum density of the audio signal and an absolute value histogram of a sample value of the audio signal.

(3)

The information processing device according to (1) or (2), in which the target data includes an average value and a standard deviation value of the power spectrum density and an average value and a standard deviation value of the absolute value histogram.

(4)

The information processing device according to any one of (1) to (3), in which the correction value calculating unit calculates the correction value of the sound volume using the absolute value histogram of the sample value of the audio signal to be reproduced and an average value of the absolute value histograms of the sample values of the audio signal group.

(5)

The information processing device according to any one of (1) to (4), in which the correction value calculating unit calculates the correction value of the sound volume using a reference peak level and a mode value of the absolute value histogram of the sample value of the audio signal to be reproduced and a reference peak level and a mode value of the average value of the absolute value histograms of the sample values of the audio signal group.

(6)

The information processing device according to any one of (1) to (5), in which the correction value calculating unit normalizes the power spectrum density of the audio signal to be reproduced using the absolute value histogram of the sample value of the audio signal to be reproduced, and calculates the correction value of the sound quality using the normalized power spectrum density.

(7)

The information processing device according to any one of (1) to (6), in which the correction value calculating unit normalizes the power spectrum density of the audio signal to be reproduced with a value having a predetermined probability density of the absolute value histogram of the sample value of the audio signal to be reproduced.

(8)

The information processing device according to any one of (1) to (7), in which the correction value calculating unit normalizes the power spectrum density of the audio signal to be reproduced using a reference peak level of the absolute value histogram of the sample value of the audio signal to be reproduced.

(9)

The information processing device according to any one of (1) to (8), in which the correction value calculating unit obtains a difference between the normalized power spectrum density of the audio signal to be reproduced and an average value of the power spectrum densities of the audio signal group, and calculates the correction value of the sound quality using the difference.

(10)

The information processing device according to any one of (1) to (9), in which the correction value calculating unit calculates a correction value of the power spectrum density of the audio signal to be reproduced using the difference and a standard deviation value of the power spectrum densities of the audio signal group, and calculates the correction value of the sound quality using the correction value of the power spectrum density of the audio signal to be reproduced.

(11)

The information processing device according to any one of (1) to (10), further including a correcting unit configured to correct either or both of the sound volume and the sound quality of the audio signal to be reproduced using the correction value calculated by the correction value calculating unit.

(12)

The information processing device according to any one of (1) to (11), further including a processing section configured to process the sound quality of the audio signal to be reproduced without using the correction value calculated by the correction value calculating unit.

(13)

The information processing device according to any one of (1) to (12), further including an output unit configured to reproduce and output the audio signal to be reproduced.

(14)

The information processing device according to any one of (1) to (13), further including a metadata generating unit configured to generate metadata of an audio signal.

(15)

The information processing device according to any one of (1) to (14), in which the metadata generating unit generates the metadata by decimation in frequency.

(16)

The information processing device according to any one of (1) to (15), in which the metadata generating unit generates the metadata of the audio signal to be reproduced, and the correction value calculating unit is configured to calculate either or both of the correction value of the sound volume of the audio signal to be reproduced and the correction value of the sound quality of the audio signal to be reproduced using the metadata generated by the metadata generating unit.

(17)

The information processing device according to any one of (1) to (16), in which the metadata generating unit is configured to generate the metadata of each audio signal of the audio signal group, and the information processing device further includes a target data generating unit configured to generate target data of the audio signal group using the metadata of each audio signal of the audio signal group generated by the metadata generating unit.

(18)

The information processing device according to any one of (1) to (17), further including a database configured to manage the target data generated by the target data generating unit.

(19)

An information processing method, including:

acquiring target data which is a statistical value of metadata of each audio signal of an audio signal group;

acquiring metadata of an audio signal to be reproduced; and calculating either or both of a correction value of a sound volume of the audio signal to be reproduced and a correction value of a sound quality of the audio signal to be reproduced using the acquired target data and the acquired metadata.

(20)

A program causing a computer to function as:

a target data acquiring unit configured to acquire target data which is a statistical value of metadata of each audio signal of an audio signal group;

a metadata acquiring unit configured to acquire metadata of an audio signal to be reproduced; and a correction value calculating unit configured to calculate either or both of a correction value of a sound volume of the audio signal to be reproduced and a correction value of a sound quality of the audio signal to be reproduced using the target data acquired by the target data acquiring unit and the metadata acquired by the metadata acquiring unit.

REFERENCE SIGNS LIST 100 audio signal reproduction system
101 target data providing server
102 network
103 terminal device
141 audio source analyzing unit
142 normalizing unit
143 statistical analyzing unit
144 target data database
150 audio signal
151 sample value acquiring unit
152 power spectrum density calculating unit
153 absolute value histogram generating unit
161 adding unit
162 dividing unit
163 frequency smoothing unit
164 decimation-in-frequency processing unit
165 dividing unit
171 audio source file
181 reference peak level detecting unit
182 normalization processing unit
190 audio source feature quantity
191 PSD average value calculating unit
192 PSD standard deviation calculating unit
193 HIST average value calculating unit
194 HIST standard deviation calculating unit
195 cluster feature quantity
431 reproduction target audio source acquiring unit
432 target data acquiring unit
433 metadata acquiring unit
434 audio source analyzing unit
435 correction value calculating unit
436 correcting unit
437 equalizer processing unit
438 reproducing/transmitting unit
441 sound volume correction value calculating unit
442 sound volume correction value calculating unit
451 PSD normalizing unit
452 difference calculating unit
453 PSD correction value calculating unit
461 sound volume correcting unit
462 sound quality correcting unit

The invention claimed is:

1. An information processing device, comprising:
a target data acquiring unit configured to acquire target data which is a statistical value of metadata of each audio signal of a plurality of audio signals;
a metadata acquiring unit configured to acquire the metadata of an audio signal to be reproduced, wherein
the metadata includes a power spectrum density of the audio signal and an absolute value histogram of a sample value of the audio signal, and
the plurality of audio signals includes the audio signal to be reproduced; and
a correction value calculating unit configured to calculate at least one of a correction value of a sound volume of the audio signal to be reproduced or a correction value of a sound quality of the audio signal to be reproduced,
wherein the at least one of the correction value of the sound volume or the correction value of the sound quality is calculated based on the target data acquired by the target data acquiring unit and the metadata acquired by the metadata acquiring unit.

2. The information processing device according to claim 1, wherein the target data includes
an average value of each of the power spectrum density and the absolute value histogram, and
a standard deviation value of each of the power spectrum density and the absolute value histogram.

3. The information processing device according to claim 2, wherein
the correction value calculating unit is further configured to calculate the correction value of the sound volume based on:

the absolute value histogram of the sample value of the audio signal to be reproduced, and an average value of a plurality of absolute value histograms of a plurality of sample values of the plurality of audio signals.

4. The information processing device according to claim 3, wherein
the correction value calculating unit is further configured to calculate the correction value of the sound volume based on:
a reference peak level of each of the absolute value histogram of the sample value of the audio signal to be reproduced, and the average value of the plurality of absolute value histograms, and
a mode value of each of the absolute value histogram and the average value of the plurality of absolute value histograms.

5. The information processing device according to claim 2, wherein the correction value calculating unit is further configured to:
normalize the power spectrum density based on the absolute value histogram of the sample value of the audio signal to be reproduced, and
calculate the correction value of the sound quality based on the normalized power spectrum density.

6. The information processing device according to claim 5, wherein the correction value calculating unit is further configured to normalize the power spectrum density of the audio signal to be reproduced with a specific value having a specific probability density of the absolute value histogram of the sample value of the audio signal to be reproduced.

7. The information processing device according to claim 6, wherein the correction value calculating unit is further configured to normalize the power spectrum density based on a reference peak level of the absolute value histogram of the sample value of the audio signal to be reproduced.

8. The information processing device according to claim 5, wherein the correction value calculating unit is further configured to:
obtain a difference between the normalized power spectrum density of the audio signal to be reproduced and the average value of the power spectrum density of each of the plurality of audio signals, and
calculate the correction value of the sound quality based on the difference.

9. The information processing device according to claim 8, wherein the correction value calculating unit is further configured to:
calculate a correction value of the power spectrum density based on the difference and the standard deviation value of the power spectrum density of each of the plurality of audio signals, and
calculate the correction value of the sound quality based on the correction value of the power spectrum density of the audio signal to be reproduced.

10. The information processing device according to claim 1, further comprising a correcting unit configured to correct at least one of the sound volume or the sound quality based on the at least one of the correction value of the sound volume or the correction value of the sound quality.

11. The information processing device according to claim 1, further comprising a processing section configured to process the sound quality without utilization of the at least one of the correction value of the sound volume or the correction value of the sound quality.

12. The information processing device according to claim 1, further comprising an output unit configured to:
reproduce the audio signal to be reproduced; and
output the reproduced audio signal.

13. The information processing device according to claim 1, further comprising a metadata generating unit configured to generate the metadata of each audio signal of the plurality of audio signals,
wherein the metadata acquiring unit is further configured to acquire, from the metadata generating unit, the generated metadata of the audio signal to be reproduced.

14. The information processing device according to claim 13, wherein the metadata generating unit is further configured to generate the metadata by execution of a decimation in frequency process for a plurality of frequencies of the audio signal.

15. The information processing device according to claim 13, further comprising a target data generating unit configured to generate the target data of the plurality of audio signals based on the generated metadata of each audio signal of the plurality of audio signals.

16. The information processing device according to claim 15, further comprising a database configured to manage the target data generated by the target data generating unit.

17. An information processing method, comprising:
acquiring target data which is a statistical value of metadata of each audio signal of a plurality of audio signals;
acquiring the metadata of an audio signal to be reproduced, wherein
the metadata includes a power spectrum density of the audio signal and an absolute value histogram of a sample value of the audio signal, and
the plurality of audio signals includes the audio signal to be reproduced; and
calculating at least one of a correction value of a sound volume of the audio signal to be reproduced or a correction value of a sound quality of the audio signal to be reproduced, wherein the at least one of the correction value of the sound volume or the correction value of the sound quality is calculated based on the acquired target data and the acquired metadata.

18. A non-transitory computer-readable medium having stored thereon computer-executable instructions which when executed by a processor, cause the processor to execute operations, the operations comprising:
acquiring target data which is a statistical value of metadata of each audio signal of a plurality of audio signals;
acquiring the metadata of an audio signal to be reproduced, wherein
the metadata includes a power spectrum density of the audio signal and an absolute value histogram of a sample value of the audio signal, and
the plurality of audio signals includes the audio signal to be reproduced; and
calculating at least one of a correction value of a sound volume of the audio signal to be reproduced or a correction value of a sound quality of the audio signal to be reproduced, wherein the at least one of the correction value of the sound volume or the correction value of the sound quality is calculated based on the acquired target data and the acquired metadata.

* * * * *